US006537725B2

(12) United States Patent
Kunita et al.

(10) Patent No.: US 6,537,725 B2
(45) Date of Patent: Mar. 25, 2003

(54) PLANOGRAPHIC PRINTING PLATE

(75) Inventors: Kazuto Kunita, Shizuoka-ken (JP); Koichi Kawamura, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 233 days.

(21) Appl. No.: 09/729,219

(22) Filed: Dec. 5, 2000

(65) Prior Publication Data

US 2001/0009129 A1 Jul. 26, 2001

(30) Foreign Application Priority Data

Dec. 10, 1999 (JP) .......................................... 11-352210

(51) Int. Cl.[7] .................................................. G03F 7/09

(52) U.S. Cl. ................................ 430/270.1; 430/281.1; 430/302; 430/944; 430/945; 430/964

(58) Field of Search .......................... 430/270.1, 273.1, 430/281.1, 302, 348, 401, 944, 945, 964; 101/130, 453, 463.1, 465

(56) References Cited

U.S. PATENT DOCUMENTS

| | | | | | |
|---|---|---|---|---|---|
| 3,476,937 | A | | 11/1969 | Vrancken et al. | 250/65 |
| 5,570,636 | A | * | 11/1996 | Lewis | 101/454 |
| 6,071,674 | A | * | 6/2000 | Hattori | 430/278.1 |
| 6,096,476 | A | * | 8/2000 | Yanagida et al. | 430/270.1 |
| 6,194,122 | B1 | * | 2/2001 | Ichikawa et al. | 430/272.1 |
| 6,207,348 | B1 | * | 3/2001 | Deboer et al. | 430/302 |
| 6,399,270 | B1 | * | 6/2002 | Mori et al. | 430/270.1 |
| 2002/0025493 | A1 | * | 2/2002 | Hotta | 430/278.1 |
| 2002/0039702 | A1 | * | 4/2002 | Hotta | 430/273.1 |
| 2002/0045131 | A1 | * | 4/2002 | Nagase et al. | 430/292 |
| 2002/0081522 | A1 | * | 6/2002 | Miyake et al. | 430/270.1 |
| 2002/0094490 | A1 | * | 7/2002 | Endo et al. | 430/278.1 |

FOREIGN PATENT DOCUMENTS

| | | |
|---|---|---|
| EP | 0 819 985 | 1/1998 |
| EP | 0 864 420 | 9/1998 |
| EP | 0 881 096 | 12/1998 |
| EP | 0 908 779 | 4/1999 |
| EP | 0 914 941 | 5/1999 |
| JP | 2592225 | 10/1996 |
| JP | 8-276558 | 10/1996 |

* cited by examiner

*Primary Examiner*—Janet Baxter
*Assistant Examiner*—Barbara Gilliam
(74) *Attorney, Agent, or Firm*—Burns, Doane, Swecker & Mathis LLP

(57) ABSTRACT

A planographic printing plate formed of a support having sequentially disposed thereon a first layer, that is structured by a heat-insulating material having a low thermal conductivity, and that is made hydrophilic by being processed with one of an alkali and a silicate in an alkali developing solution after exposure; and a second layer whose alkali developability is changed, without ablation, by being irradiated with an infrared ray. Alternatively, a support that is structured by a heat-insulating material whose thermal conductivity is low, and in which a surface thereof is made hydrophilic by being processed with one of an alkali and a silicate in an alkali developing solution after exposure, may also be used as the support.

20 Claims, No Drawings

PLANOGRAPHIC PRINTING PLATE

BACKGROUND OF THE INVENTION

1. Field of Invention

The present invention relates to a plate for planographic printing with which direct plate formation, in which a plate can be formed directly by scanning an infrared laser based on digital signals from a computer or the like, is possible. Specifically, the present invention relates to an infrared-sensitive planographic printing plate suitable for alkali developing processing.

2. Description of the Related Art

High-output, compact solid-state lasers, semiconductor lasers, and gas lasers, which emit ultraviolet light, visible light, and infrared light having wavelengths ranging from 300 nm to 1200 nm, have become readily available. These lasers are very useful as a recording light source for making a printing plate directly from digital data of computers or the like.

Various studies concerning recording materials sensitive to these various types of laser have been made. Typical examples of recording materials that can be recorded by an infrared laser beam having a wavelength of 760 nm or greater include the positive-type recording material described in U.S. Pat. No. 4,708,925, and the negative-type recording material that is crosslinkable by an acid catalyst and described in Japanese Patent Application Laid-Open (JP-A) No. 8-276558.

Examples of recording materials responsive to an ultra-violet or visible light laser having a wavelength of 300 nm to 700 nm are numerous, and include the radical polymerizable, negative-type recording materials disclosed in U.S. Pat. No. 2,850,445 and Japanese Patent Application Bulletin (JP-B) No. 44-20189.

In the greater part of such image recording materials that use various kinds of laser beams, particularly in drawing techniques which use an infrared laser having a wavelength of 760 nm or greater, an image is formed by using high heat generated at portions irradiated with the infrared laser. Because the high heat used in this manner is utilized not as an optical mode but as a heat mode, a threshold property appears in image formation and a very contrasty image quality is obtained, so that such image recording materials are preferable as printing materials. To briefly describe threshold property in image formation, in the optical mode, when unexposed portions are irradiated only with weak light leaked at the exposure apparatus, photochemical reactions and the like corresponding to the amount of leaked light are generated, whereby fogging is produced. By contrast, in the heat mode, because a high temperature is not generated unless an amount of light greater than a given value is irradiated, a thermal reaction is not generated (threshold property) and fogging at weakly exposed regions is not produced. On the other hand, at exposed portions irradiated with a strong light, a high temperature is generated and a sufficient image is formed, even in the heat mode. The result is a contrasty image.

Ordinarily, when used as a heat mode characteristic, and in particular when used as material for a printing plate, a support made of metal such as aluminum is used from the standpoint of printability, smoothness and processing ease. However, there is the drawback that heat diffuses from the support and exposure energy is not used effectively for recording, thus leading to a considerable drop in sensitivity.

For this reason, the use of an insulated support or the provision of a heat-insulating material on a support are effective when an image is formed in the heat mode. Because sensitivity is greatly improved by the effect of preventing heat diffusion caused by a reduction in heat conductivity, various insulation methods have been explored.

However, one of the large characteristics of a printing plate is that it is structured by an image portion (a region that is highly hydrophobic and whose affinity to ink is high) and a non-image portion ( a region that is highly hydrophilic and ink-repellant). Here, when a highly hydrophobic material is used as a heat insulating material, the non-image portion (highly hydrophilic portion) must be formed by exposure in order to actually function as a printing plate. When the hydrophilic portion is not formed sufficiently, it becomes easy for ink to adhere to areas whose hydrophilicity has been lowered by abrasion at the time of printing, and there emerges the possibility for contamination in printing to occur.

Conversely, when a highly hydrophilic material is used as a heat insulating material, when the image portion (highly hydrophobic portion) is formed by exposure, problems arise in that damping water at the time of printing penetrates the surface of the heat insulating material along the hydrophilic portion thereof, whereby the photosensitive layer is stripped away by surface destruction, thus leading to a deterioration in printability.

As examples of a structure in which such problems originating in heat insulating materials are few, systems which utilize a heat insulating material at the support or in the vicinity thereof and which carry out recording by ablation, which are systems without alkali developing processing (hydrophilic processing), and systems in which a hydrophilic region and a hydrophobic region are formed in the surface by a polar-transformable material have been investigated. When recording is conducted using ablation, recording layer material is scattered within the exposure apparatus, whereby particularly delicate lenses in a laser transmission section are contaminated. For that reason, there has been the need to additionally furnish a device to remove the ablated materials. The apparatus thus grows complex and is not desirable in terms of costs. Raising printability is therefore substantially difficult in view of the present circumstances.

There are no problems associated with contamination of optical systems when polar-transformable materials are used. However, because the hydrophobic and hydrophilic regions are formed by utilizing only polar variations in the vicinity of the surface of the printing plate, repeated printings of 300,000 plates or more cannot possibly be withstood, printability is low, and there is the fear that contamination in printing caused by a deterioration in the hydrophilicity of the non-image portion will occur.

Accordingly, attempts have been made to develop a heat insulating technology that will eliminate problems associated with heat loss, without adversely effecting other characteristics required of a planographic printing plate, such as compatibility with ink used in printing, printability, adhesion to the recording layer, and the like.

SUMMARY OF THE INVENTION

An object of the present invention is to improve the loss of exposure energy and to form an image in which the on-off thereof in the irradiated and non-irradiated portions is enlarged in an infrared-sensitive planographic printing plate and to provide an aqueous alkali developing type planographic printing plate having high sensitivity and high printing durability.

The inventors of the present invention have conducted various studies to solve the aforementioned problem and, as a result, found that the drop of the heat of a recording layer is prevented and a hydrophilic/hydrophobic region is formed without decreasing adhesion between a support and a recording layer, for example, by using a material having low thermal conductivity and by providing a layer having the ability to make the surface thereof hydrophilic by using an alkali developing solution or by using a support which itself has such an ability. The present invention was thus completed.

Accordingly, the planographic printing plate of the present invention comprises forming a first layer which is made of an heat-insulating material having a low thermal conductivity and is made hydrophilic by treating using an alkali or a silicate in an alkali developing solution after being exposed and a second layer which is an infrared ray-sensitive recording layer to be changed in alkali developing ability without being abraded by irradiation with infrared rays in this order on a support.

Also, in one embodiment, the planographic printing plate of the present invention uses, as the support, a material made of a low heat-conductive insulating material and having the ability to make the surface thereof hydrophilic by treating using an alkali or a silicate in an alkali developing solution after being exposed and an infrared-sensitive layer which is changed in alkali developing ability by irradiation with infrared rays is disposed on the support.

Here, the thermal conductivity of the above heat-insulating material is 3.0 ($W \cdot m^{-1} \cdot K^{-1}$) or less and preferably 1.0 ($W \cdot m^{-1} \cdot K^{-1}$) or less.

Also, the layer made of a heat-insulating material and provided with a surface to be made hydrophilic preferably has an average thickness ranging from 0.2 to 50 $\mu$m. When such a heat-insulating material is used as the support itself, the average thickness of the heat- insulating material is preferably in a range from 0.05 to 2.0 mm.

The planographic printing plate of the present invention uses a heat-insulating material having such a hydrophilic level as to enable the light-sensitive layer to adhere as the support itself or as the layer disposed between the support and the light-sensitive layer (recording layer). Also, the heat-insulating material having such a property as to enable only the unexposed portion to be made hydrophilic after the surface is exposed by an infrared laser is used. Therefore, the image portion is not made hydrophilic so that adhesion to the recording layer is secured. At the same time, in the non-image portion, the surface of the heat-insulating material acquires hydrophilicity for the first time by performing alkali developing processing (hydrophilicity treatment) in an alkali development treating step. The present invention enables the preparation of a planographic printing plate which attains high sensitization using a heat insulting material, is freed of the penetration of an alkali developing solution between the recording layer and the support, has clear on-off of an image portion/a non-image portion and is superior in printing durability.

DETAILED DESCRIPTION OF THE PREFERRED EMBODIMENTS

An infrared-sensitive planographic printing plate of the present invention will hereinafter be described in detail.

The planographic printing plate of the present invention may have a layer (appropriately termed a "heat-insulating intermediate layer" hereinafter), disposed between a support and an infrared-sensitive recording layer, structured by a heat-insulating material having a low thermal conductivity, and that is made hydrophilic by being treated with an alkali or a silicate in an alkali developing solution after exposure. Alternatively, the planographic printing plate of the present invention may have a support (appropriately termed a "heat-insulating support" hereinafter) formed of a heat-insulating material having a low thermal conductivity, with the support having a surface that is made hydrophilic by being treated with an alkali or a silicate in an alkali developing solution after exposure.

When the heat-insulating intermediate layer is provided on the support, the heat-insulating material of the heat-sensitive planographic printing plate of the present invention preferably uses materials that have a cross-linkable structure, from the standpoint of abrasion at the time of printing. Further, the heat-insulating intermediate layer changes to a hydrophilic layer that is essentially ink-repellant by the action of an alkali or a silicate in an alkali developing solution at the time of alkali developing processing.

On the other hand, when the heat-insulating support which itself is the heat-insulating material is used, the surface thereof must be provided with surface treatment enabling the surface to be changed to an ink-repellent hydrophilic surface during the above alkali developing processing. As this surface treatment, a method of forming the surface treated layer unitedly on the above heat-insulating support is preferably used.

The thermal conductivity of the heat-insulating material used here is preferably 3.0 ($W \cdot m^{-1} \cdot K^{-1}$) or less and more preferably 1.0 ($W \cdot m^{-1} \cdot K^{-1}$) or less.

When the heat-insulating material is used as the heat-insulating intermediate layer, the average thickness of the heat-insulating layer is in a range of 0.05 to 5.0 $\mu$m, preferably 0.1 to 10 $\mu$m and most preferably 0.2 to 5.0 $\mu$m. When the thickness is less than 0.05 $\mu$m, the effect of insulation significantly decreases. When the thickness exceeds 50 $\mu$m, the possibility of the surface being stripped away from the support at the time of printing increases. When the heat-insulating support is used, the thickness thereof is in a range of 0.05 to 5.0 mm and preferably 0.05 to 2.0 mm. When the thickness is less than 0.05 mm, dimensional accuracy becomes poor, causing printing displacement. On the other hand, when the thickness exceeds 5.0 mm, the support cannot withstand flexural strength when it is wound around a printer, causing cracks in the support itself. The heat-insulating material used as the heat-insulating intermediate layer in the planographic printing plate of the present invention must be, first, a material whose thermal conductivity is low. Second, it is necessary that the heat-insulating material has good adhesion to the photosensitive layer, has a surface that is hydrophobic or weakly hydrophilic at least to the extent that ink adheres, and that is made substantially hydrophilic by the alkali developing processing to the extent that the material repels ink.

Preferable examples of materials that fulfill such requirements include vitreous inorganic compounds, inorganic/organic hybrid compounds, and organic polymer compounds. A material containing air therein, such as foamed styrol, is also preferable. From the standpoint of being made hydrophilic by the alkali developing processing, it is essential that the heat-insulating material has a compound, particularly a polymer organic or inorganic compound, having a hydroxyl group, a primary amino group, a secondary amino group, an acid group (particularly, a phenol group, an imide group, a sulfonamide group, a mercapto group, a carboxylic acid group, a sulfonic acid group, a phosphoric acid group, a phosphonic acid group and a silicic acid group) or an acid group precursor (particularly, alkylesters, arylesters, acid anhydrides or acid halides), which are functional groups that become hydrophilic or whose hydrophilicity is strengthened when the groups react with an alkali or a silicate in a developing solution.

For the formation of such heat-insulating intermediate layer which can be made hydrophilic, conventionally known, crosslinked hydrophilic layer technology may be applied.

Crosslinked hydrophilic layer technology can be utilized because of the advantages that a strong film can be formed because much of the technology includes functional groups made hydrophilic by the aforementioned alkali developing treatment.

Any one of conventionally known, cross-linked hydrophilic layers may be used as such a cross-linkable hydrophilic layer. For example, 1) the hydrophilic layer formed of a crosslinked polymer having a metal colloid as disclosed in International Application Laid-Open WO98/40212, 2) the hydrophilic layer formed of a condensate of an organic hydrophilic polymer and a silane coupling agent as disclosed in Japanese Patent No. 2592225, or 3) the hydrophilic layers formed of a crosslinked organic polymer as disclosed in Japanese Patent Application Laid-Open (JP-A) No. 10-6468 and Japanese Patent Application Laid-Open (JP-A) No. 10-58636 may be used.

The crosslinked hydrophilic layers will hereinafter be described sequentially.

First, 1) the hydrophilic layer formed of a crosslinked polymer having a metal colloid will be described.

Examples of the metal colloid include colloids of hydroxysilane, hydroxyaluminum, hydroxytitanium and hydroxyzirconium. These metal colloids may be crosslinked using a crosslinking agent such as a di-, tri- or tetra-alkoxysilane, titanate or aluminate to form a polymer. The metal colloid may be produced according to U.S. Pat. No. 2,244,325 or U.S. Pat. No. 2,574,902. Among the above metal colloids and crosslinking agents, a particularly useful metal colloid is colloidal silica and a particularly useful crosslinking agent is aminopropyltriethoxysilane. The amount of the metal colloid to be used is in a range of 100 to 5000% and preferably 500 to 1500% with respect to the amount of the crosslinking agent.

Next, 2) the hydrophilic layer formed of a condensate of an organic hydrophilic polymer and a silane coupling agent will be described.

For instance, it is preferable to cast a hydrophilic polymer having a free reactive group such as hydroxyl, carboxyl, hydroxyethyl, hydroxy-propyl, amino, aminoethyl, aminopropyl or carboxymethyl group from an aqueous composition containing a suitable crosslinking agent or modifying agent containing, for example, a hydrophilic organic titanium reagent, aluminoformyl acetate, dimethylolurea, melamine, aldehyde or hydrolyzed tetraalkyl orthosilicate.

The polymer suitable to form the above hydrophilic layer may be selected from a group of gum arabic, casein, gelatin, derivatives of starch, carboxymethyl cellulose and Na salts thereof, cellulose acetate, sodium alginate, vinyl acetate/maleic acid copolymers, styrene/maleic acid copolymers, polyacrylic acids and salts thereof, polymethacrylic acids and salts thereof, hydroxy-ethylene polymers, polyethylene glycols, hydroxypropylene polymers, polyvinyl alcohols and hydrolyzed polyvinyl acetate of which the degree of hydrolysis is at least 60 wt % and preferably at least 80 wt %.

Specifically, the hydrophilic layer disclosed in U.S. Pat. No. 3,476,937 is particularly preferable because it produces excellent lithographic printability when used as the planographic printing plate of the present invention. This hydrophilic layer has polyvinyl alcohol or polyvinyl acetate that has been hydrolyzed at least to 60 wt. %, and the hydrophilic layer is film-hardened by a tetraalkyl orthosilicate such as tetraethyl orthosilicate or tetramethyl orthosilicate.

Another suitable film-hardened hydrophilic surface layer is disclosed in European Patent (EP) 91201227.5. The hydrophilic layer disclosed in this European Patent has a copolymer (e.g., amino modified dextran), which contains an amine or amide functional group having at least one free hydrogen, and a hardened reaction product of an aldehyde.

When this film-hardened hydrophilic surface layer is used as the heat-insulating intermediate layer in the planographic printing plate of the present invention, additional materials such as plasticizers, pigments and dyes may be included to improve the qualities of the layer. Specifically, particle materials such as $TiO_2$ or colloidal silica may also be included to improve the strength and/or hydrophilicity of the layer.

Next, 3) the hydrophilic layer formed of a crosslinked organic polymer will be explained.

The crosslinked organic polymer in the present invention may be a networked polymer, structured from carbon-carbon bonds, having as side chains thereof one or more types and a plurality of hydrophilic functional groups such as a carboxyl group, an amino group, a phosphoric acid group, a sulfonic acid group, salts of these groups, a hydroxyl group, an amide group, a polyoxyethylene group or the like. The crosslinked organic polymer may also be a polymer in which one of carbon atoms and carbon-carbon bonds are connected by hetero atoms formed of at least one type or more of oxygen, nitrogen, sulfur or phosphorous. The crosslinked organic polymer may also be a networked polymer having as side chains thereof one or more types and a plurality of hydrophilic functional groups such as a carboxylic group, an amino group, a phosphoric acid group, a sulfonic acid groups, salts of these groups, a hydroxyl group, an amide group or a polyoxyethylene group. Specific examples of these organic polymers may include polymers such as poly(meth)acrylate types, polyoxyalkylene types, polyurethane types, epoxy ring-opening addition polymer types, poly(meth)acrylic acid types, poly(meth)acrylamide types, polyester types, polyamide types, polyamine types, polyvinyl types and polysaccharide types and complex types of these types.

Polymers in which the side chains of the segment has a repetition of any one or combinations of a hydroxyl group, a carboxyl group or its alkali metal salt, an amino group or its hydrogen halide, a sulfonic acid group or its amine, an alkali metal salt, an alkali earth metal salt and an amide group, and polymers having plural polyoxyethylene groups on a part of these hydrophilic functional groups and principal chain segment are preferable because of their high hydrophilicity. In addition to the above polymers, hydrophilic binder polymers having a urethane bond or a urea bond on the principal chain or the side chain improve not only hydrophilicity but also the printing durability of the non-image portion and are therefore more preferable.

The binder polymer may include as needed various other components described later. Specific examples of the three-dimensionally crosslinked hydrophilic binder polymer are given below. As the hydrophilic binder polymer, at least one of hydrophilic monomers, having a hydroxyl group, carboxylic group or its salt, sulfonic acid group or its salt, phosphoric acid group or its salt, amide group, amino group and ether group, such as (meth)acrylic acid or its alkali or amine salt, itaconic acid or its alkali or amine salt, 2-hydroxyethyl(meth)acrylate, (meth)acrylamide, N-monomethylol(meth)acrylamide, N-dimethylol(meth) acrylamide, 3-vinylpropionic acid or its alkali or amine salt, vinylsulfonic acid or its alkali or amine salt, 2-sulfoethyl (meth)acrylate, polyoxyethylene glycol mono(meth) acrylate, 2-acrylamide-2-methylpropanesulfonic acid, acid phosphooxypolyoxyethylene glycol mono (meth) acrylate and allylamine or mineral acid salt thereof is used to synthesize a hydrophilic homo- or co-polymer.

The hydrophilic binder polymer, having functional groups such as a hydroxyl group, a carboxyl group, an amino group or its salt, or an epoxy group in the hydrophilic polymer, uses these functional groups to obtain an unsaturated group-containing polymer into which an additional polymerization double bond, such as a vinyl group, an allyl group, or a (meth) acryl group, or a ring-forming group, such as a cinnamoyl group, a cinnamylidene group, a cyanocinnamylidene group or a p-phenylenediacrylate, has been introduced. As needed, a monofunctional or polyfunctional monomer copolymerizable with the unsaturated group, an initiator (described later), and other components may be added to the polymer and dissolved in an appropriate solvent to prepare a dope. The aforementioned support is coated with the dope, which is then three-dimensionally crosslinked either after or while being dried.

The hydrophilic binder polymer having active hydrogen such as a hydroxyl group, an amino group or a carboxyl group is added to the aforementioned active hydrogen-excluding solvent together with an isocyanate compound or a block polyisocyanate compound and other components described later. The dope is mixed, applied to the support, and reacted either after or while being dried to effect three-dimensional crosslinking. A monomer having a glycidyl group such as glycidyl (meth) acrylate or a carboxylic group such as (meth) acrylic acid may be used in combination with the copolymer components of the hydrophilic binder polymer. The hydrophilic binder polymer having a glycidyl group may be crosslinked three-dimensionally by using, as a crosslinking agent, an $\alpha,\omega$-alkane- or alkene-dicarboxylic acid such as 1,2 -ethanedicarboxylic acid or adipic acid, polycarboxylic acid such as 1,2,3-propanetricarboxylic acid or trimellitic acid, polyamine compound such as 1,2-ethanediamine, diethylenediamine, diethylenetriamine or $\alpha$, $\omega$-bis-(3-aminopropyl)-polyethylene glycol ether, oligo alkylene or polyalkylene glycol such as ethylene glycol, propylene glycol, diethylene glycol or tetraethylene glycol or polyhydroxy compound such as trimethylolpropane, glycerol, pentaerythritol or sorbitol and by utilizing a ring-opening reaction with each of these compounds.

The hydrophilic binder polymer having a carboxylic group or an amino group may be crosslinked three-dimensionally by utilizing an epoxy ring-opening reaction or the like using, as a crosslinking agent, a polyepoxy compound such as ethylene or propylene glycol diglycidyl ether, polyethylene or polypropylene glycol diglycidyl ether, neopentyl glycol diglycidyl ether, 1,6-hexane diol diglycidyl ether or trimethylolpropane triglycidyl ether.

The hydrophilic binder polymer formed of a polysaccharide such as a cellulose derivative, or the hydrophilic binder polymer in which polyvinyl alcohol or its partially saponified product, glycidol homo- or co-polymer have been taken as its base can be made to possess a three-dimensional structure by introducing the aforementioned crosslinkable functional group by utilizing a hydroxyl group contained in these compounds using the aforementioned method.

Preferable examples of the aforementioned three-dimensionally crosslinked hydrophilic polymers include those obtained by three-dimensionally crosslinking a hydrophilic homo- or co-polymer synthesized using at least one type selected from hydrophilic monomers, such as a (meth) acrylic acid or its alkali metal or amine salt, itaconic acid or its alkali metal or amine salt, 2-hydroxylethyl(meth) acrylate, (meth)acrylamide, N-monomethylol(meth) acrylamide, N-dimethylol(meth)acrylamide, allylamine or its hydroacid halide, 3-vinylpropionic acid or its alkali metal or amine salt, vinylsulfonic acid or its alkali metal or amine salt, 2-sulfoethylene(meth)acrylate, polyoxyethylene glycol mono(meth)acrylate, 2-acrylamide-2-methylpropanesulfonic acid, acid phosphooxypolyoxyethylene glycol mono(meth)acrylate or allylamine or its hydroacid halide, having a hydrophilic group such as a carboxylic group, sulfonic acid group, phosphoric acid and amino group or salts of these groups, hydroxyl group, amide group or ether group or by three-dimensionally crosslinking a hydrophilic binder polymer constituted of a polyoxymethylene glycol or a polyoxyethylene glycol by using the aforementioned method.

The three-dimensionally crosslinked hydrophilic polymers described above are important materials as a matrix for the heat-insulating intermediate layer. However, in order to be made hydrophilic by the alkali developing processing, it is essential that the heat-insulating material according to the present invention has a compound, particularly a polymer organic or inorganic compound, having a hydroxyl group, a primary amino group, a secondary amino group, an acid group (particularly, a phenol group, an imide group, a sulfonamide group, a mercapto group, a carboxylic acid group, a sulfonic acid group, a phosphoric acid group, a phosphonic acid group and a silicic acid group) or an acid group precursor (particularly, alkylesters, arylesters, acid anhydrides or acid halides), which are functional groups that become hydrophilic or whose hydrophilicity is strengthened when the groups react with an alkali or a silicate in a developing solution.

However, these techniques are so-called cross-linkable hydrophilic layers that were developed simply as a means to impart hydrophilicity to a hydrophobic support. When such hydrophilic layers are used as they are for the heat-insulating material of the present invention, the hydrophilicity becomes too high and sometimes adhesion with the adjacent photosensitive layer is made worse. For this reason, the above hydrophilic layer technique is combined with two techniques described below in order to form a heat-insulating layer that can be made hydrophilic and can be appropriately used in the present invention.

A first technique is that in which an adhesive is combined with the cross-linkable hydrophilic layer. A second technique is that in which a processing for improving adhesion by regulating hydrophilicity/hydrophobicity is administered, but details of this second technique will be described later.

First, the first technique in which an adhesive is combined with the cross-linkable hydrophilic layer will be described.

One example concerns a technique in which an adhesive (described later) for improving adhesion with the photosensitive layer is incorporated in the material of the hydrophilic layer, thereby imparting to the heat-insulating intermediate layer itself a high adhesion with the infrared-sensitive layer (i.e., the recording layer). Another example concerns a technique in which an adhesive layer having an adhesive is disposed between the heat-insulating intermediate layer and the recording layer to thereby ensure the adhesion of both.

Examples of such an adhesive include one or more types selected from phosphonic acids having an amino group such as carboxymethyl cellulose, dextrin, gum arabic and 2-aminoethylphosphonic acid; organic phosphonic acid such as phenylphosphonic acid, naphthylphosphonic acid, alkylphosphonic acid, glycerophosphonic acid, methylenediphosphonic acid and ethylenediphosphonic acid which may have a substituent; organic phosphoric acid such as phenylphosphoric acid, naphthylphosphoric acid, alkylphosphoric acid and glycerophosphoric acid which may have a substituent; organic phosphinic acid such as phenylphosphinic acid, naphthylphosphinic acid, alkylphosphinic acid and glycerophosphinic acid which may have a substituent; amino acids such as glycine and β-alanine; and hydrochloride of amines having a hydroxyl group such as hydrochlorides of triethanolamine. These may be used by mixing two or more.

Compounds represented by the following general formulae ZZ-1 to ZZ-6 are particularly preferable as adhesives:

A diazonium polymer (weight average molecular weight 1,000 to 20,000) is represented by the following general formula ZZ-1:

ZZ-1)

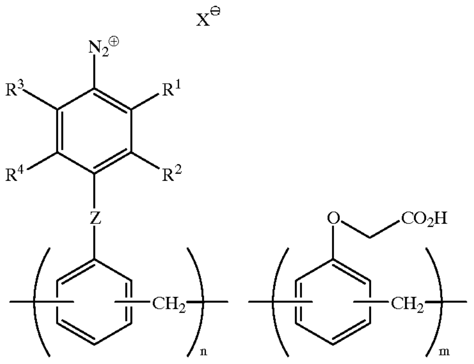

In the formula, $R^1$ to $R^4$ independently represent a hydrogen atom, an alkyl group with a carbon number of 1 to 12, and an alkoxy group having an alkyl group with a carbon number of 1 to 12, Z represents O, S or NH, and $X^-$ represents a counter-anion selected from $Cl^-$, $Br^-$, $PF_4^-$, $BF_4^-$, $ClO_4^-$, arylsulfonic acid anion and alkylsulfonic acid anion, and n≠0 but m may be zero.

A copolymer (weight average molecular weight 1,000 to 50,000) of vinylbenzoic acid is represented by the general formula ZZ-2,

ZZ-2)

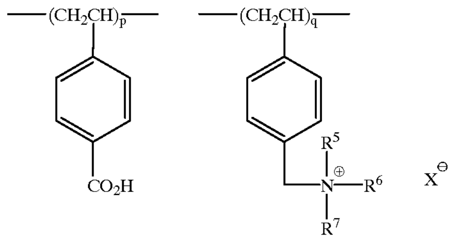

In the formula, $R^5$ to $R^7$ independently represent an alkyl group with a carbon number of 1 to 12, an aryl group, and an aralkyl group, $X^-$ represents a counter-anion as in the formula ZZ-1, and p≠0 but q may be zero.

When the molecular weight of any of the aforementioned copolymer is less than the range described above, the effect of adhesion is diminished. When the molecular weight of the same is greater than the range described above, there is the risk that it cannot be taken off at the time of developing and that printing contamination will arise. Therefore, it is preferable to use a copolymer having a molecular weight that falls within the range prescribed above.

The compounds of the remaining general formulae are a polymerizable silane coupling agent represented by the general formula ZZ-3, a polymer compound (weight average molecular weight 1000 to 50,000) having a silane coupling moiety represented by the general formula ZZ-4, polymerizable phosphonic acid or polymerizable phosphoric acid represented by the general formula ZZ-5, and a polymer compound (weight average molecular weight 1,000 to 50,000) represented by the general formula ZZ-6 having two or more adjoining hydroxyl groups on the benzene ring.

It is particularly effective to use these compounds as an adhesive layer by coating by a sol-gel processing with tetra-alkoxysilne in the presence of an acid catalyst (phosphoric acid, sulfuric acid, hydrochloric acid or organic sulfonic acid) or a basic catalyst (ammonia, KOH or NaOH). In particular, the compounds are appropriately used as a recording layer when a radical polymerizable recording layer is used.

ZZ-3)

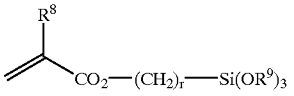

ZZ-4)

$$—Si(OR^9)_n$$

ZZ-5)

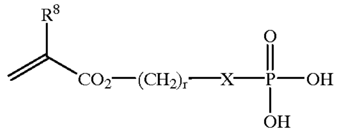

ZZ-6)

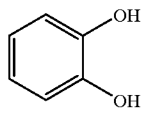

In the formula, $R^8$ denotes a methyl group, $R^9$ denotes a methyl, ethyl or phenyl group, and r and n represent integers of 2 to 20 and 1 to 3, respectively. X represents O or a single bond.

When a polymer having a hydroxyl group at the side chains thereto is used as the hydrophilic layer, boric acid, aluminic acid or aluminosilisic acid, or sodium, potassium, ammonium, tetaalkylammonium or organic amine salts of these acids are hihgly effective for advancing film hardening and for adhesion.

When these adhesive agents are incorporated in the hydrophilic material, the amount incorporated therein is 0.01 wt. % to 50 wt. % with respect to the total solid component. When the incorporated amount is less than 0.01 wt. %, the effect of adhesion does not emerge. When the incorporated amount is less greater than 50 wt. %, it becomes difficult for the effect of the hydrophilic layer to be made manifest.

When these adhesive agents are formed on the surface of the hydrophilic layer as an adhesive layer (an organic undercoat layer), an appropriate amount of coating is 1 to 500 $mg/m^2$, more preferably 1 to 100 $mg/m^2$, and most preferably 1 to 50 $mg/m^2$. When the amount of coating is less than 1 $mg/m^2$, the effect of improving the adhesion becomes insufficient. When the coating amount is greater than 500 $mg/m^2$, there is a tendency for the hydrophilization processing resulting from permeation of the developer to be obstructed, such that the layer cannot be made hydrophilic and printing contamination is generated.

The organic undercoat layer may be disposed by a method such as the following methods. In one method, a solution prepared by dissolving the foregoing organic compound in water, or in an organic solvent such as methanol, ethanol and methylethyl ketone, or in a mixed solvent thereof, is coated on a support having a heat-insulating intermediate layer or on a heat-insulating support comprising a hydrophilic layer, then dried. In another method, a solution prepared is by dissolving the foregoing organic compound in water, or in an organic solvent such as methanol, ethanol and methylethyl ketone, or in a mixed solvent thereof, and then the support is immersed in the solution so that the support is made to adsorb the aforementioned compound. Thereafter, the support is washed with water or the like and dried to provide the organic undercoat layer. In the former method, a solution having a concentration of 0.05 wt. % to 10 wt. % of the organic compound may be coated by a variety of methods. In the latter method, the concentration of the solution is 0.01 to 20% by weight, preferably 0.05 to 5% by weight, the dipping temperature is 20 to 90° C., preferably 25 to 50° C., and the dipping time is 0.1 second to 20 minutes, preferably 2 seconds to 1 minute. The pH of the solution to be used may be adjusted from 1 to 12 using a basic substance such as ammonia, triethylamine or potassium hydroxide, or an acidic substance such as hydrochloric acid or phosphoric acid. When the recording layer of the present invention is used as a printing plate for lithography, a yellow dye may be added in order to enhance tonal reproducibility.

The second technique for improving adhesion will be described hereinafter. In this technique, adhesion is improved by the adjusting the hydrophilic-hydrophobic balance of the heat-insulating material.

Specifically, the second technique is a method in which the number of hydrophilic groups in the components included in the hydrophilic layer suitable as a heat-insulating material is decreased or the number of hydrophobic groups in the same is increased, whereby the hydrophilicity/hydrophobicity balance is adjusted, a certain degree of hydrophobicity is imparted to the surface and adhesion is improved. As mentioned previously, when the number of hydrophilic groups is large and the hydrophilicity is too high, adhesion with the adjacent infrared-sensitive layer drops. Here, however, the possibility emerges that contamination may be generated in the non-image portions when measures to reduce the functional groups, which function to make hydrophilicity manifest in the heat-insulating intermediate layer or the heat-insulating support surface by making contact with the alkali developing solution, or measures to suppress the function of the functional groups are taken. Accordingly, it is preferable to adjust the hydrophilicity/hydrophobicity balance without exerting a large influence on the functional groups having such a function. Examples of means for doing so include increasing the prepared amount of compounds having hydrophobic groups at the time the matrix of the heat-insulating material is formed, or adjusting the number of functional groups by lowering the amount of compounds introduced when there are compounds having hydrophilic functional groups that are not used in the reaction with the alkali developing solution.

Whether or not the heat-insulating layer (i.e., the heat-insulating intermediate layer or the heat-insulating support of the present invention), which can be made hydrophilic and has been obtained by administering an adhesion-improving processing to the cross-linkable hydrophilic material in accordance with the preceding techniques, is suitable for the object of the present invention can be judged by measuring the surface contact angle of water drops in the air. Adhesion with the recording layer may be judged to be good when the contact angle of water drops in the air is within a range of 10° to 100°, preferably 30° to 200°, and more preferably 50° to 100°. When the value is lower than 10°, adhesion with the photosensitive layer becomes weak, and peeling of the surface due to permeation of the developing solution at the time of developing easily occurs. When the value is greater than 100°, the developing is completely repelled and permeation of the developing solution is suppressed, thus making it difficult to administer hydrophilicization processing.

Hereinafter, the infrared-sensitive layer (recording layer), whose alkali developability is changed by the action of an infrared ray and which the heat-sensitive planographic plate of the present invention has on the heat-insulating material, will be described. The infrared-sensitive layer that is used here is a layer whose solubility in an alkali developing solution is changed by the irradiation of an infrared laser. It is necessary that substantially no ablation occurs at the time the solubility is changed. Namely, in the present invention, a change in the solubility of the recording layer refers to a change in solubility only with respect to the alkali developing solution, unattended by other phenomena, and is not meant to include elimination resulting from scattering of the recording layer.

The construction of the infrared-sensitive layer of the heat-sensitive planographic plate of the present invention is not particularly restricted. Known infrared-sensitive layers may be selected and used. The recording layer can be divided into two types: a negative-type in which alkali developability is lowered by the action of an infrared light, and a negative-type layer in which alkali developability is raised by the action of an infrared light.

Examples of the negative-type recording layer include known negative-type polar conversion material (change from hydrophilic to hydrophobic) based, radical polymerization based, and acid catalyst cross-linking based (including cationic polymerization) recording layers. The radical polymerization based and acid catalyst cross-linking based recording layers are preferable among the recording layers from the aspect of tolerance to repeated printings. Radicals or acids generated by light irradiation or heating serve as an initiator or a catalyst, and the compounds structuring the recording layer trigger a polymerization reaction and a cross-linking reaction and harden to form image portions.

Examples of the negative-type recording layer include known negative-type polar conversion material (change from hydrophobic to hydrophilic) based, acid catalyst decomposition based and interaction release based (heat-sensitive positive) recording layers. Among these, the negative-type polar conversion material based recording layer formed by heat decomposition of a sulfonic acid ester, and acid catalyzed decomposition based and interaction release based recording layers are preferable in from an aspect of image quality. The bonds of the polymer compounds that form the layer are released by the acids and heat energy generated by light irradiation and heating, whereby the layer becomes soluble in water or alkaline water. The layer is then removed by development to form image portions.

The present invention provides a heat-insulating support or a heat-insulating intermediate layer capable of being made hydrophilic at the time of developing processing, through which effect sensitivity is raised and printing performance is improved. The present invention is not affected by the materials structuring the recording layer.

Radical Polymerization Layer

The radical polymerization layer usable as the recording material of the planographic printing plate of the present invention has a compound that generates radicals by light or heat (referred to as a radical generator hereinafter), and a compound polymerizable by radicals (referred to as a polymerizable compound hereinafter). For example, radicals are generated at exposed portions from the radical generator by the irradiation of an infrared laser or the like, the radicals become initiators and the polymerizable compound is hardened by a radical polymerization reaction, whereby image portions are formed. The combination of the radical generator and polymerizable compound used here may be appropriately selected from known combinations, provided that the strength of the film formed by the radical polymerization satisfies demands as a recording layer. Accelerators such as onium salts and infrared absorbers may be used together for improving reactivity of the radical generator. Examples of components that can be used for the radical polymerization layer include, for example, the compound disclosed in Japanese Patent Application Laid-Open (JP-A) No. 8-108621 as a structural component of a heat-polymerizable recording layer, and the compound disclosed in JP-A No. 9-34110 as a structural component of a photosensitive layer.

Radical Generator

Known radical polymerization initiators generally used in polymer synthesis reactions caused by radical polymerization may be used without restriction as the radical generator to be used for the radical polymerization layer. Examples include azobisnitrile compounds such as 2,2'-azobisisobutylonitrile and 2,2'-azobispropyonitrile; peroxides such as benzoyl peroxide, lauroyl peroxide, acetyl peroxide, t-butyl perbenzoate, α-cumyl hydroperoxide, di-t-butyl peroxide, diisopropyl peroxydicarbonate and t-butyl peroxyisopropyl carbonate; alkyl peroxycarbamates; organic peroxides such as nitrosoaryl acylamine; inorganic peroxides such as potassium persulfate, ammonium persulfate and potassium perchlorate; diazo compounds such as diazoaminobenzene, p-nitrobenzene diazonium, azobis-substituted alkanes, diazothioethers and arylazosulfones; tetraalkyl tiuramdisulfides such as nitrosophenyl urea and tetramethylthiuram disulfide; diaryl disulfides such as dibenzoyl disulfide; dialkyl xantic acid disulfides; aryl sulfines; aryl alkylsulfones; and 1-alkane sulfines.

Although it depends on the energy of the laser, sufficient sensitivity can be obtained even with a radical generator having a large activation energy, because the temperature of the exposed surface can reach up to 600° C. when the planographic printing plate of the present invention is recorded with an infrared laser.

The activation energy of the radical generator for generating radicals is preferably 30 Kcal/mole or more, and examples of such radical generators include azobisnitrile compounds and organic peroxides. Compounds whose stability at room temperature is excellent, whose speed of decomposition when heated is rapid, and which become colorless at the time of decomposition are preferable. Examples of such compounds include benzoyl peroxide, 2,2'-azobisisobutylonitrile and the like.

The radical generators described above may be used singly, or in combination of two or more, and are used in an amount of 0.5 to 30% by weight, preferably 2 to 20% by weight, relative to the total solid component of the radical polymerization layer.

Compounds that generate radicals by interacting with onium salt (described later) may also be appropriately used. Specifically, examples of such compounds include halides (α-haloacetophenones, trichloromethyl triazines and the like), azo compounds, aromatic carbonyl compounds (benzoyl esters, ketals, acetophenones, o-acyloxyimino ketones, acylphosphine oxides and the like), hexaaryl bismidazole compounds and peroxides. Preferably, the bisimidazole derivative disclosed as A-1 to A-4 on p. 16 of Japanese Patent Application Laid-Open (JP-A) No. 9-24110 may be used.

The latter radical generator can attain high sensitivity by interacting with an onium salt. Examples of onium salts that can be used together with the radical generator include such compounds as the phosphonium salts, sulfonium salts, iodonium salts and ammonium salts disclosed in paragraphs [0022] to [0049] of JP-A No. 9-24110.

The amount of the onium salt added is preferably in the range of 0.05 to 50% by weight relative to the total solid component of the recording layer, although the amount differs depending on the kind and the mode of use of the onium salt.

Polymerizable Compound

Known monomers having a polymerizing group may be used without particular restriction as the polymerizable polymer compound which is polymerized and hardened by radicals generated from the radical generator. Examples of such monomers include monofunctional acrylic acid esters and their derivatives such as 2-ethylhexyl acrylate, 2-hydroxyethyl acrylate and 2-hydroxypropyl acrylate, or compounds in which acrylate was replaced with methacrylate, itaconate, chrotonate or emalate; bifunctional acrylic esters and their derivatives such as polyethyleneglycol diacrylate, pentaerythritol diacrylate, bisphanol A siacrylate and diacrylate of hydroxypivalic acid neopentyl alcohol ε-caprolactone adduct, and or compounds in which these acrylates are replaced with methacrylate, itaconate, crotonate and emalate; and multifunctional acrylic acid esters and their derivatives such as trimethylolpropane (metha)acrylate, dipentaerythritol pentaacrylate, dipentaerythritol hexaacrylate and pyrogallol triacrylate, or compounds in which these acrylates are replaced with methacrylate, itaconate, crotonate and emalate. So-called pre-polymers, prepared by introducing acrylic acid or methacrylic acid into an oligomer having an appropriate molecular weight to import a photopolymerizing property, may be favorably used.

Other examples include such compounds as disclosed in Japanese Patent Application Laid-Open (JP-A) Nos. 58-212994, 61-6649, 62-46688, 62-48589, 62-173295, 62-187092, 63-67189 and 1-244891. The compounds described in "11290 Chemicals", Kagaku Kogyo Nippo Co., pp. 286–194, and in "Handbook of UV/EB Hardening Agents (Materials)" Kobunshi Kanko-kai, pp.11–65may also be favorably used.

Among these, the compounds having two or more acrylic groups or methacrylic groups in the molecules thereof are preferable in the present invention. The compounds preferably have a molecular weight of 10,000 or less, and more preferably 5,000 or less. In the present invention, in accordance with the object, one type of polymer compound (and if no problems arise in compatibility and affinity, combinations of two or more types of polymer compounds) may be used from the prepolymers and monomers having a polymerizing group, including those monomers given as examples above.

The compounds having ethylenic unsaturated groups are preferably incorporated in the radical polymerization layer as a solid componentin a preferable amount of 20 to 80% by weight, and more preferably in an amount of 30 to 60% by weight.

Binder Resins

Binder resins may be used in the photosensitive layer as needed. Examples of such binder resins include polyester resins, polyvinyl acetal resins, polyurethane resins, polyamide resins, cellulose resins, olefin resins, vinyl chloride resins, (meth)acrylic reins, styrene resins, polycarbonate, polyvinyl alcohol, polyvinyl pyrrolidone, polysulfone, polycaprolactone resins, polyacryronitrile resins, urea resins, epoxy resins, pehnoxy resins, and rubber based resins. Resins having unsaturated bonds in the resin, for example diarylphthalate resins and their derivatives, and chlorinated polypropylene, may be favorably used depending on the purpose, since they can be polymerized with the compounds having ethylenic unsaturated bonds described above. One type of binder resin or a combination of two or more among the resins described above may be used for the binder resin.

These binder resins are preferably used in a range of 500 parts by weight or less, and more preferably 200 parts by weight or less, relative to 100 parts by weight of the polymerizable compound.

Infrared Absorber

It is preferable in the present invention that the radical polymerization layer includes an infrared absorber that efficiently converts infrared laser light into heat, in order to improve the sensitivity of the radical generator and accelerate the radical polymerization reaction. The infrared absorber to be used herein may be dyes or pigments that effectively absorb infrared light having a wavelength of 760 nm to 1200 nm. Preferably, the dye or pigment has a absorption maximum at a wavelength of 760 nm to 1200 nm.

Commercially available and known dyes, such as those described in Senryô Biran ("Handbook of Dyes", edited by the Association of Synthetic Organic Chemistry Japan, 1970), may be used. Examples of the dyes and pigments include azo dyes, metal complex azo dyes, pyrazolone dyes, naphthoquinone dyes, anthraquinone dyes, phthalocyanine dyes, carbonium dyes, quinimine dyes, methine dyes, cyanine dyes, squalilium pigments, pylylium salts and metal thiolate complexes.

Preferable dyes include the cyanine dyes disclosed in Japanese Patent Application Laid-Open (JP-A) Nos. 58-125246, 59-84356, 59-202829 and 60-78787; the methine dyes disclosed in Japanese Patent Application Laid-Open (JP-A) Nos. 58-173696, 58-181690 and 58-194595; the naphthoquinone dyes disclosed in Japanese Patent Application Laid-Open (JP-A) Nos. 58-112793, 58-224793, 59-48187, 59-73996, 60-52940 and 60-63744; the squalilium pigments disclosed in Japanese Patent Application Laid-Open (JP-A) No. 58-112792; and the cyanine dyes described in British Patent No. 434,875.

Further, the near infrared absorption intensifier disclosed in U.S. Pat. No. 5,156,938 may also be suitably used. In addition, the arylbenzo(thio)pyrylium salts disclosed in U.S. Pat. No. 3,881,924; the trimethylene thiapyrylium salts disclosed in Japanese Patent Application Laid-Open (JP-A) No. 57-142645 (U.S. Pat. No. 4,327,169); the pyrylium compounds disclosed in Japanese Patent Application Laid-Open (JP-A) Nos. 58-181051, 58-220143, 59-41363, 59-84248, 59-84249, 59-146063 and 59-146061; the cyanine pigments disclosed in Japanese Patent Application Laid-Open (JP-A) No. 59-216146; the pentamethine thiopyrylium salts disclosed in U.S. Pat. No. 4,283,475; and the pyrylium compounds described in Japanese Patent Application Publication (JP-B) Nos. 5-13514 and 5-19702 may also be preferably used.

Other examples of preferable dyes include the near infrared absorption dyes disclosed in U.S. Pat. No. 4,756,993 as the formulae (I) and (II).

Particularly preferable among these dyes are cyanine pigments, squalirylium pigments, pyrylium salts, and nickel thiolate complexes.

Favorable examples of the infrared absorber to be used in the present invention include those having an onium salt structure as described below. By using such infrared absorbers, the addition of the onium salts described above may be omitted, or the added amount of onium can be reduced. Specific examples of infrared absorbers having an onium salt structure are shown in A-1 to A-56, but the present invention is not restricted thereto.

A-1)

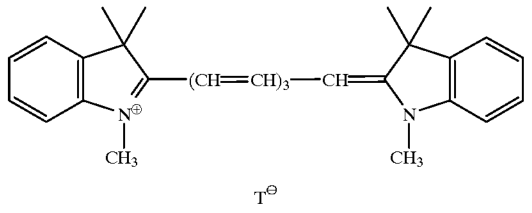

A-2)

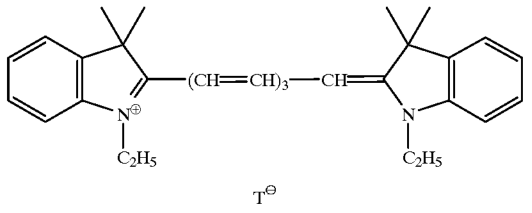

-continued
A-3)
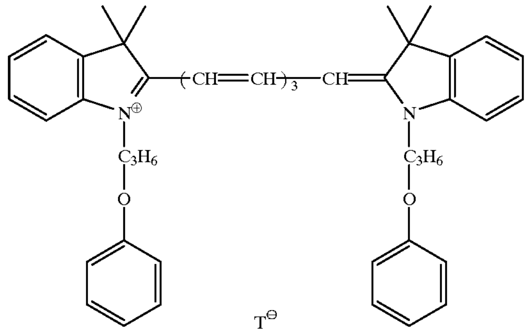
A-4)
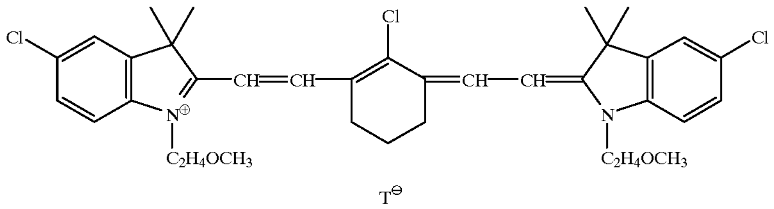
A-5)
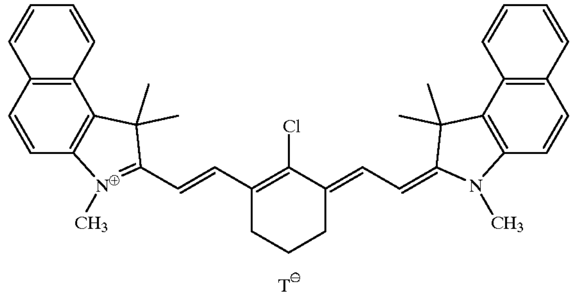
A-6)
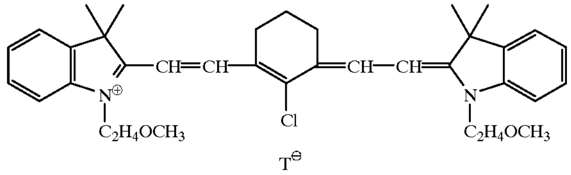
A-7)
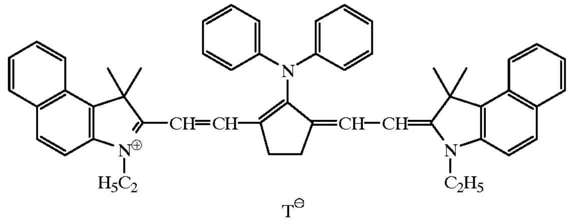
A-8)
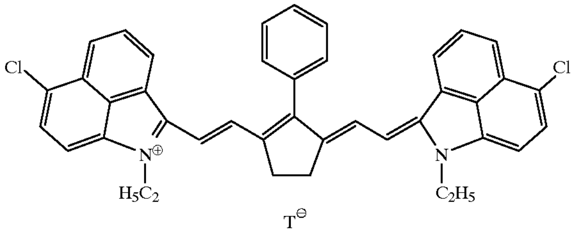
A-9)
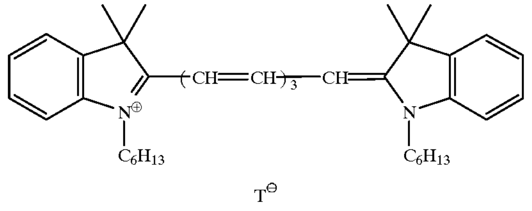
A-10)
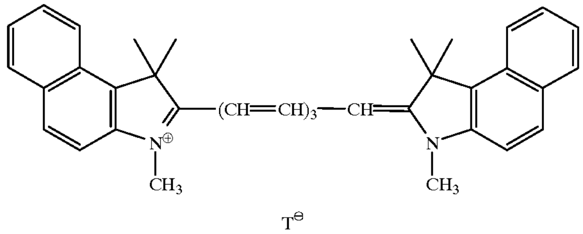

-continued
A-11)
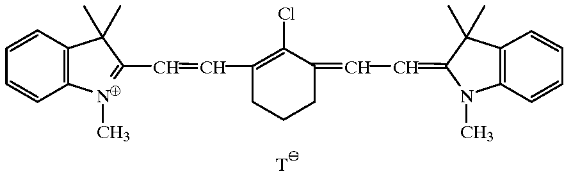
A-12)
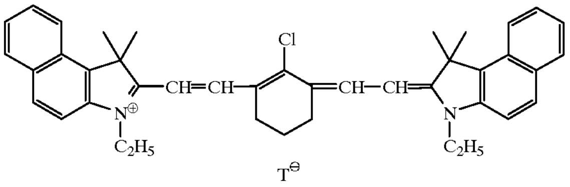
A-13)
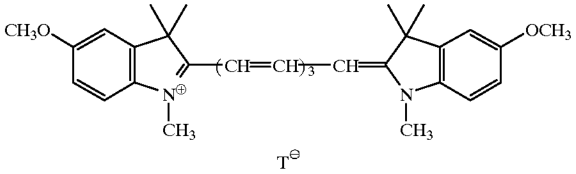
A-14)
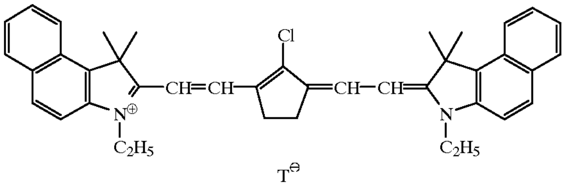
A-15)
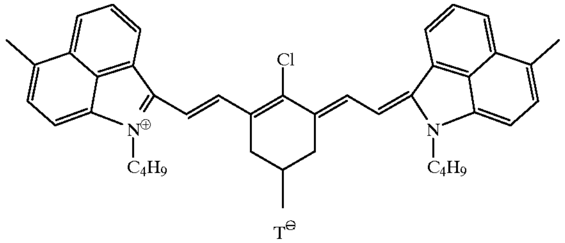
A-16)
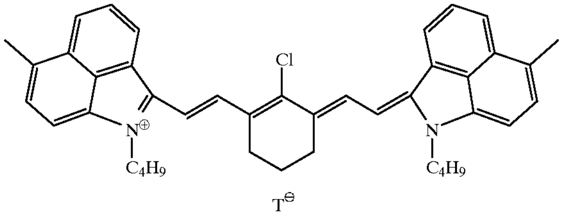
A-17)
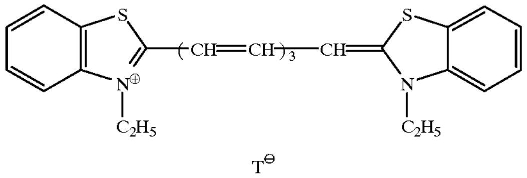
A-18)
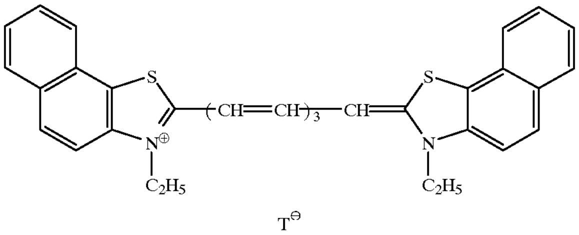
A-19)
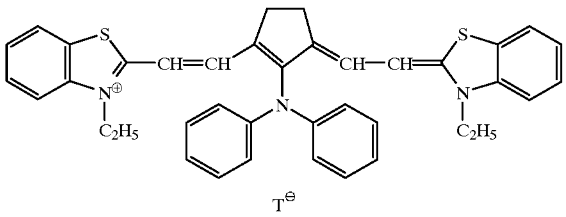
A-20)
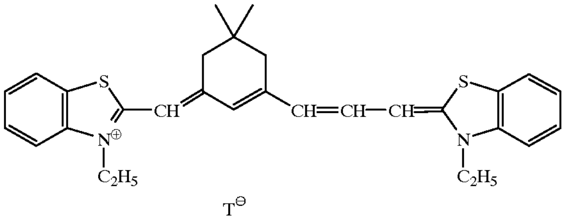
A-21)
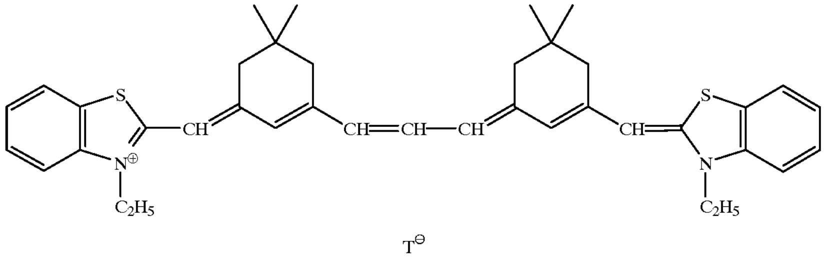

-continued
A-22)
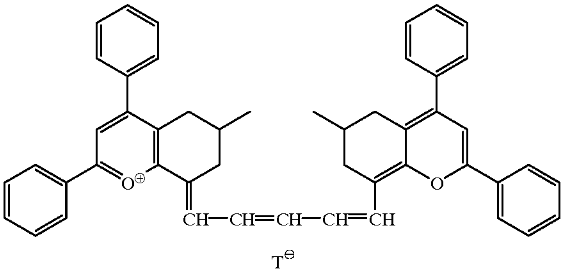
A-23)
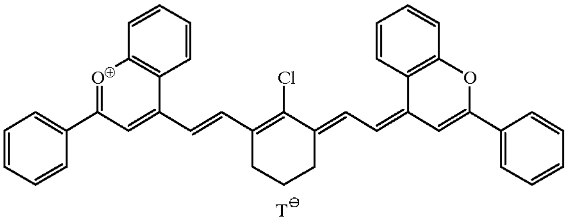
A-24)
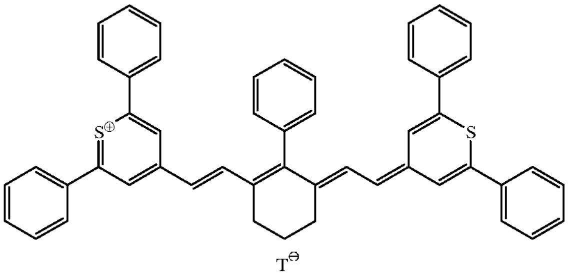
A-25)
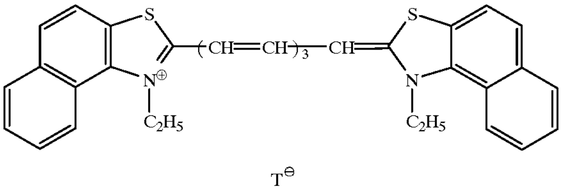
A-26)
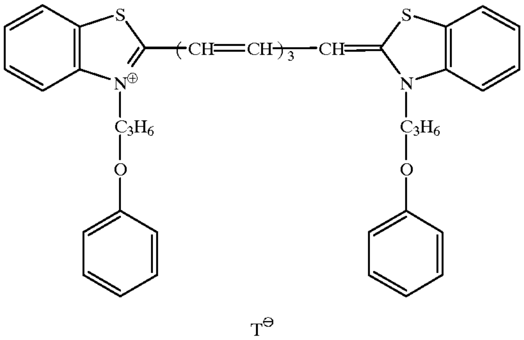
A-27)
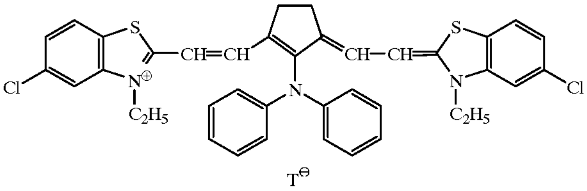
A-28)
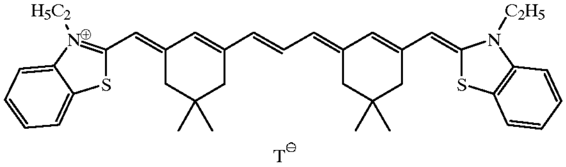
A-29)
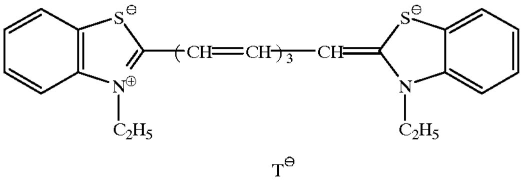
A-30)
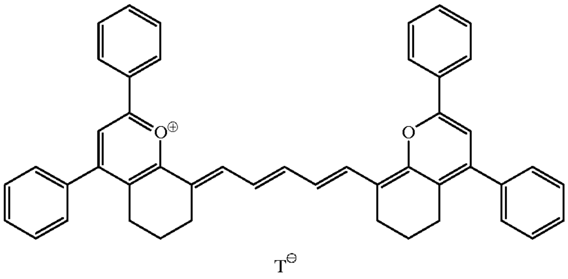
A-31)
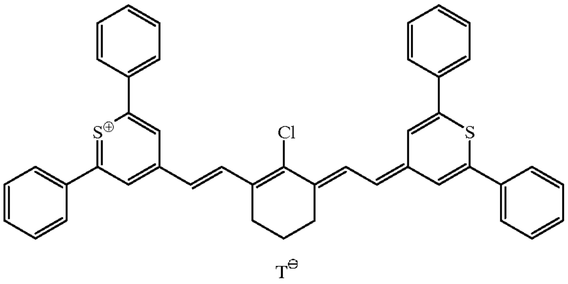

-continued
A-32)
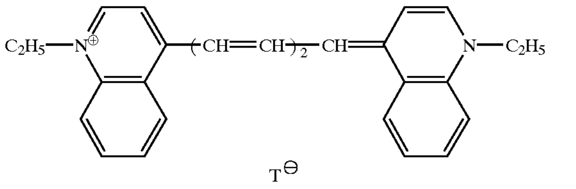
A-33)
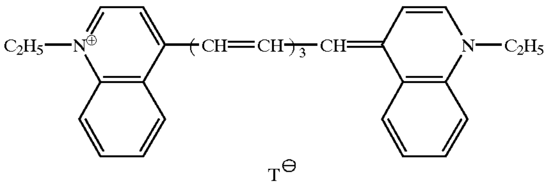
A-34)
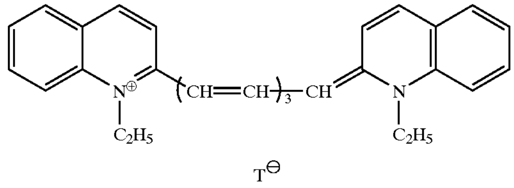
A-35)
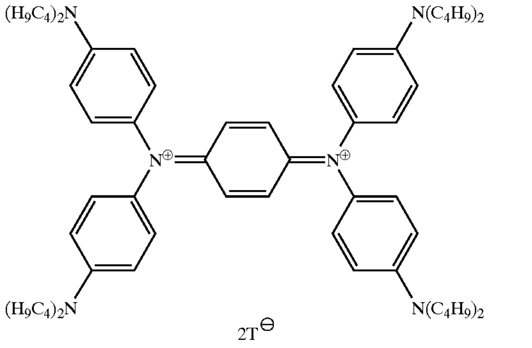
A-36)
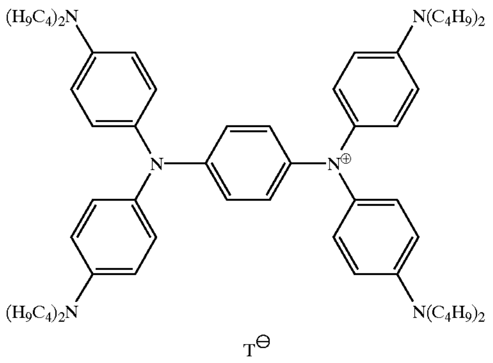
A-37)
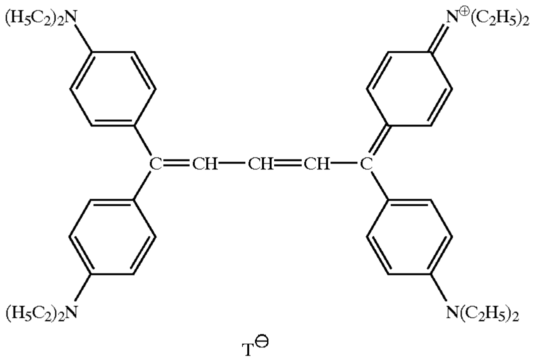
A-38)
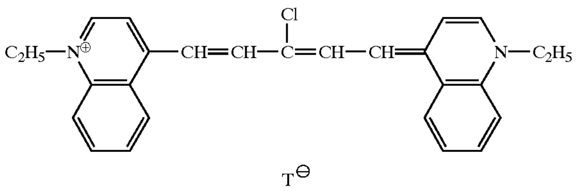
A-39)
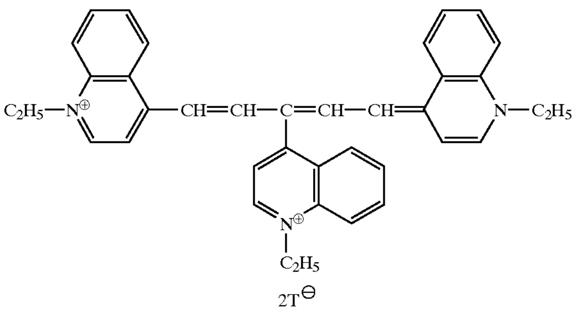
A-40)
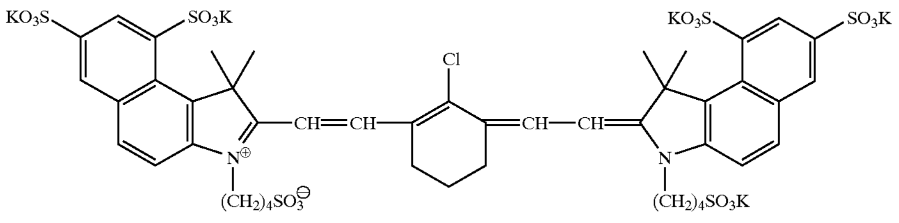

-continued
A-41)
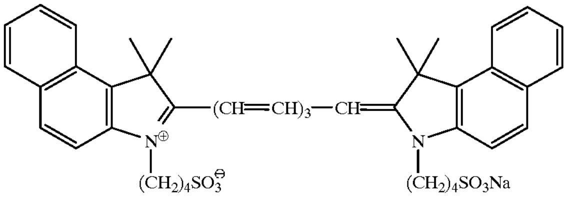
A-42)
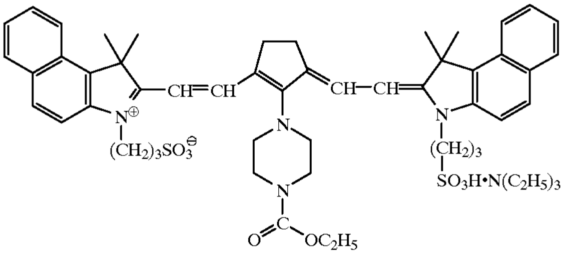
A-43)
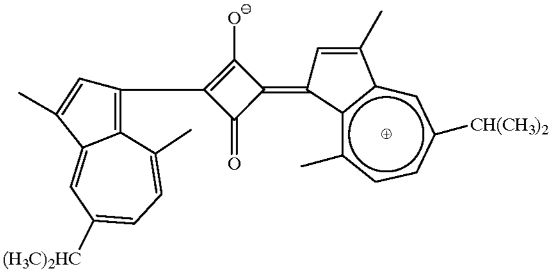
A-44)
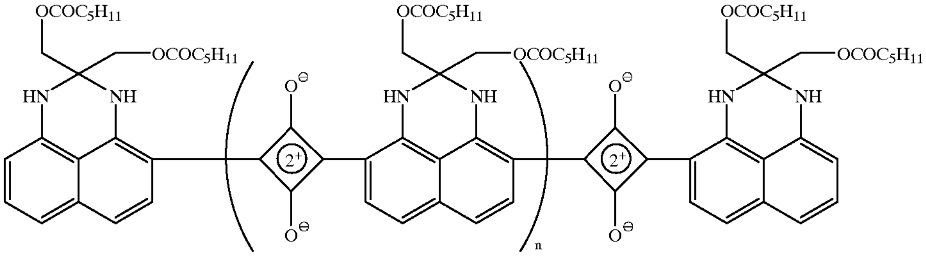
(n = 1,2)
A-45)
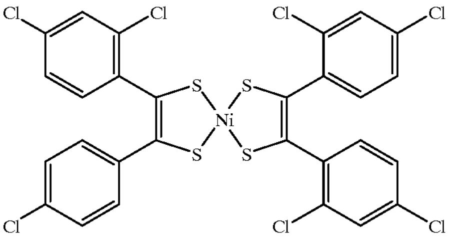
A-46)
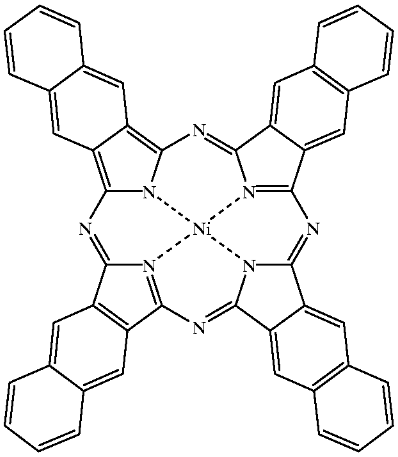
A-47)
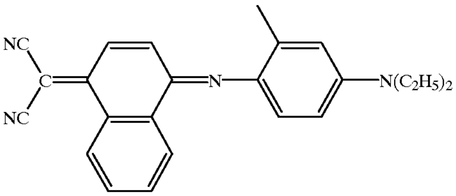
A-48)
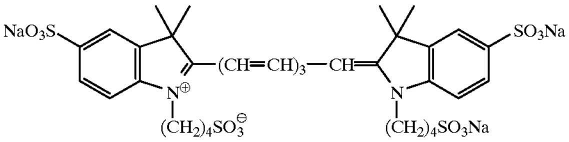

-continued

A-49)

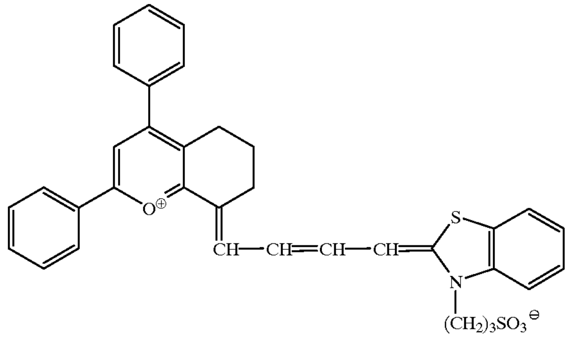

A-50)

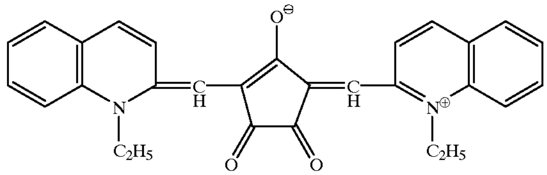

A-51)

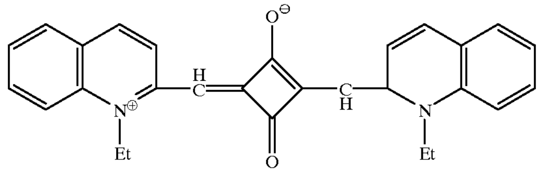

A-52)

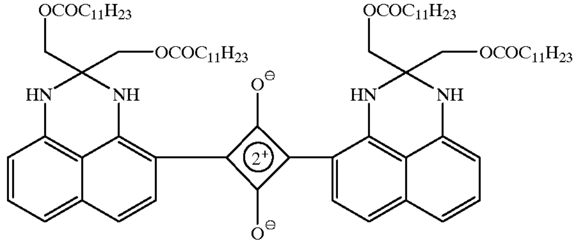

A-53)

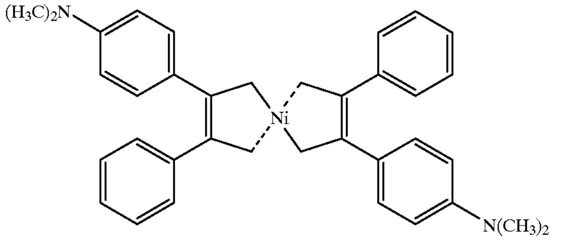

A-54)

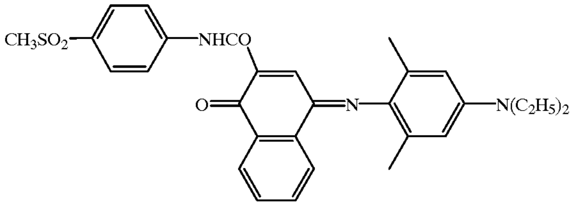

A-55)

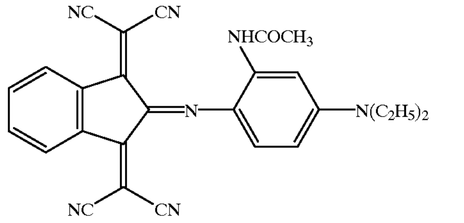

A-56)

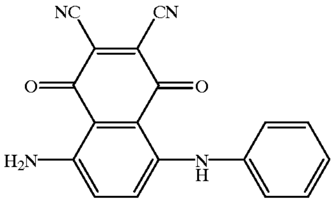

In the structural formulae A-1 to A-56, $T^-$ denotes a univalent counter anion, preferably a halogen anion ($F^-$, $Cl^-$, $Br^-$ or $I^-$), a Lewis acid anion ($BF_4^-$, $PF_6^-$, $SbCl_6^-$ or $ClO_4^-$) , an alkylsulfonic acid anion or an arylsulfonic acid anion.

The alkyl group as used here denotes a straight-chain, branched or ring alkyl group with a carbon number of 1 to 20. Specifically, examples include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylpropyl, isohexyl, 2-ethylhexyl, 2-methylhexyl, cyclohexyl, cyclopentyl or2-norbonyl groups. Straight-chainalkyl groups with a carbon number of 1 to 12, branched alkyl groups with a carbon number of 3 to 12, and ring alkyl groups with a carbon number of 5 to 10 are preferable among these examples.

The aryl group used here refers to an aryl group of one benzene ring, an aryl group formed of a condensed ring of two or three benzene rings, or an aryl group in which a benzene ring and five-member unsaturated ring form a condensed ring. Specific examples include phenyl, naphthyl, anthoryl, phenanthoryl, indenyl, acenaphthenyl and fluorenyl groups. The phenyl and naphthyl groups are more preferable among them.

Examples of pigments that may be used for the infrared absorber in the present invention include commercially available pigments and pigments described in the Color Index (C.I.) catalog, *Saishin Ganryô Binran* ("Recent Pigment Catalog" (edited by the Japan Pigment Technology Association, 1977), *Saishin Ganryô Ôyô Gijutsu* ("Recent Pigment Application Technology", published by CMC, 1986) , and *Insatsu Inki Gijutsu* ("Ink Printing Technology", published by CMC, 1984).

Examples of the kinds of the pigments include black pigments, yellow pigments, orange pigments, brown pigments, red pigments, purple pigments, blue pigments, green pigments, fluorescent pigments and metal powder pigments, as well as polymer bound pigments. Specifically, insoluble azo pigments, azo complex pigments, condensation pigments, complex azo pigments, phthalocyanine pigments, anthraquinone pigments, perylene and perynone pigments, thioindigo pigments, quinacridon pigments, dioxadine pigments, isoindolinone pigments, qinophthalocyanine pigments, staining lake pigments, azine pigments, nitroso pigments, nitro pigments, natural pigments, fluorescent pigments, inorganic pigments and carbon black.

These pigments may be used without surface treatment or after a surface treatment has been administered thereto. Examples of surface treatment methods include a method in which the surface is coated with a resin or wax, a method in which a surfactant is adhered, and a method in which a reactive substance (e.g., a silane coupling agent, an epoxy compound, polyisocyanate and the like) is bonded to the pigment surface. These surface treatment methods are described in *Kinzoku Sekken no Seishitsu to Ôyô* ("Properties and Application of Metallic Soap", published by Saiwai Shobô), *Insatsu Inki Gijutsu* ("Ink Printing Technology", published by CMC, 1984), and *Saishin Ganryô Ôyô Gijutsu* ("Recent Pigment Application Technology", published by CMC, 1986).

The particle diameter of the pigment is preferably in the range of 0.01 μm to 10 μm, more preferably in the range of 0.05 μm to 1 μm, and even more preferably in the range of 0.1 μm to 1 μm. A pigment particle diameter of less than 0.01 μm is not preferable from the standpoint of acid cross-linking of dispersed material and stability of the polar conversion layer in the coating solution. A particle diameter of more than 10 μm is also not preferable from the standpoint of uniformity of the recording layer.

Known dispersion methods used in the manufacture of inks and toners may also be used as a method for dispersing the pigment. Examples of dispersing machines include a ultrasonic dispersing machine, a sand mill, an atoliter, a pearl mill, a super mill, a ball mill, an impeller, a dispersor, a KD mill, a colloid mill, a dynatron, a three-axis roll mill and a pressurizing kneader. Details are described in *Saishin Ganryô Ôyô Gijutsu* ("Recent Pigment Application Technology", published by CMC, 1986).

In addition, other compounds, such as the compound disclosed as a "photo-thermal conversion substance" in JP-A No. 8-108621 and the compound disclosed as a "photo-thermal conversion element" in JP-A No. 9-34110, may also be similarly used.

These dyes or pigments may be added to the recording layer preferably in a proportion of 0.01 to 50% by weight, preferably 0.5 to 10% by weight in the case of the dye and 1.0 to 10% by weight in the case of the pigment, relative to the total solid component of the radical polymerization layer. When the added amount of pigment or dye is less than 0.1 wt. %, the effect of sensitization becomes insufficient. When the added amount of pigment or dye exceeds 50 wt. %, contamination is generated at non-image portions at the time of printing.

Other Compounds

As long as the object of the present invention is not compromised, various additives that may be used together with conventionally known photopolymerizable compounds can be appropriately used in the radical polymerization layer.

Examples of the additive include thermal polymerization inhibitors. Specifically, examples include quinones and phenol based compounds such as hydroquinone, pyrogallol, p-methoxyphenol, catecol, β-naphthol and 2,6-di-t-butyl-p-cresol. These compounds may be used in a proportion of 10 parts by weight, preferably in a proportion of about 0.01 to 5 parts by weight, relative to 100 parts by weight of the total, combined amount of the polymerizable compound having ethylenic unsaturated bonds and the binder resin.

Examples of compounds that can be added as an oxygen quencher include the N,N-diaryalkylaniline derivatives disclosed at column 11 line 58 to column 12 line 35 of U.S. Pat. No. 4,772,541.

A plasticizer may be also used to improve film quality. Examples include phthalic acid esters, trimellitic acid esters, adipic acid esters, other saturated or unsaturated carboxylic acid esters, citric acid esters, epoxylated soy bean oil, epoxylated linseed oil, epoxylated stearic acid, orthophosphoric acid esters, phosphonic acid esters and glycol esters.

It is also preferable to use an acid generator together that generates an acid by heating as an additive to accelerate the decomposition of the radical generator. Acid generators described later in detail in the description of the acid cross-linking layer may be used.

The radical polymerization layer may be formed by appropriately selecting respective components, dissolving the components in an appropriate solvent, and then coating the solvent on a support. However, the coating amount after drying is preferably about 1 $g/m^2$ to 5.0 $g/m^2$.

When the infrared absorber is added to the radical polymerization layer, it is preferable to add the infrared absorber so that the optical density in a recording wavelength is in a range of 0.5 to 3. The radical generator, the polymerizable compound and the infrared absorber added if desired may be localized in microcapsules for the purpose of improving sensitivity. The microcapsules used herein preferably have a heat responsive property (i.e., internal materials are discharged upon heating during exposure). A method for forming such microcapsules is disclosed in detail in Japanese Patent Application Laid-Open (JP-A) No. 1-145190.

An overcoat layer impermeable to oxygen may be provided adjacent to the radical polymerization layer, in order to prevent polymerization inhibition oxygen. Preferable examples of materials for the overcoat layer include water soluble resins such as polyvinyl alcohol, carboxymethyl cellulose, hydroxyethyl cellulose, methyl cellulose and polyvinyl pyrrolidone. A film thickness of about 0.2 to 3 μm is appropriate.

Acid Cross-link Layer

The acid cross-linking layer of the present invention has a compound that generates an acid by light or heat (referred as an "acid generator" hereinafter), a compound that can cross-link the generated acid as a catalyst (referred as a "cross-linking" agent hereinafter), and a binder polymer that is able to react with the cross-linking agent in the presence of the acid to form a layer that includes these compounds. In the acid-crosslinking layer, acids generated by the decomposition of the acid generator when the acid generator is irradiated with light or heated accelerate the action of the cross-linking agent, whereby a firm cross-linking structure is formed between cross-linking agents themselves or between the cross-linking agent and the binder polymer. Accordingly, alkali solubility drops and the acid cross-linking layer becomes insoluble in the developer.

Known layers having characteristics similar to those described above may be used for the acid cross-linking layer of the present invention. Examples of such a layer include the layer composed of a radiation sensitive composition having a Resol resin, a Novolac resin, a latent Bronsted acid and an infrared absorber, disclosed in Japanese Patent Application Laid-Open (JP-A) No. 7-20629. This composition has both a Resol resin, which is alkaline resistant, and a Novolac resin, which is highly soluble in alkaline, as well as a latent Bronsted acid. The term "latent Bronsted acid" as used herein refers to a precursor that decomposes to generate a Bronsted acid, and is a compound having features of both the acid generator and acid cross-linking agent of the present invention. The Bronsted acid is thought to catalyze the matrix forming reaction between the Resol resin and the Novolac resin, and examples of Bronsted acids suitable for this purpose include trifluoromethane sulfonic acid and hexafluorophosphonic acid.

In addition, ionic latent Bronsted acids are preferable, and examples thereof include onium salts, particularly iodonium, sulfonium, phosphonium, selenonium, diazonium and alsonium salts. Particular examples of useful onium salts include diphenyliodonium hexafluorophosphate, triphenylphosphonium fluoroantimonate, phenylmethyl-ortho-cyanobenzylsulfonium trifluoromethane sulfonate, and 2-methoxy-4-aminophenyl diazonium hexafluorophosphate.

Non-ionic latent Bronsted acids may be favorably used, and examples thereof include $RCH_2X$, $RCHX_2$, $RCX_3$, $R(CH_2X)_2$ and $R(CH_2X)_3$ (X is Cl, Br, F, or $CF_3$, $SO_3$, and R is an aromatic group, an aliphatic group, or a combination of an aromatic group and an aliphatic group.

Further, the recording layer composed of an acid cross-linking compound and high molecular weight bonding agent and disclosed in Japanese Patent Application Laid-Open (JP-A) No. 11-95415 is also suitable. This layer is a photosensitive layer composed of a compound that can generate an acid by irradiation of an active ray, for example diazonium, phosphonium, sulfonium and iodonium salts, an organic halogen compound, orthoquinone-diazidesulfonyl chloride and an organometallic compound/organic halogen compound; a compound having at least one bond that can form cross-links in the presence of the foregoing acids, for example an amino compound having at least two functional groups such as an alkoxymethyl group, a methylol group and an acetoxymethyl group, an aromatic compound substituted with at least two functional groups that are an alkoxymethyl group, a methylol group and an acetoxymethyl group; a Resol resin; and an acrylic resin synthesized from specified monomers.

Examples of known recording materials that can be applied to the layer having similar functions include the negative image recording material having a phenol derivative and disclosed in Japanese Patent Application Laid-Open (JP-A) No. 8-276558; the negative-type recording material having a diazonium compound and disclosed in Japanese Patent Application Laid-Open (JP-A) No. 7-306528; and the negative-type image forming material, disclosed in Japanese Patent Application Laid-Open (JP-A) No. 10-203037, that utilizes cross-link reaction caused by an acid catalyst and in which polymers having heterocyclic groups with unsaturated bonds in the ring are used. The recording layers disclosed in the foregoing patent publications can also be used as the acid cross-linking layer of the present invention.

The acid cross-linking layer of the present invention has an acid generator, a cross-linking agent, a binder polymer and other components. These compounds will be described separately hereinafter.

Acid Generator

In the present invention, by a compound that generates an acid by light or heat (i.e., the acid generator) is meant a compound that is decomposed by being irradiated with infrared light or by being heated at a temperature of 100° C. or higher to generate an acid. The acid generated is preferably a strong acid with a pKa value of 2 or less, such as sulfonic acid and hydrochloric acid.

Examples of acid generators favorably used in the present invention include onium salts such as iodonium salts, sulfonium salts, phosphonium salts and diazonium salts. Specifically, the compounds disclosed in U.S. Pat. No. 4,708,925 and Japanese Patent Application Laid-Open (JP-A) No. 7-20629 may be used. In particular, iodonium salts, sulfonium salts and diazonium salts having sulfonic acid ions as counterions are preferable. Examples of preferable diazonium salts include the diazonium compounds disclosed in U.S. Pat. No. 3,867,147, the diazonium compounds described in U.S. Pat. No. 2,632,703, and the diazo resins disclosed in Japanese Patent Application Laid-Open (JP-A) Nos. 1-102456 and 1-102457. The benzylsulfonates disclosed in U.S. Pat. No. 5,135,838 and U.S. Pat. No. 5,200,544 are also preferable. Activated sulfonic acid esters and disufonyl compounds disclosed in Japanese Patent Application Laid-Open (JP-A) Nos. 2-100054 and 2-100055, and in Japanese Patent Application No. 8-9444, are also preferable. Further, the S-triazines substituted with haloalkyl groups disclosed in Japanese Patent Application Laid-Open (JP-A) No. 7-271029 are also preferable.

These acid generators are added to the acid cross-linking layer in a proportion of 0.01 to 50% by weight, preferably 0.1 to 40% by weight, and more preferably 0.5 to 30% by weight, relative to the total solid component of the acid cross-linking layer. When the added amount is less than 0.01% by weight, images cannot be obtained. When the added amount exceeds 50% by weight, contamination is generated at non-image portions at the time of printing.

These compounds may be used singly, or in combination of two or more. Since the acid generators described above may be decomposed by ultraviolet irradiation, images can be recorded not only by infrared light irradiation but also by UV irradiation using the recording layer having such an embodiment.

Acid Cross-link Agent

There are no particular restrictions on the cross-linking agent usable in the acid cross-linking layer of the present invention, as long as the cross-linking agent is a compound that is cross-linked by an acid. A phenol derivative represented by the following general formula (I) (referred to as a "low molecular weight phenol derivative" hereinafter), a polynuclearphenolic cross-linking agent having in the molecule thereof three or more phenol rings that have two or three hydroxymethyl groups on the rings, and a mixture of the low molecular weight phenol derivative and the polynuclear phenolic cross-linking agent and/or a Resol resin may be preferably used.

General Formula (I)

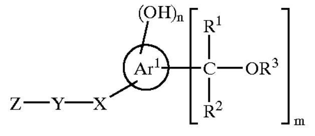

Y:

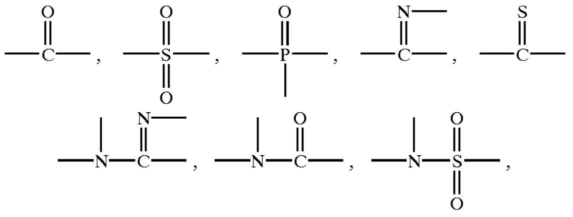

-continued

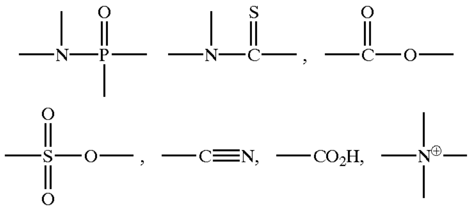

In the formula, $Ar^1$ denotes an aromatic hydrocarbon ring that may have substituents. $R^1$ and $R^2$ may be the same or different, and denote hydrogen or a hydrocarbon group with a carbon number of 12 or less. $R^3$ denotes hydrogen or a hydrocarbon group with a carbon number of 12 or less, and m and n denote integers of 2 to 4 and 1 to 3, respectively. X denotes a bivalent linking group, and Y denotes a one to four valent a linking group having the partial structure described above, or a hydrogen atom. Z does not exist when Y is a terminal group, or may denote a one to four valent linking group or functional group present depending on the number of linking groups of Y.

General Formula (II)

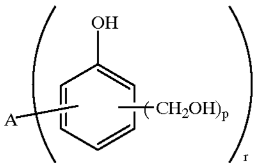

In the formula, A denotes an r-valent hydrocarbon linking group with a carbon number of 1 to 20, and r and p denote integers of 3 to 20 and 2 to 3, respectively.

The phenol derivative represented by the general formula (I) will be described in detail first.

In the general formula (I), $Ar^1$ denotes an aromatic hydrocarbon ring that may have substituents. A benzene ring, naphthalene ring or anthracene ring is preferable as the aromatic hydrocarbon ring from the standpoint of availability of raw materials. Examples of preferable substituents include a halogen atom, a hydrocarbon group with a carbon number of 12 or less, an alkoxy group with a carbon number of 12 or less, an alkylthio group with a carbon number of 12 or less, a cyano group, a nitro group and a trifluoromethyl group. Examples of the $Ar^1$ that are particularly preferable includes a benzene or naphthalene ring having no substituents, a halogen atom, a hydrocarbon atom with a carbon number of 6 or less, an alkoxy group with a carbon number of 6 or less, an alkylthio group with a carbon number of 6 or less, and a benzene and a naphthalene ring having nitro groups as substituents, for the reason of their high sensitivity.

$R^1$ and $R^2$ may be the same or different, and denote a hydrogen atom or a hydrocarbon group with a carbon number of 12 or less. Hydrogen or a methyl group is particularly preferable as $R^1$ and $R^2$ for the reason of easy synthesis. $R^3$ denotes a hydrogen atom or a hydrocarbon group with a carbon number of 12 or less. A hydrocarbon group with a carbon number of 7 or less such as methyl, ethyl, propyl, cyclohexyl, benzyl group is particularly preferable as $R^3$ for the reason of high sensitivity. The letters M and n denote integers of 2 to 4 and 1 to 3, respectively.

X denotes a bivalent linking group, and Y denotes a one to four valent linking group or a functional group with terminal hydrogen atoms. Z does not exist when Y is a terminal group, or may denote a one to four valent linking group or functional group present depending on the number of the Y linking groups.

X in the general formula (I) will next be described in detail.

X is a bivalent linking group, and indicates a hydrocarbon linking group that may have single bonds or substituents. Preferable examples of the hydrocarbon linking group include a straight-chain, branched or ring alkylene group with a carbon number of 1 to 18, a straight-chain, branched or ring alkenylene group with a carbon number of 2 to 18, an alkynylene group with a carbon number of 2 to 8, and an arylene group with a carbon number of 6 to 20. More preferable examples include a methylenne, ethylene, propylene, butylene, isopropylene, cyclohexylene, phenylene, tolyllen or biphenylene group, or a group represented by the following chemical structure.

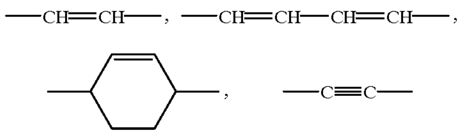

When these linking groups have substituents, an alkoxy group with a carbon number of 12 or less, a halogen atom or a hydroxy group is a preferable substituent.

Y in the general formula (I) will be next described in detail.

Y is a functional group that may be a linking group accompanying Z described below. As expressed earlier, may be mono-, di-, tri- or quadri-valent, and is a group known to a strongly interact with aphenolic hydroxy group. Specifically, a functional group having the partial structures described below may be appropriately indicated as an example.

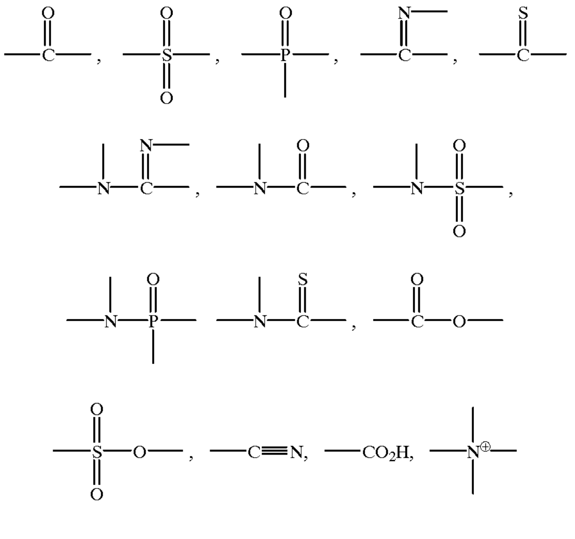

That the exemplified structures are partial structures of Y means that the linking group or the functional group Y, whose termnus is a hydrogen atom, has at least one of the partial structures exemplified above. Accordingly, Y is a group in which a plurality of the partial structures are linked, or the group in which an exemplified partial structure and a usual hydrocarbon group are linked.

Preferable examples of compounds having these functional groups include amide, sulfonamide, imide, urea, urethane, thiourea, carboxylic acid, carboxylic acid ester and sulfonic acid ester.

Z in the general formula (I) will next be described in detail.

Z does not exist when the functional group Y is a terminal group, or may denote a one to four valent linking group or a functional group present depending on the number of the linking groups of the functional group Y. Z is preferably a hydrocarbon linking group or a hydrocarbon group that may have substituents, and preferable examples of the hydrocarbon linking groups include straight-chain alkylene or alkyl with a carbon number of 1 to 18, branched alkylene or alkyl, ring alkylene or alkyl, arylene or aryl with a carbon number of 6 to 20, straight-chain, branched or ring alkenylene or alkenyl with a carbon number of 2 to 18, or alkynylene or alkynyl with a carbon number of 2 to 18.

More preferable examples of Z include a mono-valent group such as a methyl, ethyl, propyl, isopropyl, butyl, isobutyl, t-butyl, sec-butyl, pentyl, hexyl, cyclopentyl, cyclihexyl, octyl, benzyl, phenyl, naphthyl, anthracenyl, aryl or vinyl group.

Preferable examples of Z having a valency of two or higher include a linking group in which hydrogen atoms are eliminated from these mono-valent group depending on the valency number.

When Z has substituents, an alkoxy group with a carbon number of 12 or less, a halogen atom or a hydroxyl group are preferred.

Specific examples of low molecular weight phenol derivatives that may suitably be used in the present invention are, for convenience, divided into several patterns (e.g., the examples of functional groups illustrated below). However, the present invention is not limited to the same.

(A type)

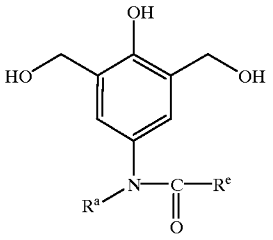

TABLE 1

| | $R^a$ | $R^b$ |
|---|---|---|
| (A-1) | H | H |
| (A-2) | H | $CH_3$ |
| (A-3) | H | $C_2H_5$ |
| (A-4) | H | $^iPr$ |
| (A-5) | H | $^tBu$ |
| (A-6) | H | Ph |
| (A-7) | $CH_3$ | $CH_3$ |
| (A-8) | $CH_3$ | $^iPr$ |
| (A-9) | $CH_3$ | Ph |
| (A-10) | Ph | $CH_3$ |
| (A-11) | Ph | $^iPr$ |

(B type)

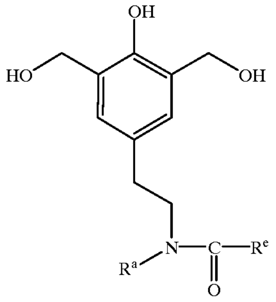

TABLE 2

| | $R^a$ | $R^b$ |
|---|---|---|
| (B-1) | H | $C_2H_5$ |
| (B-2) | H | $^iPr$ |
| (B-3) | H | $^nBu$ |
| (B-4) | H | $^tBu$ |
| (B-5) | H | Ph |

(C type)

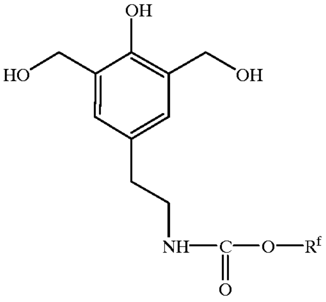

| | $R^1$ |
|---|---|
| (C-1) | $C_2H_5$ |
| (C-2) | $^iPr$ |
| (C-3) | $^nBu$ |
| (C-4) | Ph |
| (C-5) | $-CH_2-Ph$ |

(D type)

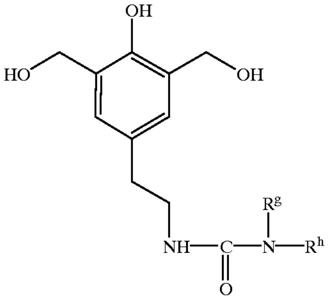

TABLE 4

| | $R^g$ | $R^h$ |
|---|---|---|
| (D-1) | H | $^nBu$ |
| (D-2) | H | cyclo-$C_5H_{11}$ |
| (D-3) | H | Ph |

TABLE 4-continued
| | $R^g$ | $R^h$ |
|---|---|---|
| (D-4) | H | 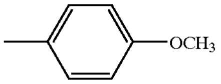 |
| (D-5) | H | 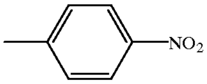 |
| (D-6) | $CH_3$ | $CH_3$ |
(E type)
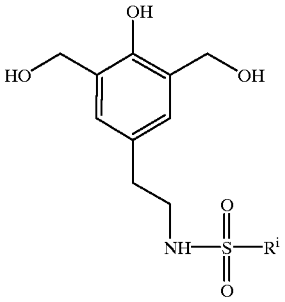
TABLE 5
| | $R^i$ |
|---|---|
| (E-1) | $C_2H_5$ |
| (E-2) | Ph |
| (E-3) | 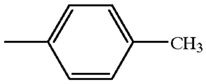 |
| (E-4) | 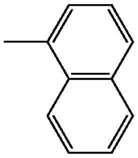 |
(F type)
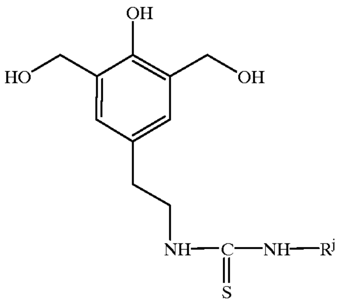
TABLE 6
| | $R^j$ |
|---|---|
| (F-1) | $CH_2—CH=CH_2$ |
| (F-2) | $^nBu$ |
| (F-3) | Ph |
(G type)
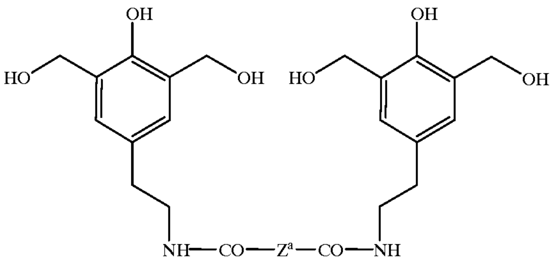
TABLE 7
| | $Z^a$ |
|---|---|
| (G-1) | $—(CH_2)_4—$ |
| (G-2) | 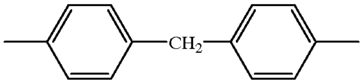 |
| (G-3) |  |
| (G-4) | $—NH—(CH_2)_6—NH—$ |
| (G-5) | 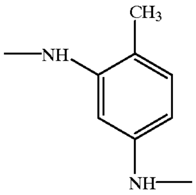 |
| (G-6) | 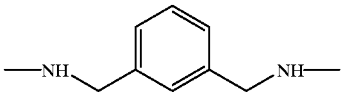 |
| (G-7) | $—O—(CH_2)_6—O—$ |
| (G-8) |  |

(H type)
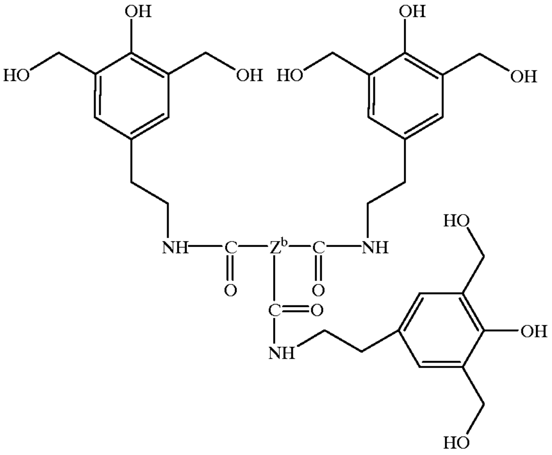
TABLE 8
| | $Z^b$ |
|---|---|
| (H-1) | 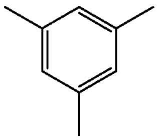 |
| (H-2) | 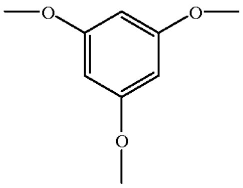 |
| (H-3) | 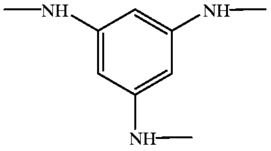 |
(J type)
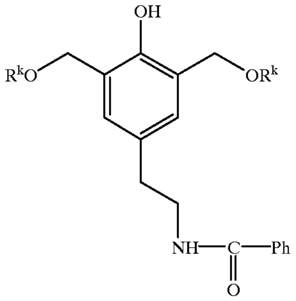
TABLE 9
| | $R^k$ |
|---|---|
| (J-1) | $CH_3$ |
| (J-2) | $C_2H_5$ |
TABLE 9-continued
| | $R^k$ |
|---|---|
| (J-3) | $^{i}Pr$ |
| (J-4) | 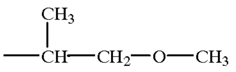 |
(S-1)
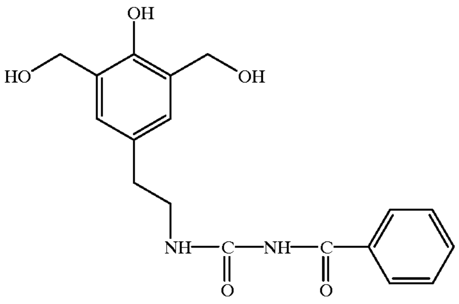
(S-2)
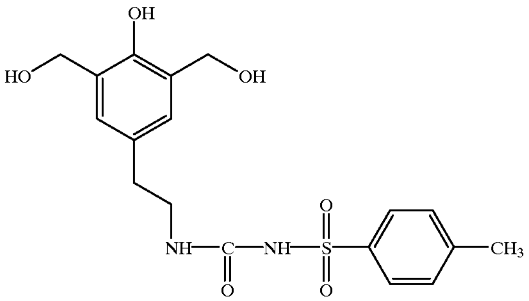
(S-3)
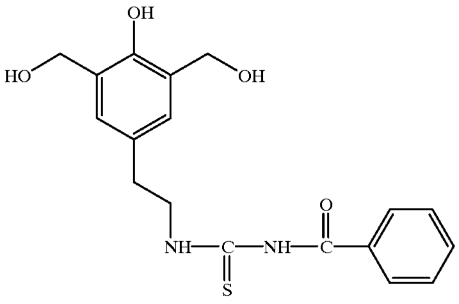
(S-4)
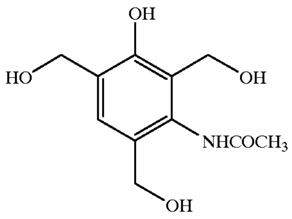

-continued
(S-5)
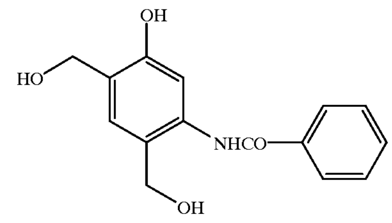
(S-6)
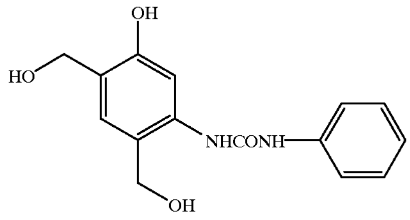
(S-7)
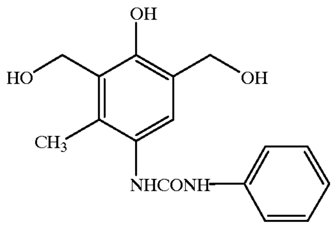
(S-8)
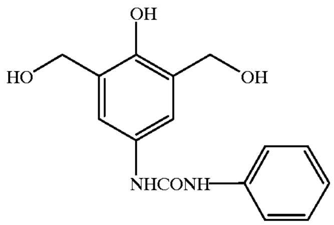
(S-9)
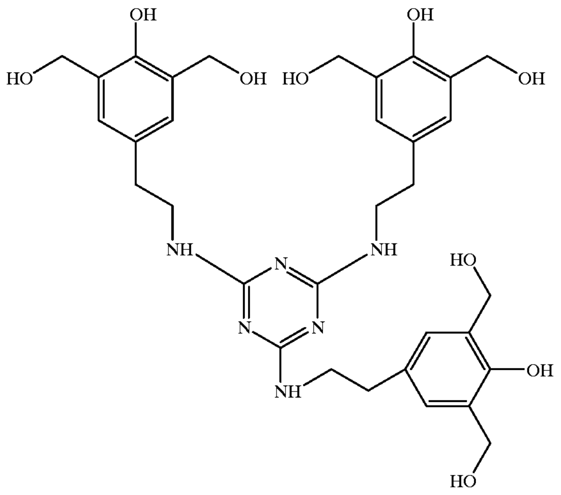
-continued
(S-10)
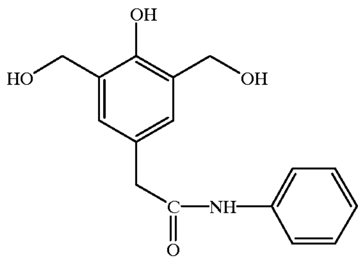
(S-11)
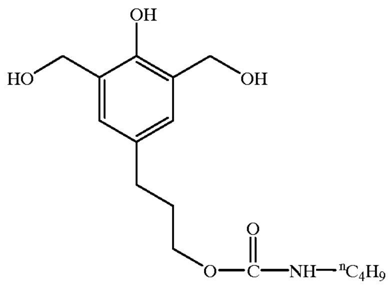
(S-12)
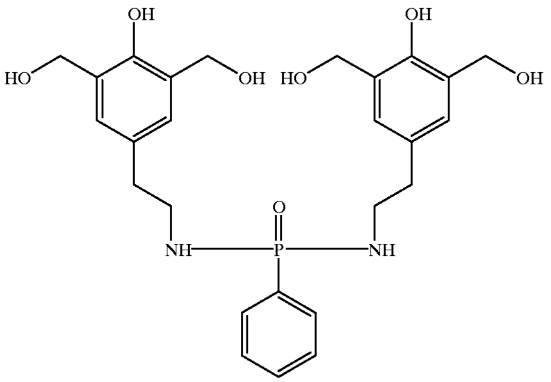
(S-13)
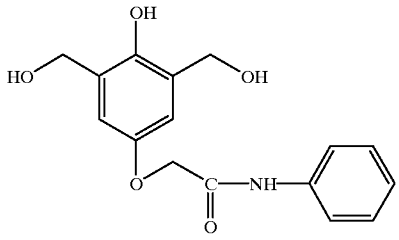
(S-14)
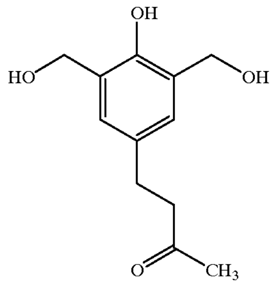

-continued
(S-15)
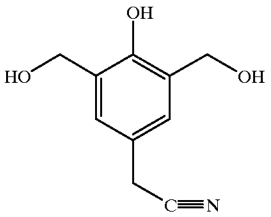
(S-16)
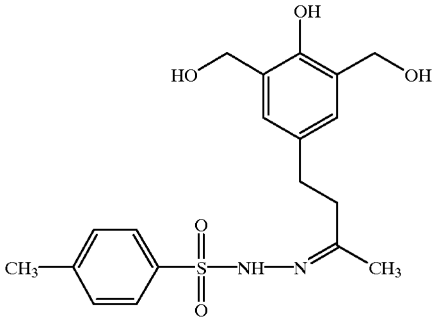
(S-17)
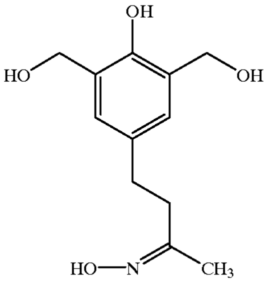
(S-18)
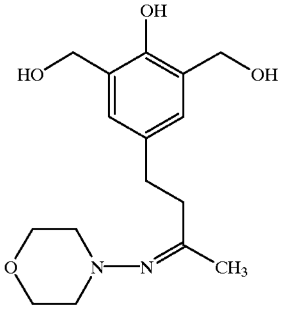
(S-19)
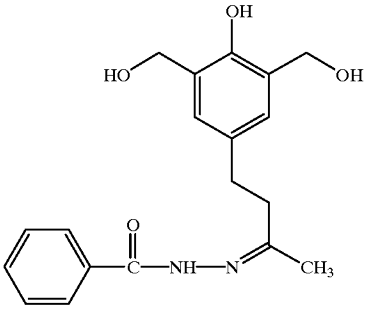
-continued
(S-20)
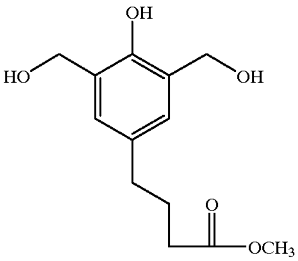
(S-21)
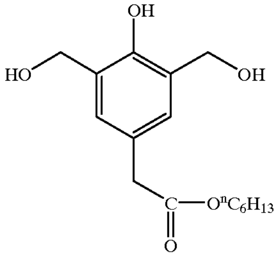
(S-22)
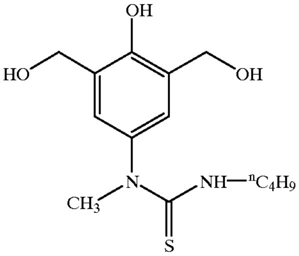
(S-23)
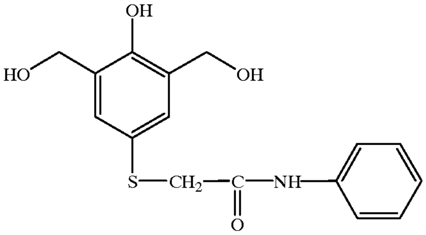
(S-24)
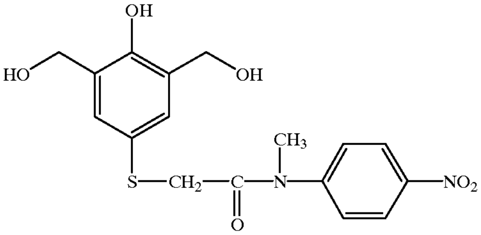
(S-25)
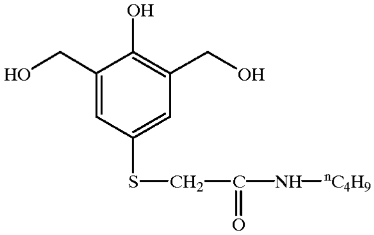

-continued
(S-26)
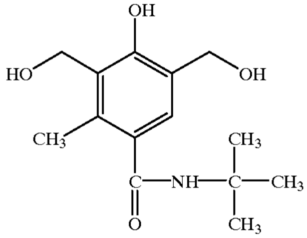
(S-27)
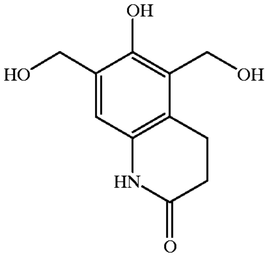
(S-28)
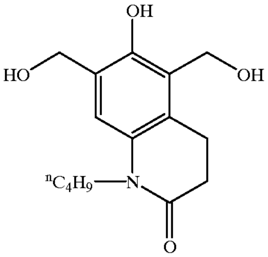
(S-29)
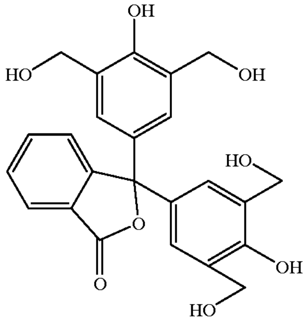
(S-30)
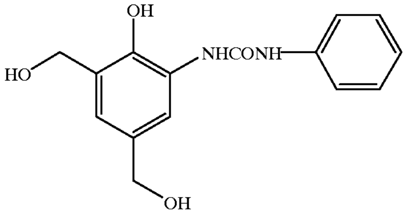
(S-31)
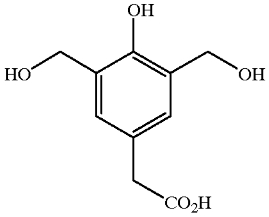
-continued
(S-32)
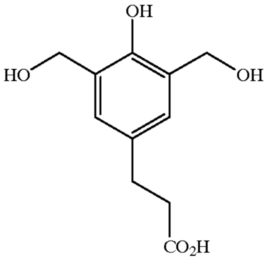
(S-33)
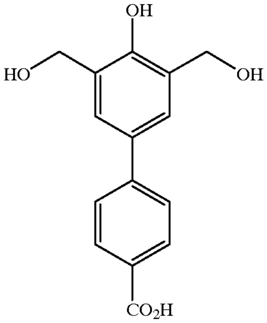
(S-34)
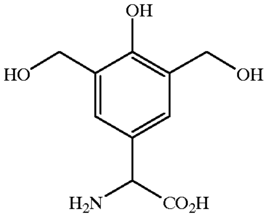
(S-35)
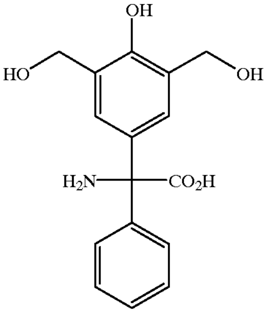
(S-36)
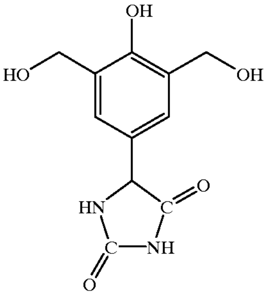

-continued
(S-37)
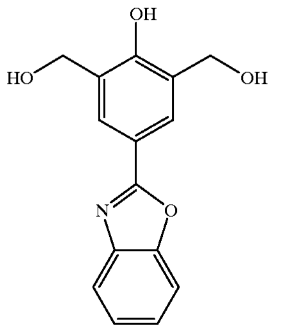
(S-38)
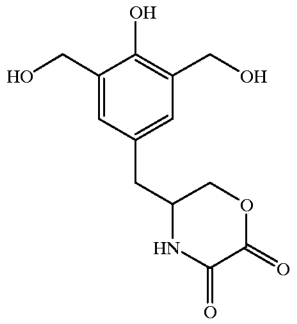
(S-39)
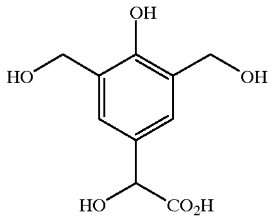
(S-40)
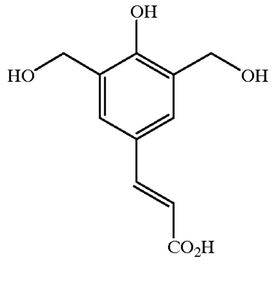
(S-41)
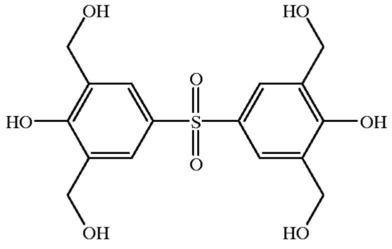
-continued
(S-42)
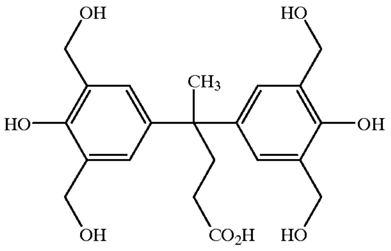
(S-43)
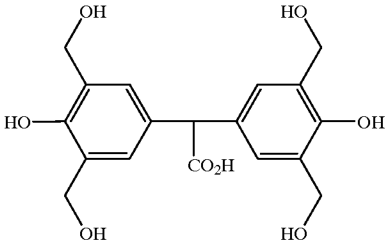
(S-44)
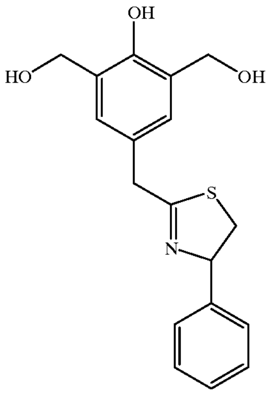
(S-45)
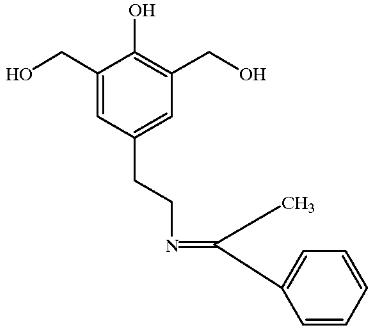

-continued
(S-46)
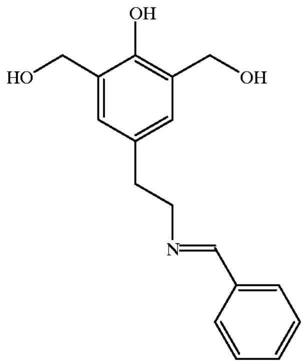
(S-47)
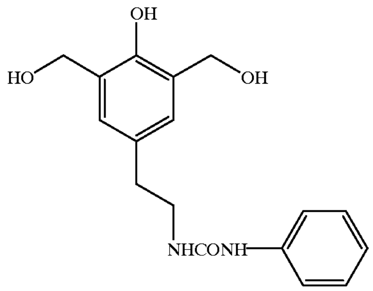
(S-48)
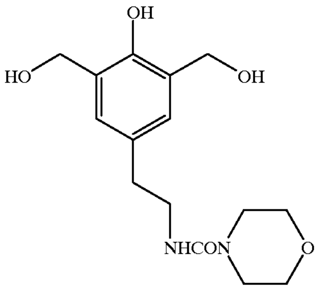
(S-49)
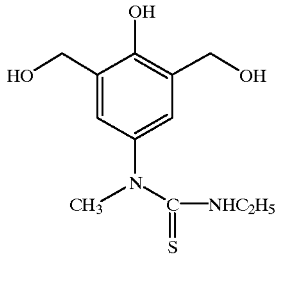
S-50)
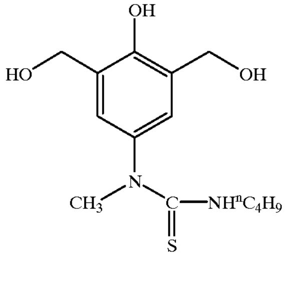
-continued
(S-51)
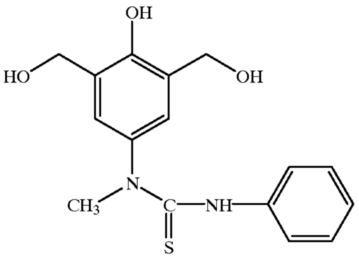
(S-52)
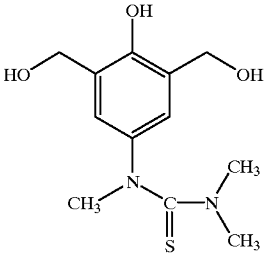
(S-53)
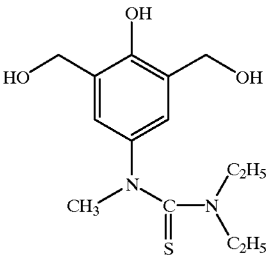
(S-54)
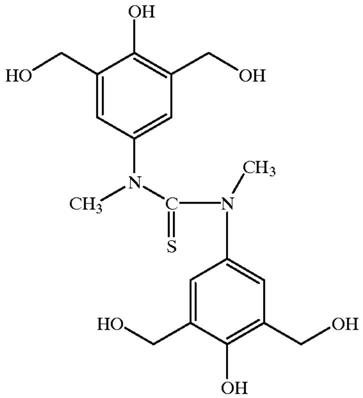
(S-55)
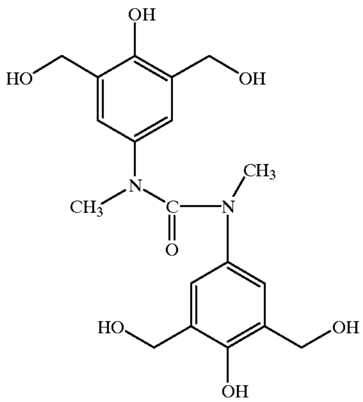

-continued
(S-56)
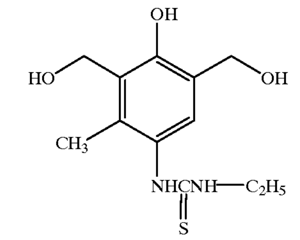
(S-57)
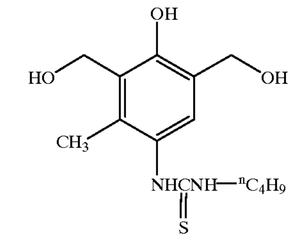
(S-58)
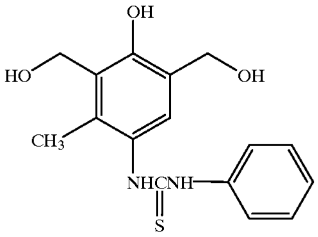
(S-59)
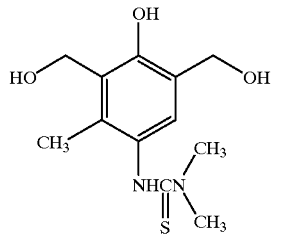
(S-60)
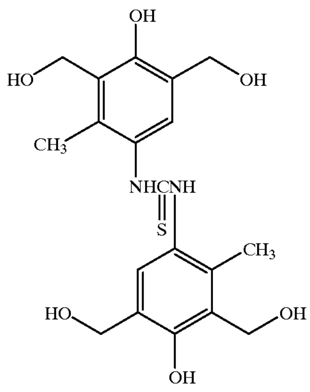
-continued
(S-61)
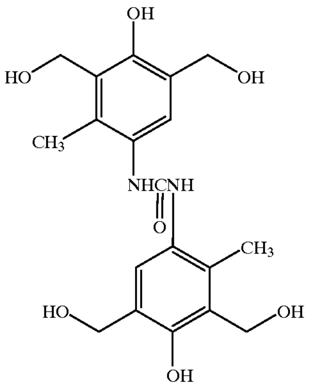
(S-62)
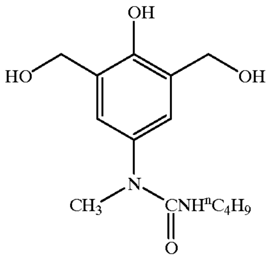
(S-63)
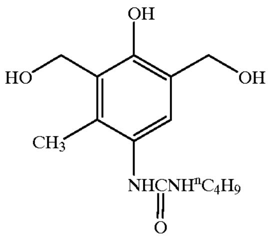
(S-64)
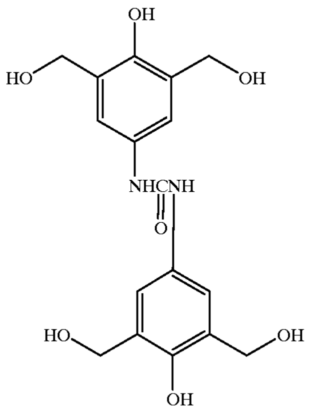

-continued
(S-65)
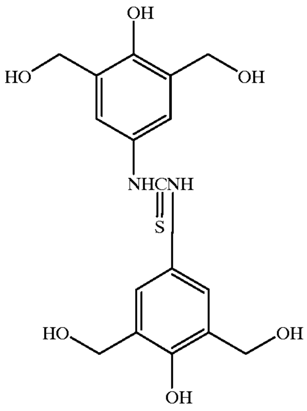
(S-66)
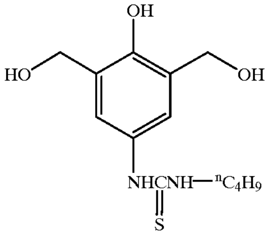
(S-67)
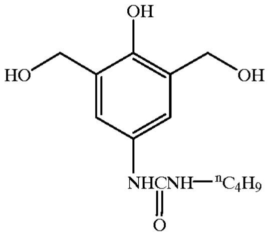
(S-68)
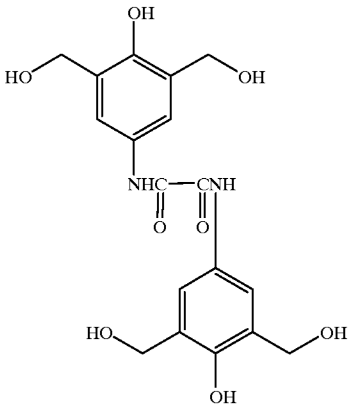
-continued
(S-69)
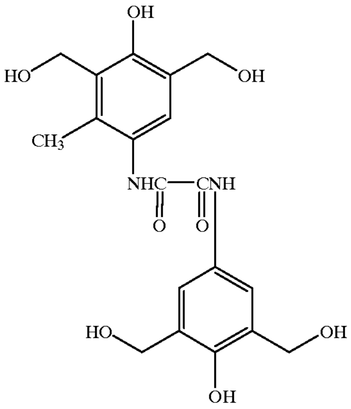
(S-70)
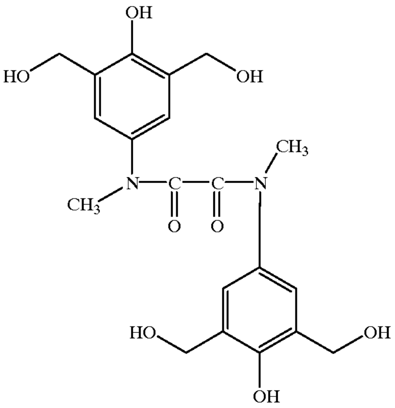
(S-71)
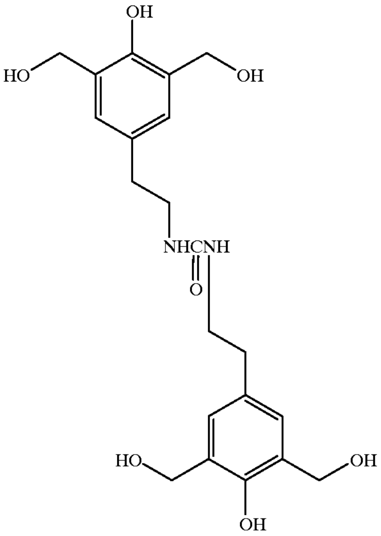

-continued (S-72)

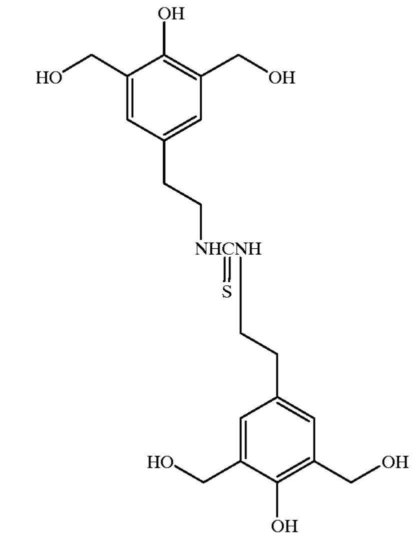

(S-73)

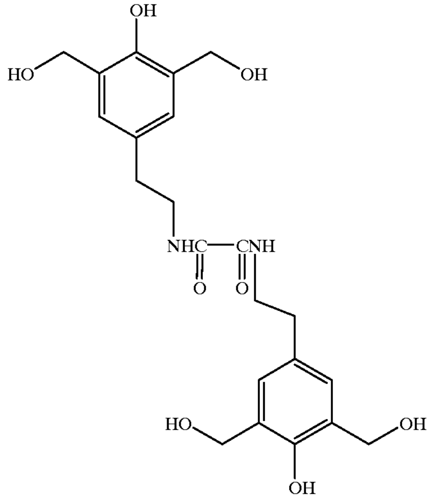

(S-74)

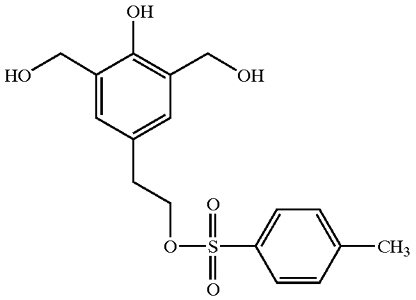

(S-75)

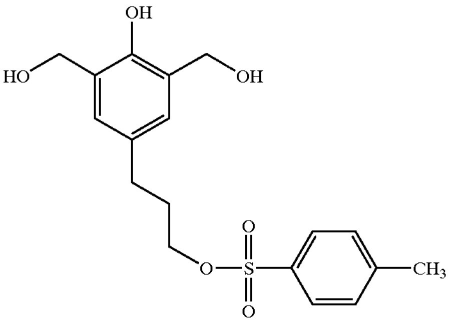

-continued (S-76)

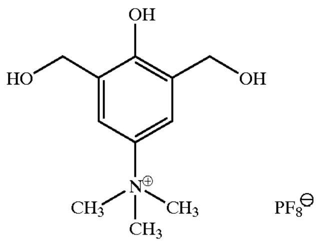

(S-77)

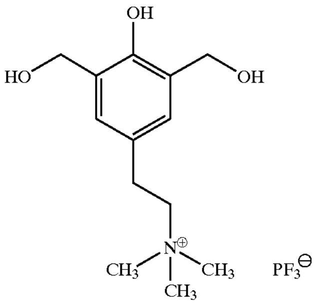

(S-78)

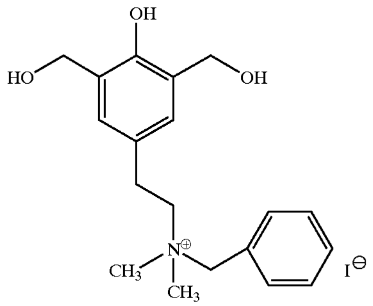

Low molecular weight phenol derivatives having amide or urea structures are preferable among the above compounds from the standpoint of effectiveness.

Low molecular weight phenol derivatives that are useful as cross-linking agents can be synthesized by conventionally known methods. Common synthetic methods are shown below in Schemes I and II.

Scheme I

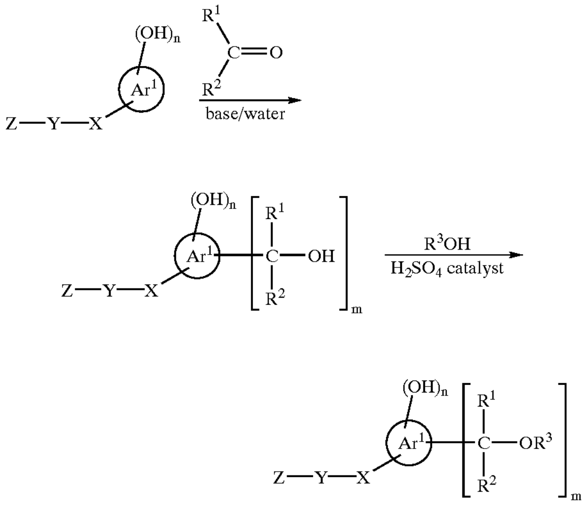

Scheme II

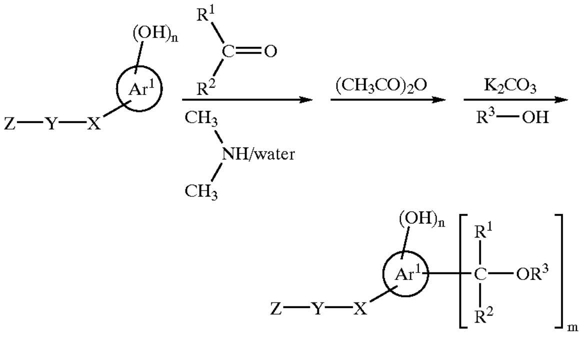

In the formulae, "base" represents a strong alkali, such as KOH, NaOH, or $Me_4N^-OH$.

The compound in the general formula (I) can be synthesized from corresponding phenol derivatives to a hydroxyalkyl compound or an alkoxy compound by a carbonyl compound.

These low molecular weight phenol derivatives may be used singly, or in combination of two or more. Impurities such as dimers or trimers may be formed as side products by condensation of phenol compounds when synthesizing the phenol derivatives, these impurities may be contained in the product. However, it is preferable that the content of the impurities is 30% or less, preferably 20% or less.

The polynuclear phenolic cross-linking agent represented by the general formula (II) will be described hereinafter. As is evident from the structural formula, the polynuclear phenolic cross-linking agent represented by the general formula (II) has in the molecule thereof three or more phenol rings having two or three hydroxymethyl groups on the rings.

A in the general formula (II) is an r-valent hydrocarbon linking group with a carbon number of 1 to 20, wherein hydrogen atoms are removed from the skeleton composed of straight-chain, branched or ring alkyl or aryl groups so that the resultant group has a r-valency.

Preferable examples of the linking group A include the groups represented by the following structures.

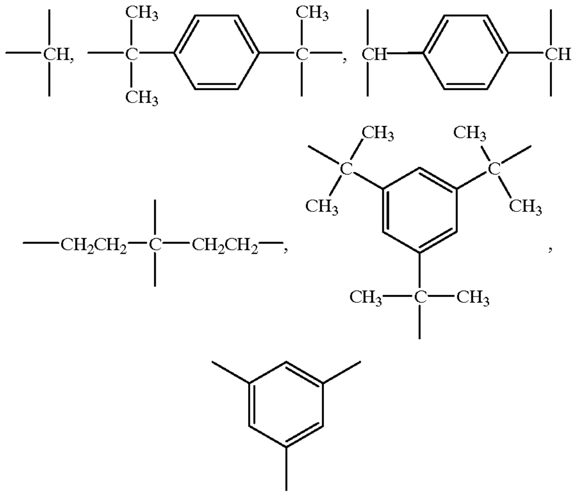

Preferable examples of the polynuclear phenolic cross-linking agent having the linking group A in the molecule and represented by the general formula (II) include those represented by the formulae (II-1) to (II-6) below, but the agent is not restricted thereto.

II-1

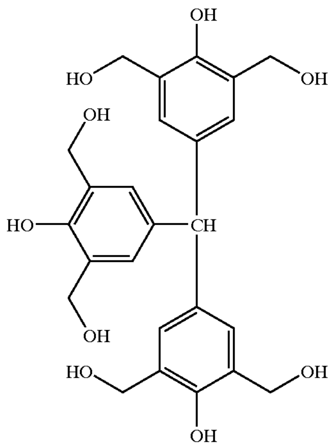

II-2

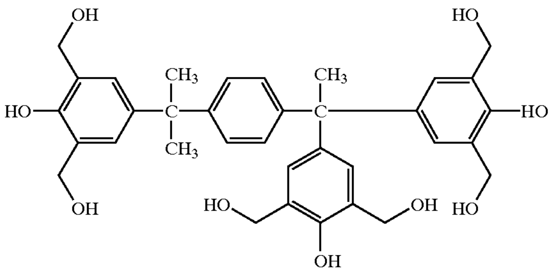

II-3

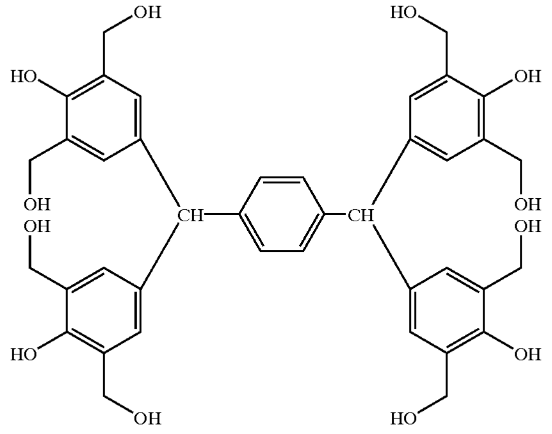

II-4

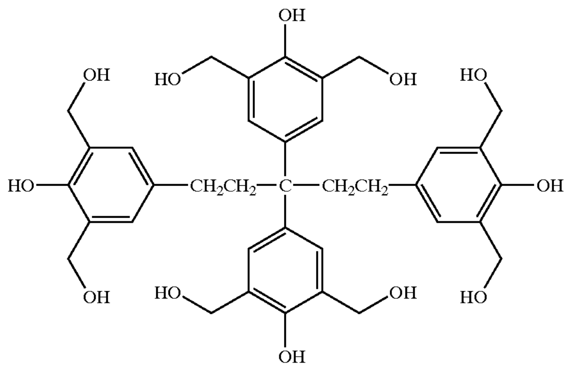

-continued

II-5

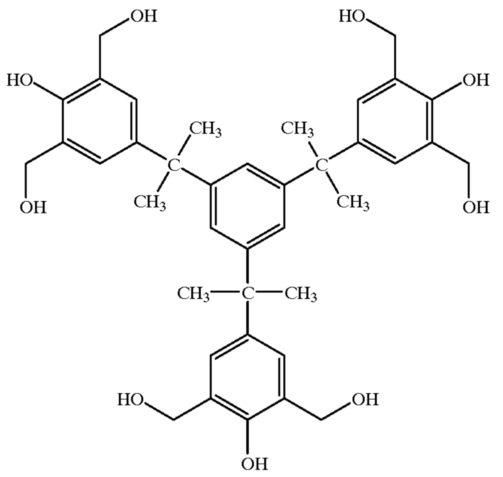

11-6

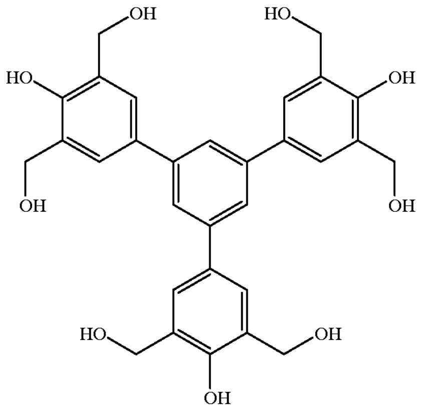

These compounds are obtained by the same process as in the scheme previously described in the low molecular weight phenol derivatives, by corresponding polynuclear phenols methylolated. The compounds may even be used if by-products such as oligomers produced at the time of the reaction for converting into methylol compounds. However, even in this case, amount of the by-products is preferably 10% by weight or less.

Although the Resol resin usable in the present invention is not particularly restricted, the compounds disclosed as Resol resins in BP 2,082,339 are preferable. Favorable examples among them include the compounds with a weight average molecular weight of 500 to 100,000, and number average molecular weight of 200 to 50,000. When the molecular weight is too small, cross-linkability and tolerance to repeated printings become low. When the molecular weight is too large, there is the risk that storage stability will deteriorate due to instability. Therefore, neither a molecular weight that is too small nor a molecular weight that is too large is preferable.

A mixture of (1) a low molecular weight phenol derivative and polynuclear phenolic cross-linking agent, (2) a low molecular weight phenol derivative and Resol resin, or (3) a low molecular weight phenol derivative, polynuclear phenolic cross-linking agent and Resol resin may be used as the cross-link component of the present invention.

Examples of other cross-linking agents favorably used in the present invention include compounds having in the molecule two or more groups of hydroxymethyl, alkoxymethyl, epoxy, aldehyde, ketone, or vinylether groups. Preferable examples include compounds in which, these cross-linking functional groups are directly bonded to the aromatic group. Specific examples include methylol melamine, epoxylated Novolac resin and urea resin. In addition, the compounds described in *Kakyôzai Handobukku* ("Cross-Linking Agents Handbook", Shinzô Yamashita and Tosuke Kaneko, published by Taiseisha) are also preferable. Particularly, phenol derivatives having two or more hydroxymethy or alkoxymethyl groups in the molecule are preferable since the strength of images portions when an image has been formed is excellent.

However, these cross-linking agents are unstable in heat, and storage stability after the acid cross-linking layer has been prepared is not so good. In contrast, phenol derivatives that have two or more hydroxymethyl or alkoxymethyl groups bonded to the benzene ring in the molecule, that contain three to five benzene nuclei, and that have a molecular weight of 1,200 or less, have good storage stability and are therefore most preferably used in the present invention. The alkoxymethyl group preferably has a carbon number of 6 or less. Specific examples include methoxyethyl, ethoxymethyl, n-propoxymethyl, isopropoxymethyl, n-butoxymethyl, isobutoxymethyl, sec-butoxymethyl and t-butoxymethyl groups. Alkoxymethyl groups substituted with alkoxy groups such as 2-methoxyethoxymethyl and 2-methoxy-l-propoxymethyl groups are also preferable.

Specifically, the compounds disclosed in Japanese Patent Application Laid-Open (JP-A) Nos. 6-282067 and 7-64285, and in EP 632003A1 may be cited.

These cross-linking agents may be used singly, or in combination of two or more.

In the present invention, the cross-linking agent may be used at an added amount of 5 wt. % to 70 wt. %, and preferably 10 wt. % to 65 wt. %, with respect to the total cross-linking layer solid component. When the added amount of the cross-linking agent is less than 5 wt. %, the film strength of image portions after an image has been recorded deteriorates. An amount exceeding 70 wt. % is not preferable from the standpoint of stability at the time of storage.

Examples of the binder polymers usable in the acid cross-linking layer of the present invention include polymers having at side chains or main chains thereof aromatic hydrocarbon rings to which a hydroxyl group or an alkoxy groups is directly attached. An alkoxy group having a carbon number of 20 or less is preferable from the standpoint of sensitivity. Preferable examples of the aromatic hydrocarbon ring include a benzene ring, a naphthalene ring and an anthracene ring, from the standpoint of availability of raw materials. While these aromatic hydrocarbon rings may have substituents other than a hydroxyl or alkoxy group (e.g., a substituent such as a halogen group or a cyano group), it is preferable that the aromatic hydrocarbon ring does not have substituents other than the hydroxyl and alkoxy groups from the standpoint of sensitivity.

Binder polymers that can be favorably used in the present invention are polymers having structural units represented by the following general formula (III), or phenol resins such as Novolac resin.

General Formula (III)

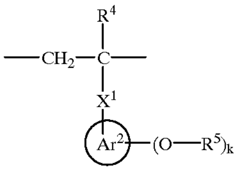

In the formula, $Ar^2$ denotes a benzene, naphthalene or anthracene ring. $R^4$ denotes a hydrogen atom or methyl group. $R^5$ denotes a hydrogen atom or an alkoxy group having a carbon number of 20 or less. $X^1$ denotes a bivalent linking group that has single bonds or one or more types of atoms selected from C, H, N, O, and S, and that has a carbon number of 0 to 20. The letter k denotes an integer of 1 to 4.

While examples of structural units ([BP-1 to [BP-6]) represented by the general formula (III) favorably used in the present invention are listed below, the present invention is not restricted thereto.

[BP-1]

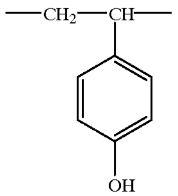

[BP-2]

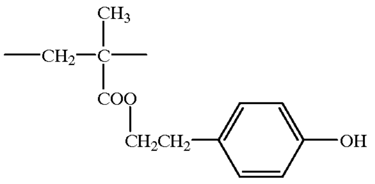

[BP-3]

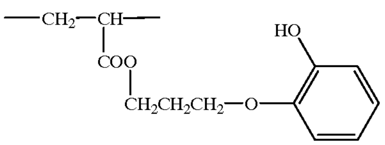

[BP-4]

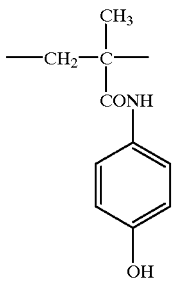

-continued

[BP-5]

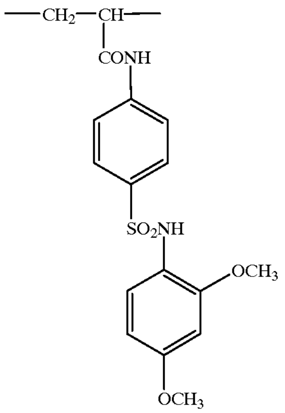

[BP-6]

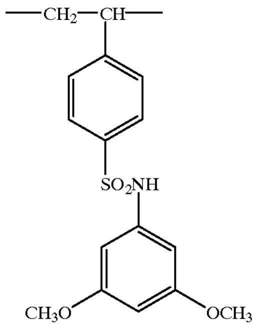

Polymers having these structural units can be obtained by radical polymerization in accordance with conventionally known methods using corresponding monomers.

While a homopolymer composed only of the structural unit represented by the general formula (III) may be used as the binder polymer, a copolymer having structural units derived from other known monomers may also be used in addition to this specific structural unit.

The ratio of the structural unit represented by the general formula (III) and included in the copolymer is preferably 50 to 100% by weight, more preferably 60 to 100% by weight.

The weight average molecular weight of the polymer used in the present invention is preferably 5,000 or more, more preferably in the range of 10,000 to 300,000, and the number average molecular weight is preferably 1,000 or more, more preferably in the range of 2,000 to 250,000. The degree of polydispersity (weight average molecular weight/number average molecular weight) is preferably 1 or greater, more preferably in the range of 1.1 to 10.

While these polymers may be either a random polymer, block polymer or graft polymer, a random polymer is preferable.

Novolac resins will be described hereinafter. Examples of novolac resins favorably used in the present invention include a phenol novolac resin, various cresol novolac resins of o-, m- and p-cresol and their copolymers, and novolac resins utilizing phenols substituted with halogen atoms or alkyl groups.

The weight average molecular weight of these novolac resins is preferably 1,000 or more, more preferably in the range of 2,000 to 20,000, and the number average molecular weight is preferably 1,000 or more, more preferably in the range of 2,000 to 15,000. The degree of polydispersity is 1 or more, more preferably in the range of 1.1 to 10.

It is also a preferable embodiment to use as the binder polymer a polymer having heterocyclic group that has unsaturated bonds in the ring.

The heterocyclic ring used herein refers to a ring having one or more hetero-atoms other than carbon in the atoms structuring the ring. Nitrogen atoms, oxygen atoms, sulfur atoms, and silicon atoms are preferable as the hetero-atoms that may be used. It is thought that, by using a polymer having such a heterocyclic group, it becomes chemical-structurally easy to react due to the function of lone pairs present in the heterocyclic ring, whereby a film having excellent tolerance to repeated printings is formed.

The heterocyclic ring having unsaturated bonds in the ring that is favorably used in the present invention (simply referred as "heterocyclic ring" hereinafter) refers to a five member ring comprising two conjugated double bonds, a six member ring having three conjugated double bonds, or a heterocyclic ring formed by condensation of these heterocyclic rings. Since these heterocyclic rings are aromatic, they are called aromatic heterocyclic rings. Particularly, more preferable heterocyclic rings are those in which aromatic hydrocarbon rings such as a benzene ring and a naphthalene ring are condensed to the heterocyclic rings described above.

Examples of heterocyclic rings favorably used in the present invention include monocyclic heterocyclic rings such as pyrrole, furan, thiophene, oxazole, iso-oxazole, thiazole, iso-thiazole, imidazole, pyrazole, furazane, oxadiazole, pyridine, piridazine, pyrimidine, pyrazine, triazine and silabenzene, and condensed heterocyclic rings such as indole, iso-indole, benzofuran, benzothiophene, indorizine, quinoline, iso-quinoline, purine, indazole, benzoimidazole, benzothiazole, benzooxazole, quinazoline, sinnoline, quinosaline, phthaladine, puteridine, carbazole, acridine, phenathoridine, xanthene, phenazine and phenochiazine. These heterocyclic rings may have substituents. Examples of referable substituents include hydrocarbon groups with a carbon number of 20 or less, alkoxy groups with a carbon number of 20 or less, aryloxy groups with a carbon number of 20 or less and halogen atoms.

Although the heterocyclic group may be introduced in the polymer having this heterocyclic group as a component structuring the main chain of the polymer, it is preferable that the heterocyclic group is bonded to the side chain of the polymer in a pendant configuration for the reason of enhancing the film strength of the image. While the heterocyclic group may be directly connected to the main chain of the polymer for this purpose, it is still preferable that the heterocyclic group is bonded in a pendant configuration to the main chain via appropriate linking chains from the standpoint of enhancing the film strength of the image portions. Preferable examples of linking chains include ester bonds, amide bonds of carboxylic acid, amide bonds of sulfonic acid, ether bonds, thiother bonds, and organic groups having a carbon number of 20 or less that may have these bonds. While examples of polymer main chains include a vinyl polymer as a side chain of poly(meth) acrylate, polystyrene and polyvinyl actal, polyester and polyurethane, a polyvinyl polymer is preferable in terms of availability and economical efficiency.

The binder polymers used in the present invention and described above may be used singly, or in combination of two or more. These polymers are added at a ratio of 20 to 95% by weight, preferably 40 to 90% by weight, relative to the total solid component of the acid cross-linking layer. When the added amount is less than 20 wt. %, the strength of image portions is insufficient when an image has been formed. When the added amount exceeds 95 wt. %, an image is not formed.

It is preferable that the acid cross-linking layer also has an infrared absorber from the standpoint of improving sensitivity. Infrared absorbers similar to those previously described with regard to the radical polymerization layer may be used as the infrared absorber usable in the acid cross-linking layer.

A preferable amount of the infrared absorber is 0.01 to 50% by weight, more preferably 0.1 to 10% by weight, relative to the total solid component of the acid cross-linking layer. The amount in the recording layer is preferably 0.5 to 10% by weight when a dye is used for the infrared absorber, and preferably 1.0 to 10% by weight when a pigment is used for the infrared absorber. When the added amount of the dye or pigment is less than 0.01% by weight, the sensitization effect becomes insufficient. When the amount exceeds 50% by weight, there is the tendency for contamination to be easily generates at non-image portions at the time of printing.

Various additives such as a surface active agent may be used together in forming the acid cross-linking layer to improve coating performance and film quality.

Respective components are usually dissolved in a solvent and coated on an appropriate support in the acid cross-linking layer according to the present invention. The concentration of the components(the total solid component inclusive of the additives) in the solvent is preferably 1 to 50% by weight. Although the amount (solid component) to be coated on the support differs in accordance with purpose, with regard to plate material for planographic printing, an amount of 0.01 $g/m^2$ to 5.0 $g/m^2$ is generally preferable as the acid cross-linking layer.

Various methods may be used as the coating method. Examples thereof include bar coater coating, rotation coating, spray coating, curtain coating, dip coating, air-knife coating, blade coating and roll coating. While a parent sensitivity increases as the amount of coating decreases, film characteristics of the recording layer become poor.

Examples of negative-type recording layers include an interaction releasing type (heat sensitive negative-type), an acid catalyzed decomposition type and a polar conversion type. These layers will be sequentially described hereinafter.

Interaction Release Type (Heat Sensitive Negative-Type) Layer

The interaction release type layer is structured a water-insoluble, alkaline water-soluble polymer and an infrared absorber, described hereinafter.

The polymer compound that can be used for the negative-type recording layer has a homopolymer having acidic groups at the main chain and/or side chain of the polymer, a copolymer or a mixture of them.

The polymer compounds having the acidic groups described in (1) to (6) below at the main chain and/or side chain of the polymers are preferable from the standpoint of solubility in the alkaline developer and manifesting a solubility suppressing effect.

(1) phenol group (—Ar—OH)

(2) sulfonamide group (—$SO_2$NH—R)

(3) substituted sulfonamide based acidic group (referred as active imide hereinafter: —$SO_2NHCOR$, —$SO_2NHSO_2R$, —$CONHSO_2R$)

(4) carboxylic acid group (—$CO_2H$)

(5) sulfonic acid group (—$SO_3H$)

(6) phosphoric acid group (—$OPO_3H_2$)

In (1) to (6) above, Ar denotes an aryl linking group that may have substituents, and R denotes a hydrocarbon group that may have substituents.

The aqueous alkaline soluble polymers having (1) a phenol group, (2) a sulfonamide group, and (3) an active imide group are preferable among the alkaline water-soluble polymers having the acidic groups selected from (1) to (6). The alkaline water-soluble polymers having (1) a phenol group and (2) a sulfonamide group are most preferable in view of solubility in the alkaline developer, development latitude and ensuring sufficient film strength.

Examples of the alkaline water-soluble polymers having the acidic groups selected from (1) to (6) include the following ones.

(1) Examples of the alkaline water-soluble polymers having the phenol group include novolac resins such as condensation polymerization products of phenol and formaldehyde, m-cresol and formaldehyde, p-cresol and formaldehyde, m-/p-mixed cresol and formaldehyde, and phenol, cresol (either m-, p- or a mixture of m-/p-) and formaldehyde; and a condensation polymerization product of pyrogallol and acetone. Example also include copolymers in which compounds having phenol groups on side chains thereof have been copolymerized.

Examples of compounds having the phenol group include acrylamide, methacrylamide, acrylic acid esters, methacrylic acid esters and hydroxystyrene.

The alkaline water-soluble polymer preferably has a weight average molecular weight of $5.0\times10^2$ to $2.0\times10^4$ and a number average molecular weight of $2.0\times10^2$ to $1.0\times10^4$, from the standpoint of image formability. These polymers can be used singly, or in combination of two or more. When used in combination, a condensation polymer of formaldehyde and phenol having an alkyl group with a carbon number of 3 to 8, such as the condensation polymer of t-butylphenol and formaldehyde and the condensation polymer of octylphenol and formaldehyde disclosed in U.S. Pat. No. 4,123,279, may be used together.

(2) Examples of the alkaline water-soluble polymers that have a sulfonamide group include polymers in which the smallest structural unit from a compound having a sulfonamide group is taken as the main structural component to structure the polymer. Examples of such compounds include a compound having in the molecule thereof one or more of each of a sulfonamide group, in which at least one hydrogen atom is bonded to a nitrogen atom, and a polymerizable, unsaturated group. Examples of preferable compound among them include a low molecular weight compounds having in the molecule thereof an acryloyl group, an allyl group or a vinyloxy group, and a substituted or monosubstituted aminosulfonyl group or substituted sulfonylimino group. Examples include the compounds represented by the general formulae 1 to 5 below:

General Formula 1

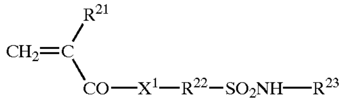

General Formula 2

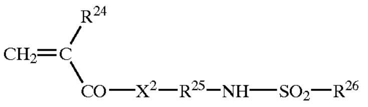

-continued

General Formula 3

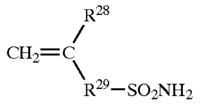

General Formula 4

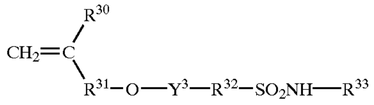

General Formula 5

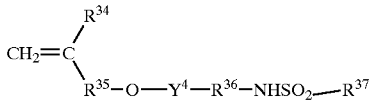

In the formula, $X^1$ and $X^2$ independently denote —O— or —$NR^{27}$—. $R^{21}$ and $R^{24}$ independently denotes a hydrogen atom or —$CH_3$. $R^{22}$, $r^{25}$, $R^{29}$, $R^{32}$ and $R^{36}$ independently represent an alkylene group a cycloalkylene group, arylene group or alalkyl group with a carbon number of 1 to 12 which may have substituents. $R^{23}$, $R^{37}$ and $R^{33}$independently represent an alkyl group, cycloalkyl group, aryl group or alalkyl group with a carbon number of 1 to 12 which may have substituents. $R^{26}$ and $R^{37}$ independently represent an alkyl group, cycloalkyl group, aryl group and alalkyl group with a carbon number of 1 to 12 which may have substituents. $R^{28}$, $R^{30}$ and $R^{34}$ independently represent a hydrogen atom or —$CH_3$. $R^3$ and $R^{35}$ independently represent an alkylene group, cycloalkylene group, arylene group or alalkylene group with a carbon number of 1 to 12 which may have substituents. $Y^3$ and $Y^4$ independently represent a single bond, or —CO—.

Among the compounds represented by the general formulae 1 to 5, m-aminosulfonyl methacrylate, N-(p-aminosulfonylphenyl)methacrylamide, and N-(p-aminosulfonylphenyl)acrylamide may be favorably used in the negative-type planographic printing material.

(3) Examples of the alkaline water-soluble polymers that have an active imide group include polymers in which the smallest structural unit from a compound having an active imide group is taken as the main structural component to structure the polymer. Examples of such compounds include a compound having in the molecule thereof one or more of each of an active imide group represented by the formula below and a polymerizable, unsaturated group.

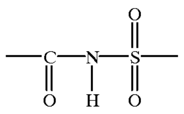

Specifically, N-(p-toluenesulfonyl)methacrylamine and N-(p-toluenesulfonyl)acrylamine can be favorably used.

(4) Examples of the alkaline water-soluble polymers that have a carboxylic acid group include polymers in which the smallest structural unit from a compound, which has in the molecule thereof one or more of each of a carboxylic acid group and a polymerizable unsaturated group, is taken as the main structural component to structure the polymer.

(5) Examples of the alkaline water-soluble polymers that have a sulfonic acid group include polymers in which the smallest structural unit from a compound, which has in the molecule thereof one or more of each of a sulfonic acid group and a polymerizable unsaturated group, is taken as the main structural component to structure the polymer.

(6) Examples of the alkaline water-soluble polymers that have a phosphoric acid group include polymers in which the smallest structural unit from a compound, which has in the molecule thereof one or more of each of a phosphoric acid group and a polymerizable unsaturated group, is taken as the main structural component to structure the polymer.

It is not necessary that the smallest structural units structuring the alkaline water-soluble polymer used in the positive-type recording layer and having an acid group selected from those represented by (1) through (6) be only of one kind. Polymers in which two or more types of the smallest structural units having similar acid groups have been copolymerized, or polymers in which two or more types of the smallest structural units having different acid groups have been copolymerized may also be used.

Conventionally known methods of copolymerization, such as a graft copolymerization method, a block copolymerization method and a random copolymerization method, may be used.

It is preferable that 10 mole % or more, more preferably 20 mole % or more, of the compounds having the acid groups selected from those in (1) to (6) to be copolymerized is incorporated in the copolymer. When the amount is less than 10 mole %, development latitude, there is a tendency to be unable to sufficiently improve.

The infrared absorbers that can be used when the planographic printing plate has a negative- type recording layer will next be described.

When an infrared absorber is used in the positive-type recording layer, an infrared absorber having an onium salt structure is preferable because it is necessary to induce a positive action (in which development is suppressed at unexposed portions and released at exposed portions to accelerate development) by an interaction with a binder polymer having a specific functional group. Specifically, a cyanine pigment and pyrylium salts are preferable among the infrared absorbers that can be used for the negative-type recording layer. Details regarding the cyanine pigment and pyrylium salts are as described previously.

The anionic infrared absorbers disclosed in Japanese Patent Application No. 10-237634 may also be favorably used. These anionic infrared absorbers have not a cationic structure but an anionic structure in the mother nucleus of the pigment that substantially absorbs infrared light.

Examples include (a-1) anionic metal complexes, (a-2) anionic carbon black and (a-3) anionic phthalocyanine.

The anionic metal complex (a-1) refers to an overall central metals and ligands of a complex that substantially absorbs light, which complex forms an anion.

Examples of the anionic carbon black (a-2) include carbon black to which an anion group such as sulfonic acid, carboxylic acid or phosphonic acid groups is bonded as a substituent. As described in *Kâbon Burakku Binran Dal San Han* ("Carbon Black Handbook, Third Edition", edited and published by the Carbon Black Association, Apr. 5, 1995), p. 12, a means of introducing these anion groups into the carbon black, such as oxidizing the carbon black with a predetermined acid, may be adopted.

The anionic phthalocyanine (a-3) refers to a compound in which an anion group listed above as a substituent in the explanation of (a-2) is bonded to a phthalocyanine skeleton to from an overall anion.

Other examples include the anionic infrared absorbers represented by $[Ga^{-}—M—Gb]_m X^{m+}$ and disclosed in paragraphs [0014] to [0105] of Japanese Patent Application No. 10-237634 ($Ga^{-}$ denotes an anionic substituent, and GB denotes a neutral substituent, $X^{m+}$ denotes a cation of 1 to m valency protons, and m is an integer of 1 to 6)

Acid Catalyzed Decomposition

A chemical amplification layer is preferably formed at the exposure surface of the uppermost layer of the recording layer. The chemical amplification layer must have as components thereof a compound that generates an acid by the action of light or heat (i.e., an acid generator), and a compound whose chemical bonds are split by the acid generated as a catalyst and whose solubility in the alkali developing solution is thereby increased (an acid degradable compound).

The chemical amplification layer may also have a polymer compound that is a binder component for forming the layer. The acid degradable compound itself may be a polymer compound or a precursor that performs the function of the binder component.

Acid Degradable Compound

The compound whose solubility in the alkaline developer is raised by the dissociation of chemical bonds with an acid as a catalyst may also be called a compound having linking groups that may be decomposed in the molecule by an acid. The compound disclosed in Japanese Patent Application Laid-Open (JP-A) No. 9-171254 as "a compound having at least one bond decomposed by an acid" may be used for the purpose above. A preferable example of the chemical bond degradable by an acid is a $—(CH_2CH_2O)_n—$ group (n represents an integer of 2 to 5).

Among these compounds, the compound represented by the general formula (1) below is preferably used from the standpoint of sensitivity and developability.

(1)

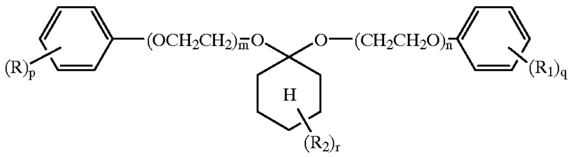

In the formula, R, $R^1$ and $R^2$ each represent a hydrogen atom, an alkyl group with a carbon number of 1 to 5, an alkoxy group with a carbon number of 1 to 5, a sulfo group a carboxyl group or a hydroxyl group, p, q and r each denote an integer of 1 to 3, and m and n each represent an integer of 1 to 5.

In the general formula (1), the alkyl group represented by R, $R^1$ and $R^2$ may be straight-chain or branched, and examples thereof include methyl, ethyl, propyl, isopropyl, butyl, t-butyl and pentyl groups. Examples of the alkoxy group include methoxy, ethoxy, propoxy, isopropoxy, butoxy, t-butoxy and pentoxy groups. The sulfo and carboxyl groups have salts of these groups. Compounds in which m and n are 1 or 2 are particularly preferable among the compounds represented by the general formula (1).

Examples of acid degradable compounds applicable to the present invention include the compounds having C—O—C bonds that are disclosed in Japanese Patent Application Laid-Open (JP-A) Nos. 48-89603, 51-120714, 53-133429, 55-12995, 55-126236 and 56-17345, the compounds having Si—O—C bonds that are disclosed in Japanese Patent Application Laid-Open (JP-A) Nos. 60-37549 and 60-121446, and other acid degradable compounds disclosed in Japanese Patent Application Laid-Open (JP-A) Nos. 60-3625 and 60-10247. The compounds having Si—N bonds disclosed in Japanese Patent Application Laid-Open (JP-A) No.62-222246, the carbonate esters disclosed in Japanese Patent Application Laid-Open (JP-A) No. 62-251743, ortho-carbonate esters described in Japanese Patent Application Laid-Open (JP-A) No. 62-209451, the ortho-titanic acid esters disclosed in Japanese Patent Application Laid-Open (JP-A) No. 62-280841, the ortho-silisic acid esters disclosed in Japanese Patent Application Laid-Open (JP-A) No. 62-280842, the acetal, ketal and ortho-carboxylic acid esters disclosed in Japanese Patent Application Laid-Open (JP-A) Nos. 63-010153, 9-171254, 10-55067, 10-111564, 10-87733, 10-153853, 10-228102, 10-268507, 10-282648, 10-282670 and EP 0884547A1, and the compounds having C—S bonds that are disclosed in Japanese Patent Application Laid-Open (JP-A) No. 62-244038 may also be used.

The compounds having C—O—C and Si—O—C bonds, and the ortho-carbonate esters, acetals, ketals and silyl ethers disclosed in Japanese Patent Application Laid-Open (JP-A) Nos. 53-133429, 56-17345, 60-121446, 60-37549, 62-209451, 63-010153, 9-171254, 10-55067, 10-111564, 10-87733, 10-153853, 10-228102, 10-268507, 10-282648 and 10-282670, and in EP 0884647A1 are particularly preferable among the acid degradable compounds described above.

Among the foregoing acid degradable compounds, polymer compounds that have on the main chain thereof repeated acetal or ketal portions, and whose solubility in the alkali developing solution is raised by generated acids, are preferably used.

These compounds may be used singly, or in combination of two or more types. The compounds are added in the layer in a proportion of 5 to 70% by weight, preferably 10 to 50% by weight, and more preferably 15 to 35% by weight, relative to the total solid component of the chemical amplification layer. When the amount is less than 5% by weight, the non-image portions are easily contaminated. When the amount of addition exceeds 70% by weight, film strength of the image portions becomes insufficient.

Heat sensitive, positive-type acid degradable compounds may be used as the infrared absorber, and compounds similar to those used in the acid-catalyzed crosslinking types above may be used as the acid generator.

Polar Conversion Material

By a polar conversion material that changes from being lipophilic to hydrophilic by heat is meant a material that changes from a state in which an affinity, such as swelling or dissolution, with respect to water at room temperature is not shown, to a state in which an affinity toward water is shown. While this change may or may not be accompanied by a chemical reaction, a change accompanied by chemical reaction is preferable since the degree of polar conversion is great. Examples of such a polar conversion reaction include a reaction hydrophilic groups are formed by heat. Examples of hydrophilic substituents include acidic groups such as phosphonic acid, sulfonic acid, carboxylic acid, sulfonamide and phenol, hydroxyl group, amino group and onium salts such as ammonium salts. Reactions in which substituents such as these are generated by the action of heat are preferable. Examples of such polar conversion materials include the carboxylic acid esters disclosed in Japanese Patent Application Laid-Open (JP-A) No. 7-186562, the photochromic compounds disclosed in Japanese Patent Application Laid-Open (JP-A) Nos. 9-240148, 4-44895, 8-3463and8-156401, the inorganic compounds disclosed in Japanese Patent Application Laid-Open (JP-A) No. 51-115101, and the compounds capable of generating sulfonic acid disclosed in Japanese Patent Application Laid-Open (JP-A) No. 10-282672. Protective groups in which the above hydrophilic groups are generated by heat are also favorably used, and examples include those described in *Protective Groups in Organic Synthesis* (by Theodra W. Greene and Peter G. M. Wuts, published by Wiley-Interscience Publication) and *Protective Groups* (by Philip J. Kocienski, published by George Thieme Verlag, Stuttgart). These compound may be polymers or low molecular weight compounds.

A preferable reaction temperature is 80° C. or more and 300° C. or less, particularly from 120° C. to 200° C. Storage stability is decreased when the reaction temperature is low, and sensitivity is decreased when the reaction temperature is high.

Compounds that generate sulfonic acid are preferable among the compounds described above, and examples thereof include sulfonic acid generating polymer compounds.

The sulfonic acid generating polymer compounds are not particularly restricted, provided that they possess functional groups for generating sulfonic acid. While the functional groups for generating sulfonic acid may be provided on either the main chain or on the side chain, the polymer compounds represented by the general formulae (6), (7) or (8) having functional groups on the side chain are preferable since they are suitable for synthesis.

General Formula (6)

$$—L—SO_2—O—R^1$$

General Formula (7)

$$—L—SO_2—SO_2—R^2$$

General Formula (8)

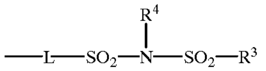

In the formula, L represents an organic group made of polyvalent non-metallic atoms required for linking the functional group to the polymer skeleton, $R^1$ denotes a substituted or non-substituted aryl group, a substituted or non-substituted alkyl group or ring imide, $R^2$ and $R^3$ denote a substituted or non-substituted aryl group, a substituted or non-substituted alkyl group or $—SO_2—R^5$, and $R^5$ denotes a substituted or non-substituted aryl group or a substituted or non-substituted alkyl group.

The polymer compounds having at least one of the functional groups shown by the general formulae (6), (7) or (8) will be described in more detail.

Carbon ring aryl groups and heterocyclic aryl groups are contained in the aryl group, when $R^1$ to $R^5$ represent aryl groups or substituted aryl groups. Phenyl, naphthyl, anthracenyl, pyrenyl groups are used as the carbon ring aryl groups having a carbon number of 6 to 19. A Pyridyl and furyl group, as well as quinolyl groups as a cndensation ring of benzene rings, and a benzofuryl and thioxanton group are used as the heterocyclic aryl groups having a carbon number of 3 to 20 and a hetero-atom number of 1 to 5. When $R^1$ to $R^5$ denote an alkyl group or a substituted alkyl group, a methyl, ethyl, isopropyl, t-butyl and cyclohexyl groups are used for the straight-chain, branched or ring alkyl groups with a carbon number of 1 to 25.

When $R^1$ to $R^5$ denote a substituted aryl, hetero-aryl or alkyl group, examples of the substituents include an alkoxy group with a carbon number of 1 to 10 such as a methoxy or ethoxy group; a halogen atom such as fluorine, chlorine or bromine atom; a halogen substituted alkyl group such as trifluoromethyl or trichlorometyl group; an alkoxycarbonyl or aryloxycarbonyl group with a carbon number of 2 to 15 such as methoxycarbonyl, ethoxyxarbonyl, t-butyloxyxarbonyl and p-chlorophenyloxycarbonyl groups; an acyloxy groups such as hydroxylic, acetyloxy, benzoyloxy and p-diphenylaminobenzoyloxy groups; a carbonate group such as t-butyloxycarbonyloxy group; an ether group such as t-butyloxyxarbonylmethyloxy and 2-pyranyloxy groups; a substituted or non-substituted amino group such as amino, dimethylamino, diphenylamino, morphotino and acetylamino groups; a thioether groups such as methyltio and phenyltio groups; an alkenyl groups such as vinyl and styryl groups; a nitro group; a cyano group; an acyl group such as formyl, acetyl and benzoyl group; an aryl groups such as phenyl and naphthyl groups; and a heteroaryl group such pyridyl group. When $R^1$ to $R^5$ are substituted aryl or non-substituted heteroaryl groups, alkyl groups such as methyl and ethyl groups may be used for the substituent.

When $R^1$ represents a ring imide group, imides with a carbon number of 4 to 20 such as succinimide, phthalimide, cyclohexane diacrboximide and normornene dicarboximide may be used as the ring imide group.

An aryl group substituted with an electron absorbing group such as halogen, cyano or nitro group, an alkyl group substituted with an electron absorbing group such as aryl, halogen, cyano or nitro group, a branched secondary or tertiary alkyl group, and ring alkyl and imide groups are preferable as $R^1$ in the general formula (6). The secondary alkyl group represented by the following general formula (9) is more preferable for satisfying both of sensitivity and time-dependent stability.

General Formula (9)

In the formula, $R^6$ and $R^7$ represent a substituted or non-substituted alkyl group. $R^6$ and $R^7$may form a ring together with secondary carbon atoms (CH) to which $R^6$ and $R^7$ are bonded.

$R^6$ and $R^7$ represent a substituted or non-substituted alkyl or aryl group. $R^6$ and $R^7$ may form a ring together with secondary carbon atoms (CH) to which $R^6$ and $R^7$ are bonded.

When $R^6$ and $R^7$ represent a substituted or non-substituted alkyl group, examples of the alkyl group include straight-chain, branched or ring alkyl groups such as methyl, ethyl, isopropyl, t-butyl and cycrohexyl groups, and those with a carbon number of 1 to 25 are favorably used.

When $R^6$and $R^7$ represent a substituted or non-substituted aryl group, the aryl group contains a carbon ring aryl group and heterocyclic aryl group. Aryl groups with a carbon number of 6 to 19 such as phenyl, naphthyl, actharcenyll and pyrenyl groups may be used as the carbon ring aryl group. The heterocyclic aryl groups with a carbon number of 1 to 5 such as pyridyl and furyl groups, and a quinolyl group with condensed benzene rings, and quinolyl, thioxanton and carbazole groups are used as the heterocyclic aryl groups.

When $R^6$ and $R^7$ are a substituted alkyl or aryl group, examples of the substituents include an alkoxy group with a carbon number of 1 to 10 such as methoxy or ethoxy groups; a halogen atom such as fluorine, chlorine and bromine atoms; a halogen substituted alkyl group such as trifluoromethyl and trichloromethyl groups; an alkoxycarbonyl group or aryloxycarbonyl group with a carbon number of 2 to 15 such as methoxycarbonyl, ethoxyxarbonyl, t-butyloxyxarbonyl and p-chlorophenyloxycarbonyl groups; hydroxyl group; an acyloxy group such as acetyloxy, benzoyloxy and p-diphenylaminobenzoyloxy groups; a carbonate group such as t-butyloxycarbonyloxy group; an ether group such as t-butyloxycarbonylmethyloxy and 2-pyranyloxy groups; a substituted or non-substituted amino group such as amino, dimethylamino, diphenylamino, morpholino amd acetylamino groups; a thioether group such as methylthio and phenylthio groups; an alkenyl group such as vinyl and styryl groups; nitro group; cyano group; an acyl group such as formyl, acetyl and benzoyl groups; an aryl group such as phenyl and naphthyl gtoups; and a heteroaryl group such as pyridyl group.

When $R^6$ and $R^7$ are substituted aryl groups, methyl and ethyl groups may be used as the substituents in addition to those described above.

A substituted or non-substituted alkoxyl group is preferable as $R^6$ and $R^7$, in that storage stability of sensitive materials is excellent. A secondary alkyl group substituted with an electron absorbing group such as alkoxy, carbonyl, alkoxycarbonyl, cyano or halogen group, or a secondary alkyl group such as cyclohexyl or norbonyl group is particularly preferable in view of stability through time. A compound in which a chemical shift of the secondary methine hydrogen in proton NMR within chloroform-d appears in a magnetic field lower than 4.4. ppm is preferable. A compound in which the chemical shift appears in a magnetic field lower than 4.6 ppm is more preferable.

A secondary alkyl group substituted with an electron absorbing group is particularly preferable, because the carbo-cations considered to be formed as an intermediate product during the heat degradation reacton are made unstable by the electron absorbing group, thereby suppressing degradation.

The particularly preferable structures of the —$CHR^6R^7$ group are shown below.

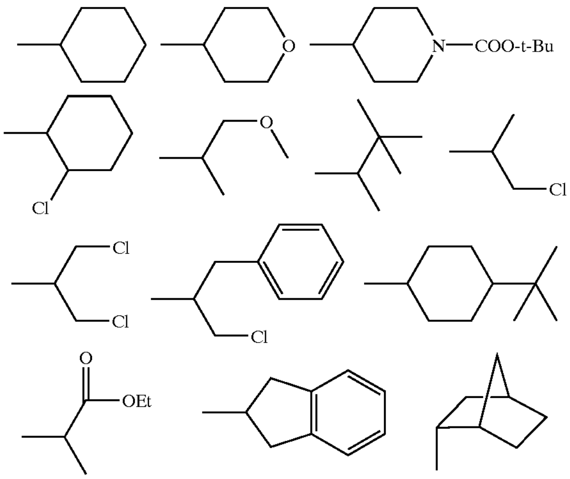

Particularly preferable as $R^2$ to $R^5$ in the general formulae (7) and (8) are an aryl group substituted with an electron absorbing group such as halogen, cyano and nitro groups, an alkyl group substituted with an electron absorbing group such as halogen, cyano and nitro groups, and a secondary or tertiary branched alkyl group.

The polyvalent linking group made of non-metallic atoms represented by L is composed of 1 to 60 carbon atoms, zero to 10 nitrogen atoms, zero to 50 oxygen atoms, 1 to 100 hydrogen atoms and zero to 20 sulfur atoms. More specifically, the linking group is composed of a combination of the structural units described below.

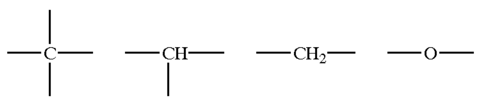

-continued

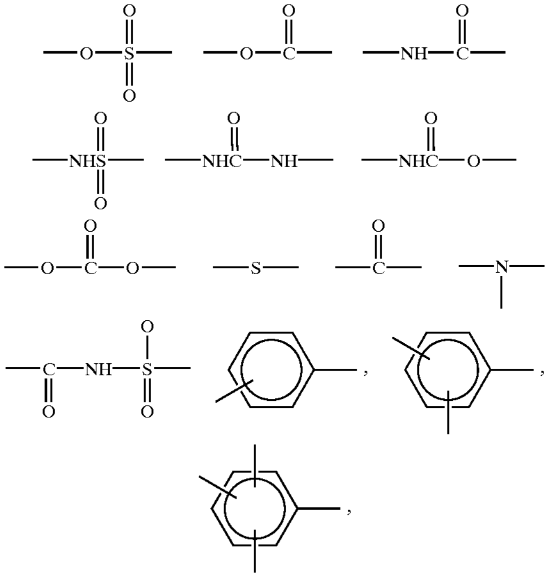

polyvalent nathththalene and antthracene

When the polyvalent linking group has substituents, an alkyl group with a carbon number of 1 to 20 such as methyl and ethyl groups; an aryl group with a carbon number of 6 to 16 such as phenyl and naphthyl groups; a hydroxyde group; an alkoxy group with a carbon number of 1 to 6 such as carboxyl, N-sulfonamide and acetoxy groups; an alkoxy group with a carbon number of 1 to 6 such as methoxy and ethoxy groups; a halogen atom such as chlorine and bromine atoms; an alkoxycarbonyl group with a carbon number of 2 to 7 such as methoxyxarbonyl, ethoxycarbonyl and cyclohexloxycarbonyl groups; a cycano groupl and a carbonate ester such as t-butyl carbinate may be used as the substituents.

Examples of monomers favorably used for synthesizing the polymer compounds having on side chains the functional groups shown in the general formulae (6) to (8) are listed below.

(1)

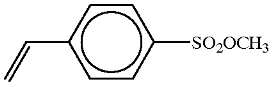

(2)

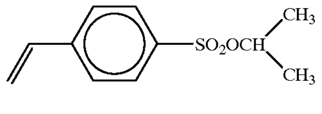

(3)

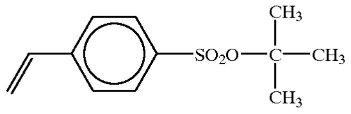

(4)

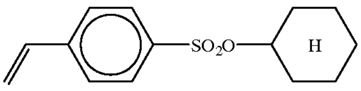

-continued (5)

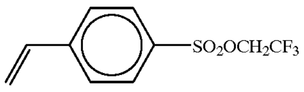

(6)

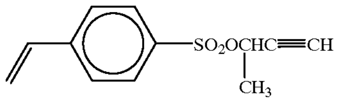

(7)

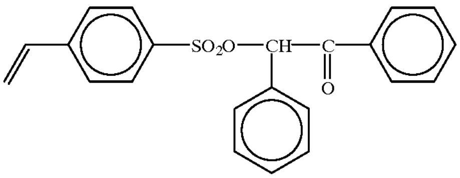

(8)

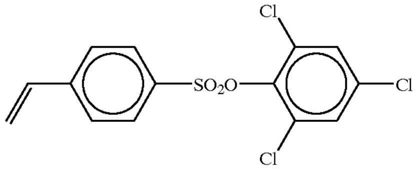

(9)

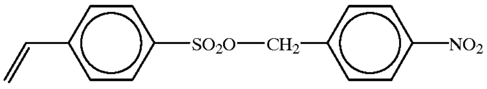

(10)

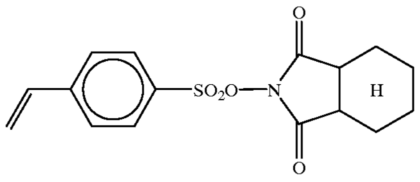

(11)

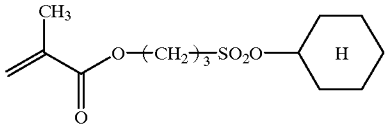

(12)

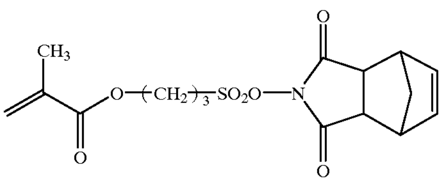

(13)

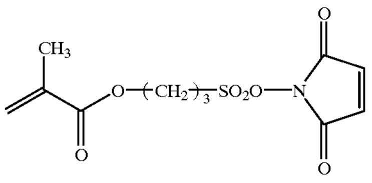

-continued
(14)
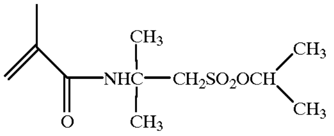
(15)
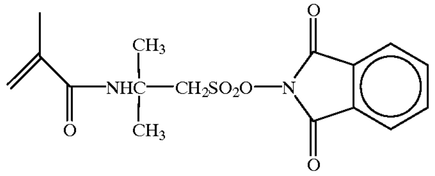
(16)
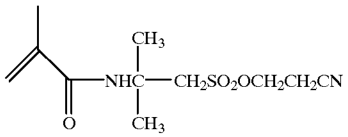
(17)
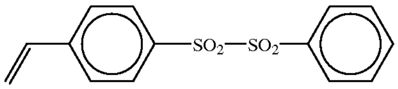
(18)
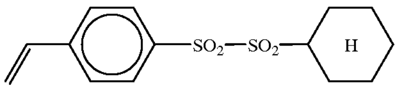
(19)
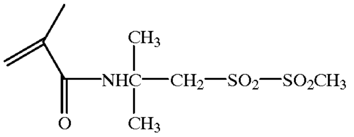
(20)
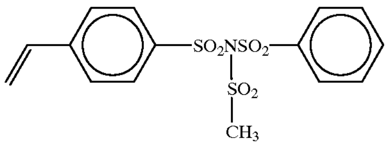
(21)
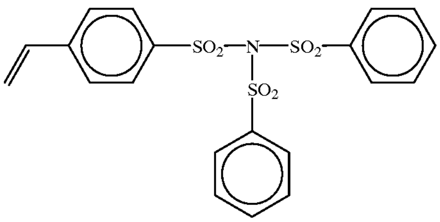
-continued
(22)
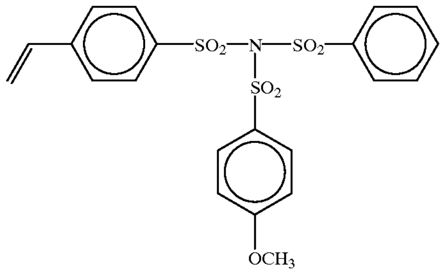
(23)
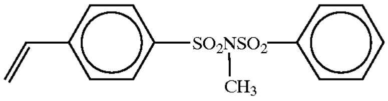
(24)
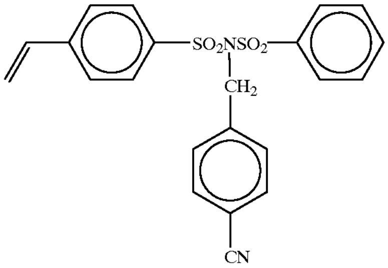
(25)
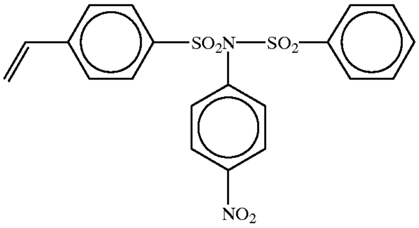
(26)
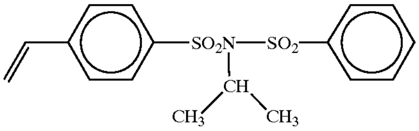
(27)
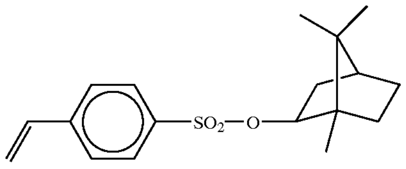
(28)
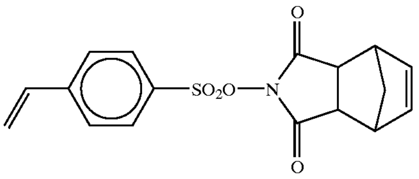
(29)
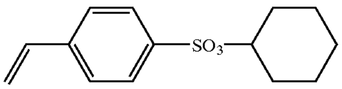

-continued (30)

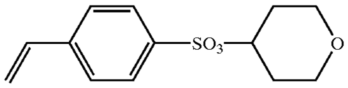

(31)

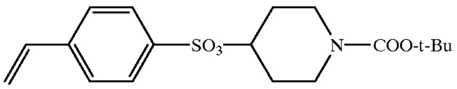

(32)

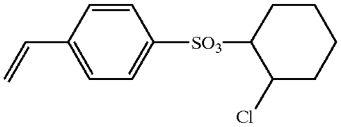

(33)

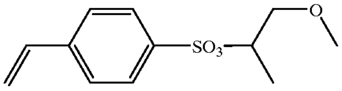

(34)

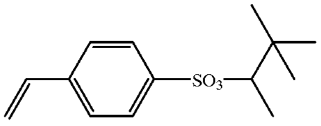

(35)

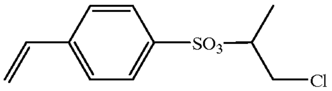

(36)

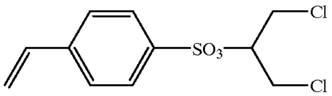

(37)

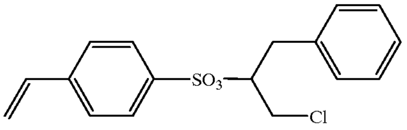

(38)

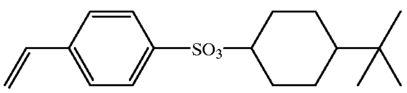

(39)

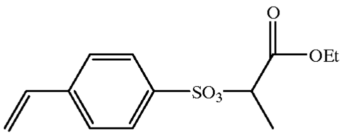

(40)

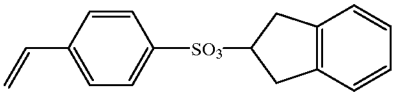

-continued (41)

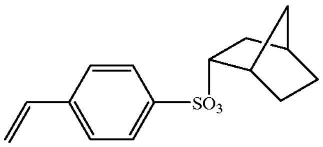

Preferably, polymer compounds obtained by radical polymerization of any one of the monomers, among the monomers having the functional groups represented by the general formulae (6) to (8), are used in the present invention. While a homopolymer, using only one kind of the monomers among those having the functional groups represented by the general formulae (6) to (8), may be used as the polymer compound described above, a copolymer using two or more kinds of monomers or a copolymer of these monomers with other monomers may be also used.

Polymer compounds more favorably used in the present invention are copolymers obtained by radical polymerization of the monomers described above with other known monomers.

Monomers having cross-link reactivity such as glycidyl methacrylate, N-methylol methacrylate, omega-(trimethoxysilyl)propyl methacrylate and 2-isocyanate ethyl acrylate, are preferable.

Examples of other monomers used for the copolymer include known monomers such as acrylic esters, methacrylic esters, acrylamides, methacrylaminde, vinyl esters, styrenes, acrylic acid, methacrylic acid, acrylonitrile, maleic anhydride and amleic acid imide.

Examples of the acrylic acid esters include methyl acrylate, ethyl acrylate, (n- or i-)propyl acrylate, (n-, i-, sec or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, acryl acrylate, trimethylpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate and 2-(hydroxyphenyl-carbonyloxy)ethyl acrylate.

Examples of the methacrylic esters include methyl methacrylate, ethyl methacrylate, (n- or i-)propyl methacrylate, (n-, i-, sec- or t-)butyl methacrylate, amyl methacrylate2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyxlohexyl methacrylate, aryl methacrylate, trimethylolpropane methacrylate, pentaerythrytol monomethacrylate, glycidyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphemyl methacrylate and 2-(hydroxyphenylcarbonyloxy)ethyl methacrylate.

Examples of acrylamides include acrylamide, N-methyl acrylamide, N-propyl acrylamide, N-butyl acrylamide, N-benzyl acrylamide, N-hydroxyethyl acrylamide, N-phenyl acrylamide, N-tolyl acrylamide, N-(hydroxyphenyl) acrylamide, n-(sulfamoylphenyl)

acrylamide, N- (phenylsulfonyl) acrylamide, N-(tolylsulfonyl) acrylamide, N,N-dimethyl acrylamide, N-methyl-N-phenyl acrylamide and N-hydroxyethyl-N-methyl acrylamide.

Examples of the methacrylamides include mehtacrylamide, N-metyl mehtacrylamide, N-ethyl mehtacrylamide, N-propyl mehtacrylamide, N-butyl mehtacrylamide, n-benzyl mehtacrylamide, n-hydroxyethyl mehtacrylamide, n-phneyl mehtacrylamide, N-tolyl mehtacrylamide, N-(hydroxypehnyl)mehtacrylamide, N-(sulfamoylphenyl)mehtacrylamide, N-(phenylsulfonyl) mehtacrylamide, N-(tolylsulfonyl)mehtacrylamide, N,N-dimetyl mehtacrylamide, , N-methyl-N-phenyl mehtacrylamide and N-hydroxyethyl-N-methyl mehtacrylamide.

Examples of the vinyl esters are vinyl acetate, vinyl butylaye and vinyl bemzoate.

Examples of styrenes include styrene, methyl styrene, dimethyl styrene, trimethyl styrene, ethyl styrene, propyl styrene, cyclohexyl styrene, chloromethyl styrene, trifluoromethyl styrene, ethoxymethyl styrene, acetoxymethyl styrene, methoxy styrene, fimethoxy styrene, chlorostyrene, dichlorostyrene, bromostyrene, iodostyrene, fluorostyrene, and carboxy styrene.

Other monomers favorably used are acrylic esters, methacrylic esters with a carbon number of 20 or less, acrylamides, methacrylamides, vinyl esters, styrenes, acrylic acid, methacrylic acid, and acrylonitrile.

The ratio of monomers having functional groups represented by the general formulae (6) to (8) used for the synthesis of the copolymers is preferably 5 to 99% by weight, more preferably 10 to 95% by weight.

Specific examples of polymers having on side chains the functional group(s) represented by the general formulae (6) to (8) are listed below.

(1)

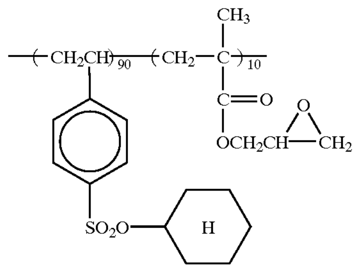

(2)

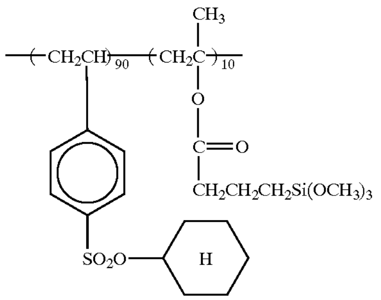

(3)

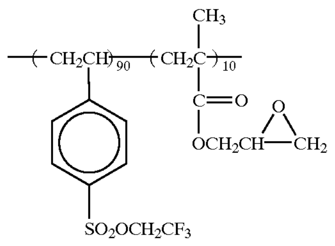

-continued (4)

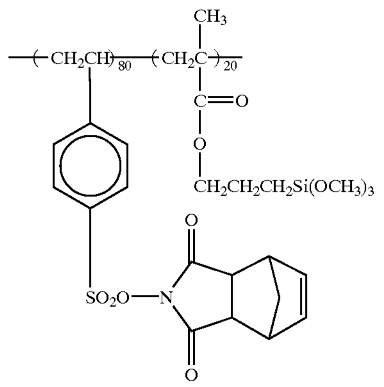

(5)

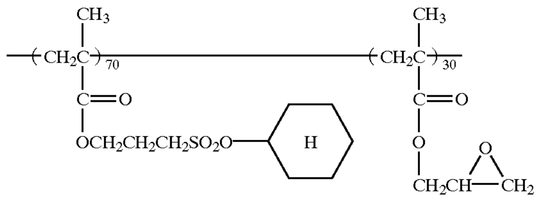

(6)

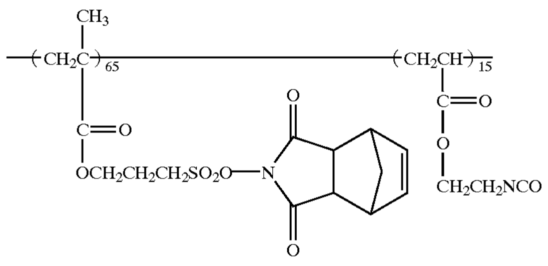

(7)

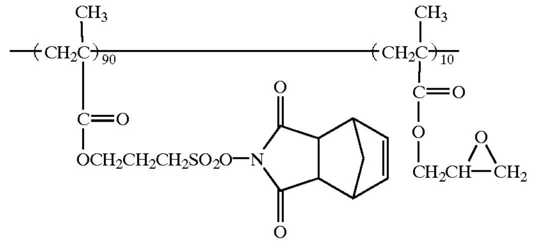

(8)

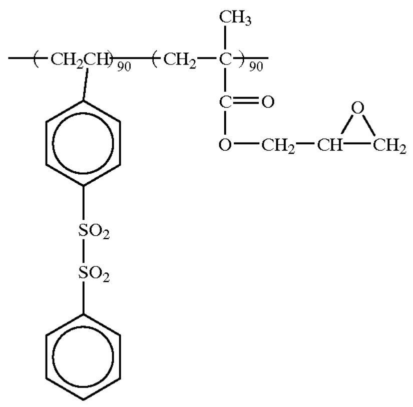

-continued
(9)
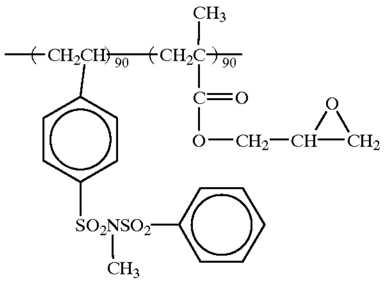
(10)
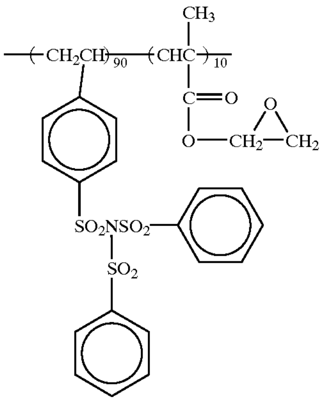
(11)
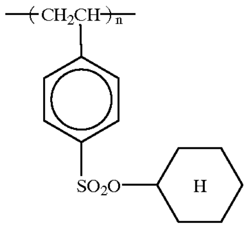
(12)
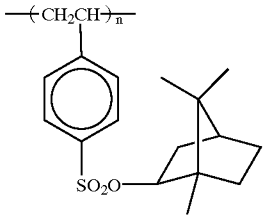
(13)
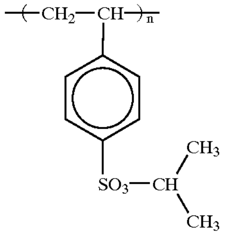
(14)
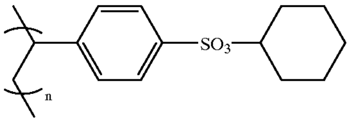
-continued
(15)
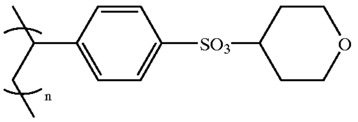
(16)
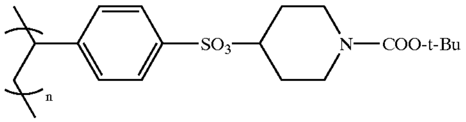
(17)
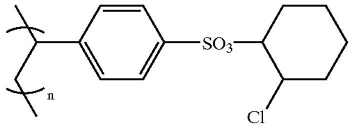
(18)
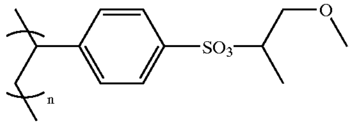
(19)
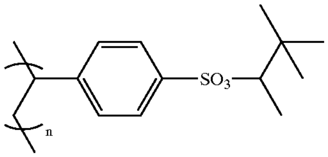
(20)
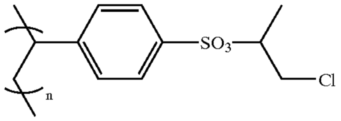
(21)
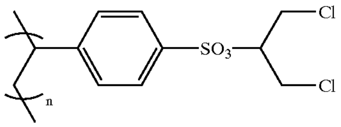
(22)
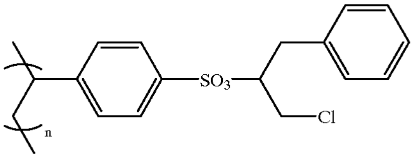
(23)
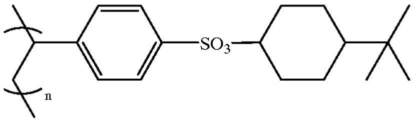
(24)
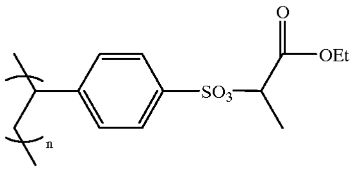

-continued (25)

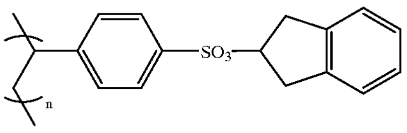

(26)

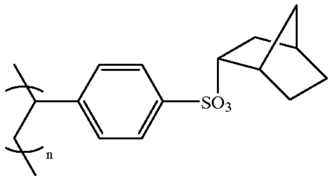

(27)

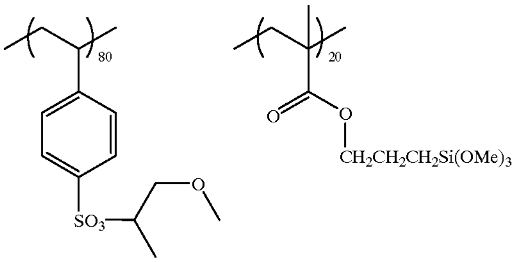

(28)

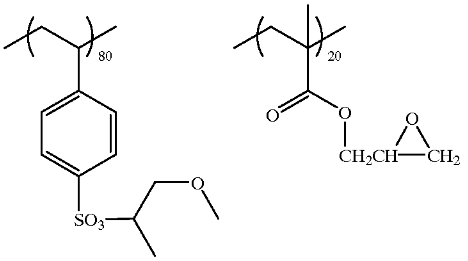

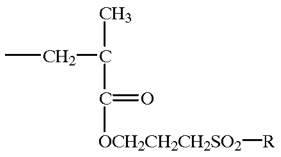

(29)

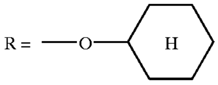

(30)

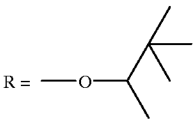

(31)

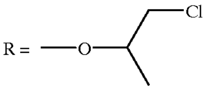

(32)

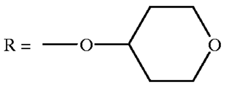

(33)

R = —$OCH_2CF_3$

-continued (34)

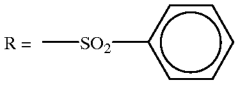

(35)

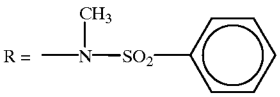

Numerals in the formulae denote mole composition of the polymer compounds.

The weight average molecular weight of the polymer compound having at least one of the functional groups represented by the general formulae (6) to (8) is preferably 2,000 or more, more preferably in the range of 5,000 to 300,000, and the number average molecular weight is preferably 800 or more, and more preferably in the range of 1,000 to 250,000. The degree of polydispersity (weight average molecular weight/number average molecular weight) is preferably 1 or more, more preferably in the range of 1.1 to 10.

While these polymers may be random polymers, block polymers or graft polymers, a random polymer is preferable.

Examples of solvents to be used in synthesizing the sulfonic acid generation type polymer compounds include tetrahydrofuran, ethylne dichloride, cyclohexanone, methylethyl ketone, acetone, methanol, ethanol, ethyleneglycol monmetylether, ethyleneglycol monetylether, 2-methoxyethyl acetate, diethyleneglycol dimethylether, 1-methoxy-2-propanol, 1-methoxy-2-propyl actetate, N,N-dimethylformamide, N,N-dimethylacetoamide, toluene, ethyl acetate, methyl lactate, ethyl lactate, dimethylsulfoxide and water. These solvents may be used singly, or in combination of two or more.

Examples of the radical initiator used for synthesizing the sulfonic acid generating polymer compounds include known compounds such as azo-type initiators and peroxide initiators.

The sulfonic acid generating polymer compounds may be used singly, or mixtures thereof may be used. The sulfonic acid generating polymer compounds can be used in a ratio of 50 to 90% by weight, preferably 70 to 90% by weight, relative to the total solid component of the image recording material. When the added amount is less than 50% by weight, the printed images become unclear. When the added amount exceeds 90% by weight, image formation by laser exposure cannot be sufficiently performed.

The sulfonic acid generating polymer compound, the acid generator disclosed in Japanese Patent Application No.9-10755, and the salt generator disclosed in Japanese Patent Application No. 9-26877 may be used together.

Examples of usable infrared absorbers include the heat sensitive positive-type infrared absorbers above.

In addition to there, various compounds may be added as necessary to the image recording layer of the planographic printing plate of the present invention.

For example, dyes having a large absorption at the visible region may be used as image coloring agents. Examples of these dyes include oil yellow #101, oil yellow #103, oil pink #312, oil green BG, oil blue BOS, oil blue #603, oil black BY, oil black BS and oil black T-500 (made by Orient Chemical Industry, Co.); victoria pure blue, crystal violet, (CI 42555), methyl violet (CI 42535), ethyl violet, rhodamin B (CI 145170B), malachite green(CI 42000), methylene blue (CI 52015) and eizenspiron blue C-RH (made by Hodogaya Chemicals Co.); and the dyes disclosed in Japanese Patent Application Laid-Open (JP-A) No. 62-293247.

It is preferable to add these dyes since the distinction between image portions and non-image portions gains clarity after the formation the images. The amount of addition is preferably in the range of 0.01 to 10% by weight relative to the total solid fraction of the recording layer.

The nonionic surface active agents disclosed in Japanese Patent Application Laid-Open (JP-A) Nos. 62-25740and 3-208514, and the amphoteric surface active agents disclosed in Japanese Patent Application Laid-Open (JP-A) Nos. 59-121044 and 4-13149 may be added in the recording layer of the present invention in order to raise the stability of processing under developing conditions.

Examples of the nonionic surface active agent include sorbitan tristearate, sorbitan monoparmitate, sorbitan triolate, stearic acid monoglyceride, and polyoxyethylene nonylphenyl ether.

Examples of the amphoteric surface active agent include alkyl-di(aminoethyl)glycine, alkyl polyaminoethyl glycine, 2-alkyl-N-carboxyethyl-N-hydroxyethyl imidazolium betaine, and N-tetradecyl-N,N-betaine type surface active agents (for example, Amogen (trade name), made by Daiichi Kôgyô Co.).

The ratio of the non-ionic and amphoteric surface active agents in the recording layer are preferably 0.05 to 15% by weight, more preferably 0.1 to 5% by weight.

It is preferable to adsorb a heat amplifier such as the metal powders and metal compound powders below to the photosensitive layer, the heat-insulating layer or the support surface in order to amplify heat generation.

The metal powders and metal compound powder will be described. By metal compound is meant a compound such as a metal, a metal oxide, a metal nitride, a metal sullfide or a metal carbide.

Examples of the metal compound includes such metals as Mg, Al, Si, Ti, V, Cr, Mn, Fe, Co, Ni, Cu, Zn, Ga, Ge, Y, Zr, Nb, Mo, Tc, Ru, Pd, Ag, Cd, In, Sn, Sb, Hf, Ta, W, Re, Os, Ir, Pt, Au and Pb. Among these, metals that readily induce exothermic reactions such as an oxidation reaction by heat energy are preferable. Specific examples include Al, Si, Ti, V, Cr, Mn, Fe, Co, Ni, Cu, Zn, Y, Zr, Mo, Ag, Sn and W. Metals having a high radiation absorbing efficiency and exhibiting large self-heating exothermic reaction such as Fe, Co, Ni, Ti and Zr are preferable among them.

The metal compounds may be of one metal only, or two or more components, or may be structured of a metal and a metal oxide, nitrode, sulfide or carbide. The self-activated thermal reaction thermal energy generated by such as oxidation is larger with an individual metal, but there is the danger of spontaneous combustion when the metal makes contact with air, since handling in air is complicated. Accordingly, it is preferable that the surface of such metal is covered with an oxide, nitride, sulfide or carbide to a depth of several nanometers from the surface.

The surface coating layer may be particles or a thin film such as a deposition film, but particles are preferable when the layer is formed together with an organic substance. The particle size is 10 μm or less, preferably 0.005 to 5 μm, and more preferably 0.01 to 3 μm. When the particle size is 0.01 μm or less, dispersion of the particles is difficult. When the particle size is 10 μm or more, resolution of printed images deteriorates.

Iron powder is preferable among the metal fine powders of in the present invention. An iron alloy powder mainly composed of α-Fe is more preferable among the preferable iron powders. Theses powders may have such atoms as Al, Si, S, Sc, Ca, Ti, V, Cr, Cu, Y, Mo, Rh, Pd, Ag, Sn, Sb, Te, Ba, Ta, W, Re, Au, Hg, Pb, Bi, La, Ce, Pr, Nd, P, Co, Mn, Zn, Ni, Sr and B, in addition to predetermined atoms. It is preferable that the powder has at least one of Al, Si, Ca, Y, Ba, La, Nd, Co, Ni and B , more preferably at least one of Co, Y and Al, in addition to α-Fe. The content of Co relative to the content of Fe is preferably zero atomic % or more and to 40 atomic % or less, further preferably 15 atomic % or more and 35 atomic % or less, and more preferably 20 atomic % or more and 20 atomic % or less. The content of Y is preferably 1.5 atomic % or more and to 12 atomic % or less, further preferably 3 atomic % or more and 10 atomic % or less, and more preferably 4 atomic % or more and 9 atomic % or less. The content of Al is preferably 1.5 atomic % or more and to 12 atomic % or less, further preferably 3 atomic % or more and 10 atomic % or less, and more preferably 4 atomic % or more and 9 atomic % or less. The iron alloy fine powder may have a small amount of oxides or hydroxides. Specific examples are disclosed in Japanese Patent Application Publication (JP-B) Nos. 44-14090, 45-18372, 47-22062, 47-22513, 46-28466, 46-38755, 47-4286, 47-12422, 47-17284, 47-18509, 47-18573, 39-10307and46-39639, and U.S. Pat. Nos. 3,026,26215, 3,031,341, 3,100,194, 3,242,005 and 3,389,014.

These heat amplifiers are preferably used in a ratio of 0.01 to 50% by weight, more preferably 0.1 to 10% by weight, relative to the total solid fraction of the heat-insulating layer or recording layer. The amplification effect becomes insufficient when the amount of addition is less than 0.01% by weight. When the amount exceeds 50% by weight, film strength at the time of printing decreases.

The support that can be favorably used for the planographic printing plate of the present invention will be described.

A dimensionally stable plate may used as the support. Examples thereof include paper, paper laminated with a plastic (for example polyethylene, polypropylene and polystyrene), a metal plate (for example aluminum, zinc and copper), a plastic film (for example cellulose diacetate, cellulose triacetate, cellulose propionate, cellulose butylate, cellulose acetate butylate, cellulose nitrate, polyethylene terephthalate, polyethylene, polystyrene, polypropylene, polycarbonate, and polyvinyl acetal), or paper or a plastic film on which foregoing metals are laminated or deposited.

Polyester film, or a plastic film on which aluminum is laminated or deposited, is particularly preferable as a heat-insulation support having a low thermal conductivity and a high heat-insulation effect among the supports described above. The thickness of the support is in the range of 0.05 to 5.0 mm, preferably in the range of 0.05 to 2.0 mm, as described previously. Dimensional accuracy becomes poor when the thickness is smaller than 0.05 mm. When the thickness is larger than 5.0 mm, flexural strength is insufficient when the plate is wound on a printing machine, thereby causing cracks in the support itself.

An aluminum plate is particularly preferable as a support having heat-insulation effect, since it is cheap and has excellent dimensional stability.

A suitable aluminum plate may be an alloy plate having as main components a pure aluminum plate and aluminum, with a minute amount of foreign elements.

The foreign elements contained in the aluminum alloy may be silicon, iron, manganese, magnesium, chromium, zinc bismuth, nickel and titanium. The total amount of the foreign elements in the alloy is 10% by weight or less. While pure aluminum is favorable in the present invention, a minute amount of the foreign elements may be contained in aluminum, since production of perfectly pure aluminum is difficult in view of refining technology. The composition of the aluminum plate to be used in the present invention is not particularly restricted, and aluminum plates of conventionally known and used material may be appropriately used. The aluminum plate to be sued in the present invention has a thickness of about 0.1 to 0.6 mm, preferably 0.15 to 0.4 mm, and a thickness of 0.2 to 0.3 mm is particularly preferable.

Prior to roughening the surface of the aluminum plate, a degreasing treatment with a surfactant, an organic solvent, or an alkaline water solution may be administered to the aluminum plate in order to eliminate rolling oil on the surface as needed.

The surface of the aluminum plate may be roughened in accordance with various methods. Examples thereof include a method in which the surface is mechanically roughened, a method in which the surface is electrochemically dissolved and roughened, and a method in which the surface is chemically roughened by selectively dissolving the surface. Methods such as ball polishing, brush polishing, blast polishing and buff polishing methods may be used for the mechanical roughening method. Examples of the electrochemical roughening method include a method in which an alternating current or a direct current is passed through an electrolytic solution of hydrochloric acid or nitric acid. A method in which both may be also used, as disclosed in Japanese Patent Application Laid-Open (JP-A) No. 54-63902.

Following alkaline etching and neutralization processing as needed, the aluminum plate thus roughened may be subjected to anodic oxidation as desired in order to raise the water retention and wear resistance of the surface. Various electrolytes that form a porous oxidation film can be used for the anodic oxidation of the aluminum plate, and sulfuric acid, phosphoric acid, citric acid, chromic acid or a mixed acid thereof may be used for that purpose. The concentration of the electrolyte is appropriately determined depending on the kind of the electrolyte.

After the anodic oxidation treatment has been administered, the aluminum surface of may be subjected to a hydrophobic treatment as needed. The alkali metal silicate (for example, an aqueous solution of sodium silicate) methods disclosed in U.S. Pat. No. 2,714,066, 3,181,461, 3,280,734 and 3,902,734 can be used for the hydrophobic treatment applicable in the present invention. In these methods, the support is dipped in an aqueous sodium silicate solution or subjected to an electrolytic treatment. Other methods include the methods in which the aluminum surface is treated with potassium fluorozirconic acid as disclosed in Japanese Patent Application Publication (JP-B) No. 36-22063, and the method in which the aluminum surface is treated with polyvinyl sulfonic acid as disclosed in U.S. Pat. No. 3,276,868, 4,153,461 and 4,689,272.

The planographic printing plate of the present invention thus obtained is preferably recorded by an infrared laser.

The positive-type or negative-type recording layer in the planographic printing plate of the present invention is subjected to developing processing with water or an alkaline developing solution after exposure. Because the heat-insulating intermediate layer or the heat-insulating support, which are the distinctive structures of the present invention, have the feature that they become hydrophilic by the alkaline developing solution, the effect of the present invention is most optimally displayed when an alkaline developing processing is administed.

The developing processing may be performed immediately after exposure, or a heat treatment may be performed between the exposure step and development step. When a heat treatment is administered, it is preferable that the temperature is within a range of 60° C. to 150° C. and that the heat treatment is conducted for 5 seconds to 5 minutes. Various, conventionally known methods may be employed. Examples thereof include a method in which the recording materials are heated by a panel heater or a ceramic heater while the heater is brought into contact with the recording materials, and a method in which the recording materials are heated by a lamp or warm air without contact. These heating treatment; allow the laser energy required for recording at the time of irradiation to be reduced.

When an alkaline water solution is used, conventionally known as alkaline water-solutions may be used as the developing solution and replenisher. Examples include inorganic alkaline salts such as sodium or potassium silicate; sodium, potassium or ammonium phosphate, sodium, potassium or ammonium hydrogen phosphate; sodium, potassium or ammonium carbonate; sodium, potassium or ammonium hydrogen carbonate; sodium, potassium or ammonium borate, and sodium, ammonium, potassium or lithium hydroxide. Organic alkaline salts may be also used, including monomethylamine, dimethylamine, trimethylamine, monoethylamine, diethylamnine, triethylamine, monoisopropylamine, diisopropylamine, triisopropylamine, n-butylamine, monoethanolamine, diethanolamine, triethanolamine, monoisopropanolamine, siisopropanolamine, ethyleneimine, ethylenediamine and pyridine.

These alkaline chemicals may be used singly, or in combination of two or more.

Among these alkali agents, an aqueous silicate salt solution such as sodium silicate and potassium silicate is particularly preferable because developability can be adjusted depending on the ratio and concentration of silicon oxide $SiO_2$ and alkali metal oxide $M_2O$ (M denotes an alkali metal), which are components of the silicate. For example, the silicates of alkali metals as disclosed in Japanese Patent Application Laid-Open (JP-A) No. 54-62004 and Japanese Patent Application Publication (JP-B) No. 57-7427 may be effectively used.

Further, when an automatic developing machine is used for development, it is known that a large amount of recording layers can be processed without changing developing solutions in the developing tank over a long period of time by adding to the developing solution an aqueous solution whose alkaline strength is greater than that of the developing solution. This supplement method may be preferably used in the present invention.

The recording layer developed using the developing solution and replenisher described above is washed with water, and post-treated with a rinse liquid having a surface active agent and the like, and a non-sensitizing grease solution having gum arabic or starch derivatives. A variety of these post-treatments may be combined as post-treatments when the planographic printing plate of the present invention is used in printing.

In recent years, automatic developing machines for plate materials in printing have come to be used widely, particularly in the plate-making and printing industries, because of the rationalization and standardization of plate-making labor.

The automatic developing machine usually has a development part and post-processing part, a device for conveying printing plates, processing fluid tanks and a spray device. A printing plate once exposed is sprayed with various processing fluids that have been drawn up by pumps and sprayed out from spray nozzles while the plate is conveyed horizontally, whereby developing processing is carried out. Recently, a method has come to be known in which printing materials are dipped and conveyed by guide rolls in processing fluid tanks filled with processing fluids. In this type of automated processing, processing can be carried out by replenishing the various processing fluids with replenishing fluids in accordance with processing amount, operation time and the like.

A so-called disposable processing method in which substantially fresh processing fluids are used may be also employed.

The planographic printing plate thus obtained may be ready for the printing step after being coated with a non-sensitizing grease gum, as desired. A burning treatment may also be administered for the purpose of further improving tolerance to repeated printings.

When the planographic printing plate is burned, it is preferably treated with the surface adjustment liquid as disclosed in Japanese Patent Application Publication (JP-B) Nos. 61-2518 and 55-28062 and Japanese Patent Application Laid-Open (JP-A) Nos. 62-31859 and 61-159655.

The planographic printing plate coated with the surface adjustment liquid is dried, if necessary, and is heated at a high temperature with a burning processor (for example, a burning processor BP-1300 available from Fuji Photo Film Co.) The heating temperature and time are preferably 180 to 300° C. and 1 to 20 minutes, respectively, although they depend on the type of components forming the image.

The planographic printing plate that has been subjected to the burning treatment may be appropriately subjected to conventional treatments such as washing and coating with a gum. However, the so-called non-sensitizing grease treatment such as gum coating may be omitted when a surface adjustment liquid having a water soluble polymer compound is used.

The planographic printing plate obtained by such treatments as described above is placed on an offset printing machine, and used for a number of printings.

EXAMPLES

The present invention will hereinafter be described in detail with reference to Examples. However, the present invention is not limited to the same.

Preparation of Support A: Support That is Not a Heat-Insulating Material

EXAMPLE 1

An aluminum plate (material 1050) having a thickness of 0.30 mm was cleansed with trichloroethylene and degreased. The surface of the aluminum plate was then grained using a nylon brush and an aqueous suspension of 400 mesh permestone, and thoroughly washed with water. The aluminum plate was dipped into a 25% aqueous solution of sodium hyrdoxide for 9 seconds, etched, washed, then further dipped into a 2% aqueous solution of $HNO_3$ for 20 seconds and washed. The etching amount of the grained surface at this time was about 3 g/m$^2$. Next, using 7% $H_2SO_4$ as an electrolyte, the plate was disposed with a direct current anodic oxidized film of 3g/m$^2$ at an electric current density of 15 A/dm$^2$. The plate was then washed and dried.

Preparation of Support B: Support That is Not a Heat-Insulating Material

EXAMPLE 2

The support A was dipped in a silicate solution described below at 35° C. The support was then dried at 30° C. for 1 minute, washed and dried to form a silicate surface. (silicate solution)

#3 sodium silicate 2.5 g pure water 100 g

Preparation of Support C: Heat-Insulating Material Support

EXAMPLE 1

A commercially available polyethylene terephthalate support having a thickness of 0.2 mm.

Preparation of Hydrophilic, Heat-Insulating Supports 1–9: Table 10

Using a wire bar, the following cross-linked hydrophilic layers were coated on supports selected from the supports A, B and C, and dried to obtain heat-insulating supports having hydrophilic layers.

Details of the supports used, the hydrophilic layers formed, and film thickness of the layers are shown in Table 10.

TABLE 10

| Heat-insulating support | Substrate used | Cross-linked hydrophilic layer | Film thickness of hydrophilic layer (μm) | Film forming conditions |
|---|---|---|---|---|
| 1 | Substrate A | Hydrophilic layer A | 1.0 | 100° C., 10 minutes |
| 2 | Substrate A | Hydrophilic layer E | 1.0 | 100° C., 10 minutes |
| 3 | Substrate A | Hydrophilic layer F | 1.0 | 100° C., 10 minutes |
| 4 (Adhesive added) | Substrate A | Hydrophilic layer F2 | 0.5 | 100° C., 10 minutes |
| 5 | Substrate B | Hydrophilic layer A | 1.0 | 100° C., 10 minutes |
| 6 | Substrate B | Hydrophilic layer B | 1.0 | 100° C., 10 minutes |
| 7 | Substrate B | Hydrophilic layer C | 1.0 | 100° C., 10 minutes |
| 8 | Substrate B | Hydrophilic layer D | 1.0 | 100° C., After drying for 1 minute Uv exposure of whole surface (1000 counts) (Airotary printer, made by ai graphic co.) |
| 9 (Adhesive added) | Substrate B | Hydrophilic layer E2 | 1.0 | 100° C., 10 minutes |
| 10 | Substrate C | Hydrophilic layer E | 0.5 | 100° C., 10 minutes |
| 11 (Adhesive added) | Substrate C | Hydrophilic layer E2 | 0.5 | 100° C., 10 minutes |

(1) Hydrophilic Layer A Coating Solution

A mixed solution of 200 g of colloidal silica (trade name: Snowtechs R503, 20 wt. % aqueous dispersion solution, made by Nissan Chemical Industries, Co.) and 5 g of aminopropyl triethoxy silane.

(2) Hydrophilic Layer B Coating Solution

Dispersed for 30 minutes with glass beads in a paint shaker (made by Tôyô Precision Machine Co.) were 50 g of titanium oxide (made by Titan Industries Co., particle size 0.3$\mu$), 113 g of 10% aqueous polyvinyl alcohol (trade name: PVA 117, made by Kurarey Co.) and 240 g of water. Further, 110 g of 20% solution (water/ethanol=1/1 in weight ratio) of tetraethoxysilane previously hydrolyzed with phosphoric acid and 200 g of colloidal silica (trade name: Snowtechs R503, 20% aqueous dispersion solution, made by Nissan Chemical Industries, Co.) were added and, after dispersing for 3 minutes, a dispersion solution was obtained by filtering the glass beads off.

(3) Hydrophilic Layer C Coating Solution

The same solution was obtained, except that Fe particles were used in place of titanium oxide in the hydrophilic layer B coating solution.

A fine powder of an iron alloy with a Fe:Co:Al:Y ratio of 100:20:5:5, longitudinal diameter of 0.1$\mu$, transverse diameter of 0.02$\mu$ and specific surface area of 60 $m^2/g$ were used.

(4) Hydrophilic Layer D Coating Solution

Preparation of Hydrophilic Polymer

Polyacrylic acid (18.0 g, molecular weight 25,000, made by Wako Pure Chemicals Co.) was dissolved in dimethyl acetoamide, and the solution was allowed to react for 3 hours after adding 5.5 g of 2-methacryloyl oxyethyl issocyanate (abbreviated as MOI hereinafter) and 0.1 g of dibutyl tin dilaurate. Then, 20% equivalent of the carboxylic group was partially neutralized with sodium hydroxide, and the polymer was precipitated by adding acetone to obtain a purified hydrophilic polymer P-1 by thorough washing. Then, a solution was obtained by dissolving 1.10 g of the hydrophilic polymer P-1, 0.1 g of a triazine initiator described below, 0.5 g of polyethyleneglycol diacrylate (A600, made by Toa synthetic Chemicals Co.) and 2.5 g of dipentaerythritol diacrylate in a mixed solvent of 10 g of methanol and 10 g of water.

The structure of the trazine initiator A is shown below.

Triazine Initiator A

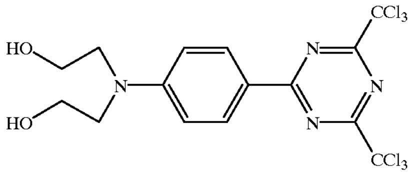

(5) Hydrophilic Layer E Coating Solution

A solution was obtained by dissolving 100 g of polyvinyl alcohol (trade name PVA 117, made by Kurarey Co.) in 200 g of water, followed by adding 300 g of a 30% solution of tetraethoxysilane (water/ethanol=1/1 weight ration) previously hydrolyzed with phosphoric acid.

(6) Hydrophilic Layer F Coating Solution

A solution was obtained by adding 50 g of a 30% tetramethoxysilane solution into 100 g of 50 wt. % aqueous solution of #3 sodium silicate.

(7) Hydrophilic Layer F Coating Solution (for a radical polymerization recording layer to which an adhesive has been added)

A solution was obtained by dissolving 100 g of a 10% aqueous solution of polyvinyl alcohol (trade name PVA 117, made by Kurarey Co.) in 200 g of water, followed by adding 300 g of a 30% mixed solution (water/methanol=2/1 weight ratio) of [(3-methacryloxypropane trimethoxysilane previously hydrolyzed with phosphate catalyst)/(tetramethoxysilane)=50/50 wt. %].

(7) Hydrophilic Layer F2 Coating Solution (for a radical polymerization recording layer to which an adhesive has been added)

A solution was obtained by adding 50 g of a 30% methanol solution of a mixture of [(3-methacryloxypropane trimethoxysilane)/tetramethoxysilane=50/50 wt. %] in 100 g of 50 wt % aqueous solution of #3 sodium silicate.

Preparation of Heat-Insulating Support Capable of Being Made Hydrophilic: Treatment with an Adhesive (Table 11)

The heat-insulating support that is capable of being made hydrophilic (i.e., the heat support of the present invention) was obtained by using a wire bar to coat the following adhesives on supports selected from the above hydrophilic heat-insulating supports 1 through 8.

The supports and adhesives that were used, and the conditions in which the adhesive layers were formed, are shown in Table 11.

TABLE 11

| Substrate | Heat insulation support used | Adhesive layer | Adhesive layer coating agent ($mg/m^2$) | Film-forming conditions | Contact angle (in degrees) |
|---|---|---|---|---|---|
| 1 | Substrate 1 | Adhesive A | 70 | 100° C., 1 minute | 50 |
| 2 | Substrate 2 | Adhesive C | 50 | 100° C., 5 minutes | 30 |
| 3 | Substrate 3 | Adhesive D | 100 | 100° C., 1 minute | 55 |
| 4 | Substrate 4 | None | 50 | 100° C., 1 minute | 20 |
| 5 | Substrate 5 | Adhesive B | 80 | 100° C., 10 minutes | 50 |
| 6 | Substrate 6 | Adhesive A | 70 | 100° C., 1 minute | 60 |
| 7 | Substrate 7 | Adhesive B | 80 | 100° C., 10 minutes | 55 |
| 8 | Substrate 8 | Adhesive A | 70 | 100° C., 1 minute | 55 |
| 9 | Substrate 9 | None | — | | 20 |
| 10 | Substrate 10 | Adhesive C | 50 | 100° C., 5 minutes | 30 |
| 11 | Substrate 11 | None | — | | 25 |
| 12 | Substrate 3 | Adhesive E | 80 | 100° C., 10 minutes | 60 |
| 13 | Substrate 5 | Adhesive E | 80 | 100° C., 10 minutes | 65 |
| 14 | Substrate 7 | Adhesive E | 80 | 100° C., 10 minutes | 60 |

(1) Adhesive A Coating Solution

A 5 wt. % methanol solution of a adhesive polymer A with the structure described below, obtained by radical polymerization.

Adhesive polymer A

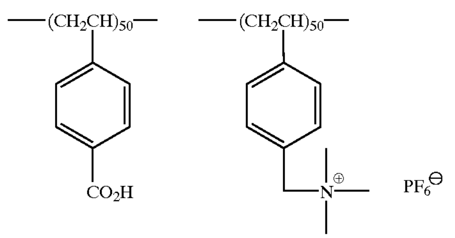

(2) Adhesive B Coating Solution 3-methacyloxypropyl trimethoxysilane (1,4 g), tetramethoxysilne (4.0 G), phosphoric acid (1.4 b) and water (1.5 g) were stirred at room temperature for 1 hour, and diluted with methanol to a solution with a final concentration of 5 wt %.

(3) Adhesive C Coating Solution

A mixed solution of phenylboric acid/5% methanol solution of boric acid/water (weight ration 2/8).

(4) Adhesive D Coating Solution

A 5 wt. % methanol solution of a formaline condensation polymerization product D of an azonium salt shown by the following structure.

Diazonium salt condensation polymerization product D

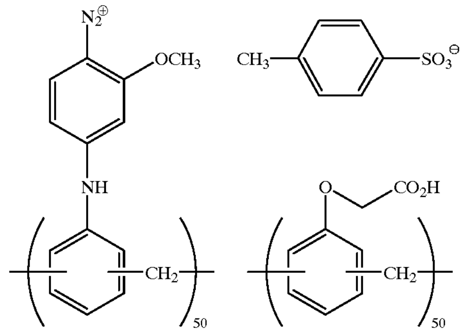

(5) Adhesive E Coating Solution

A phenol resin E (1.5 g) with the structure below, tetramethoxysilane (4.0 g), sulfuric acid (1.0 g) and water (1.5 g) were stirred at room temperature for 1 hour, and diluted with methanol in a solution with a final concentration of 5 Wt %.

Phenol Resin E pyrogallol/acetone condensation product

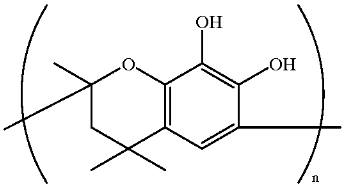

Preparation of Comparative Support

Using the supports made for the Examples, the following comparative supports were made without forming adhesive layers or administering treatments to improve adhesion.

TABLE 12

| Comparative support | Support used | Contact angle (in degrees) |
|---|---|---|
| Comparative example 1 | Hydrophilic heat insulation support 1 | ~0 (Expanding wetting) |
| Comparative example 2 | Hydrophilic heat insulation support 2 | ~0 (Expanding wetting) |
| Comparative example 3 | Hydrophilic heat insulation support 3 | ~0 (Expanding wetting) |
| Comparative example 4 | Without contact agent in forming heat insulation support 4 | ~0 (Expanding wetting) |
| Comparative example 5 | Hydrophilic heat insulation support 5 | ~0 (Expanding wetting) |
| Comparative example 6 | Hydrophilic heat insulation support 6 | ~0 (Expanding wetting) |
| Comparative example 7 | Hydrophilic heat insulation support 7 | ~0 (Expanding wetting) |
| Comparative example 8 | Hydrophilic heat insulation support 8 | ~0 (Expanding wetting) |
| Comparative example 9 | Without contact agent in forming heat insulation support 9 | ~0 (Expanding wetting) |
| Comparative example 10 | Hydrophilic heat insulation support 10 | ~0 (Expanding wetting) |
| Comparative example 11 | Without contact agent in forming heat insulation support 11 | ~0 (Expanding wetting) |
| Comparative example 12 | Substrate A | 30 |
| Comparative example 13 | Substrate B | ~0 (Expanding wetting) |
| Comparative example 14 | Substrate C | 70 |
| Comparative example 15 | Contact agent A was directly coated on the support A to a thickness of 70 $mg/m^2$ | 30 |
| Comparative example 16 | Contact agent C was directly coated on the support A to a thickness of 50 $mg/m^2$ | 40 |
| Comparative example 17 | Contact agent D was directly coated on the support A to a thickness of 100 $mg/m^2$ | 35 |
| Comparative example 18 | Contact agent A was directly coated on the support B to a thickness of 70 $mg/m^2$ | 10 |
| Comparative example 19 | Contact agent B was directly coated on the support B to a thickness of 70 $mg/m^2$ | 15 |
| Comparative example 20 | Contact agent C was directly coated on the support C to a thickness of 50 $mg/m^2$ | 0 |
| Comparative example 21 | Contact agent E was directly coated on the support A to a thickness of 80 $mg/m^2$ | ~0 (Expanding wetting) |
| Comparative example 22 | Contact agent E was directly coated on the support B to a thickness of 80 $mg/m^2$ | 10 |

Examples 1 to 14, Comparative Examples 1 to 22

(Preparation of Lithographic Printing Plate: Coating of the Recording Layer)

Ten kinds of coating solutions for the recording layer were prepared from the coating solutions 1 to 10. The cross-linking agents, polymers, acid generators, radical generators and Infrared absorbers used for these coating solutions are shown in Table 13. The structures of the compounds used a real so shown below. The planographic printing plates 1 to 14 were obtained by coating on the supports 1 to 11 of the present invention the obtained coating solutions, and then allowing the coatings to dry at 100° C. for 1 minute. The weight after drying was 1.5 g/$m^2$. The planographic printing plates (Comparative Examples 1 to 22) were also prepared by providing the following recording layers using the comparative supports 1 to 22.

Coating Solutions 1 to 3: Solutions for forming acid catalyst cross-linking layer

| | |
|---|---|
| Cross-linking agent [X] in Table 13 | 0.5 g |
| Polymer [Y] in Table 13 | 1.5 g |
| Acid generator [Z] in Table 13 | 0.2 g |
| Infrared absorber [Q] in Table 13 | 0.15 g |
| Coloring agent (trade name: Aizen SPLON BLUE C-RH made by Hodogaya Chemical Co.) | 0.015 g |
| Fluorinated surface active agent (trade name: Mefafax F-177 made by Dainihon Ink Chemical Industries Co) | 0.06 g |
| methylethyl ketone | 15.0 g |
| 1-methoxy-2-propanol | 15.0 g |

Coating Solution 4 to 7: coating solution for forming radical polymerization layer

| | |
|---|---|
| arylmethacrylate/methacrylic acid = 70/30 copolymer (number average molecular weight 70,000) | 1.2 g |
| dipentaerythritol hexaacrylate (DHPA, made by Nihon Kayaku Co.) | 1.0 g |
| radicalgenerator [P] in Table 13 | 0.1 g |
| infrared absorber [Q] in Table 13 | 0.1 g |
| coloring agent (trade name; Victoria Pure Blue naphthalene sulfonic acid salt, made by Hodogaya Chemical Co.) | 0.015 g |
| fluorinated surface active agent (trade name: Magafax F-176, Dainihon Ink Chemical Industries Co.) | 0.06 g |
| methylethyl ketone | 15.0 g |
| methanol | 15.0 g |

Coating Solutions 8 to 10: solutions for forming interaction release type positive layer

| | |
|---|---|
| Polymer [Y] in Table 13 | 2.0 g |
| Infrared absorber [Q] in Table 13 | 0.15 g |
| Coloring agent (trade name: Aizen Splon Blue C-RH, made by Hodogaya Chemicals Co.) | 0.015 g |
| Fluorinated surface active agent (trade name: Megafax F-177, made by Dai-nihon Ink Chemical Industries Co.) | 0.06 g |
| methylethyl ketone | 10.0 g |
| 1-methoxy-2-propanol | 7.0 g |
| γ-butylolactone | 10.0 g |

TABLE 13

| | X | Y | Z | P | Q |
|---|---|---|---|---|---|
| Coating Solution 1 | X-1 | Y-1 | Z-1 | None | Q-1 |
| Coating solution 2 | X-2 | Y-2 | Z-2 | None | Q-2 |
| Coating solution 3 | X-3 | Y-3 | Z-1 | None | Q-3 |
| Coating solution 4 | None | None | None | P-1 | Q-1 |
| Coating solution 5 | None | None | None | P-2 | Q-2 |
| Coating solution 6 | None | None | None | P-3 | Q-3 |
| Coating solution 7 | None | None | None | P-1 | Q-4 |
| Coating solution 8 | None | Y-1 | None | None | Q-1 |
| Coating solution 9 | None | Y-2 | None | None | Q-2 |
| Coating solution 10 | None | Y-3 | None | None | Q-3 |

X-1

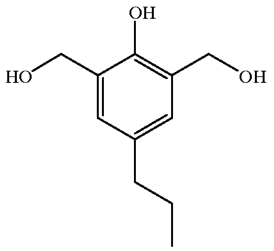

X-2

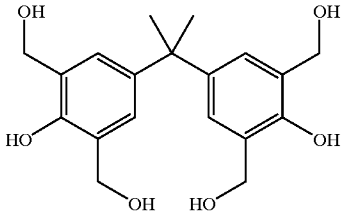

X-3

Resol resin (Mw 3000)

Y-1

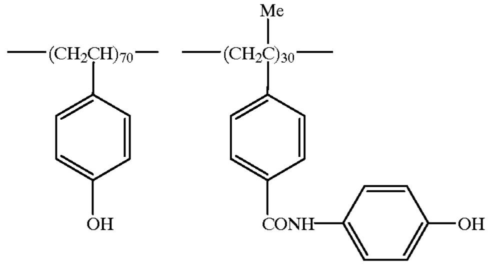

(Mw 50000)

Y-2

Formaline condensation product (Noborac) with m-cresol/p-cresol = 60/40 (Mw 8000)

Y-3 the compound Y-2/

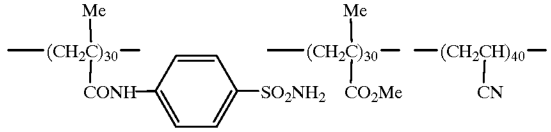

(MW 40000)

= 50% by weight/50% by weight mixture

Z-1

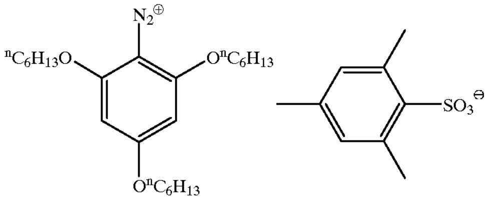

TABLE 13-continued

| | X | Y | Z | P | Q |
|---|---|---|---|---|---|

Z-2

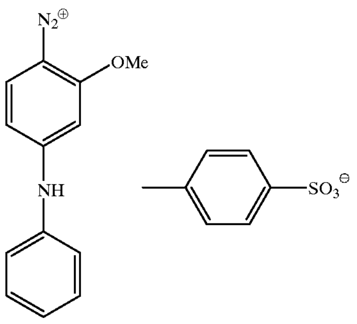

P-1

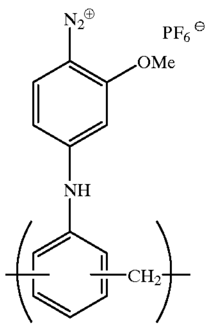

P-2

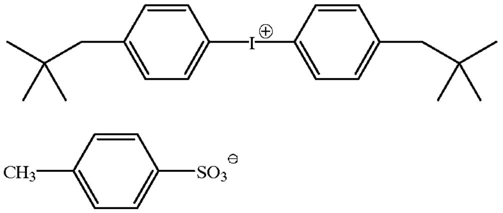

P-3

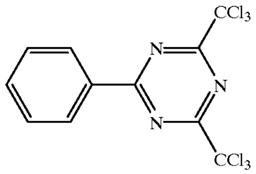

Q-1

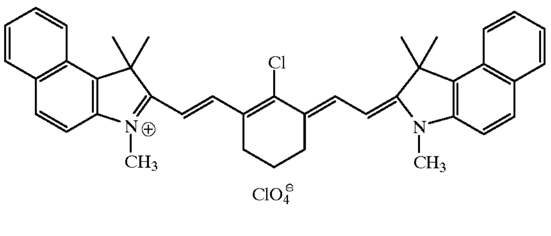

TABLE 13-continued

| | X | Y | Z | P | Q |
|---|---|---|---|---|---|

Q-2

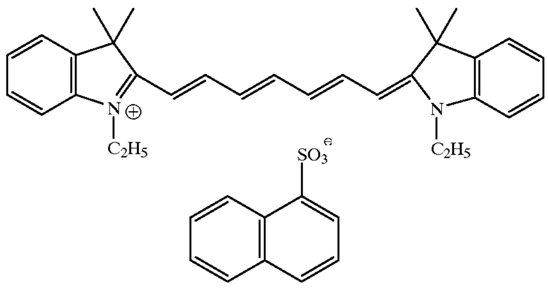

Q-3

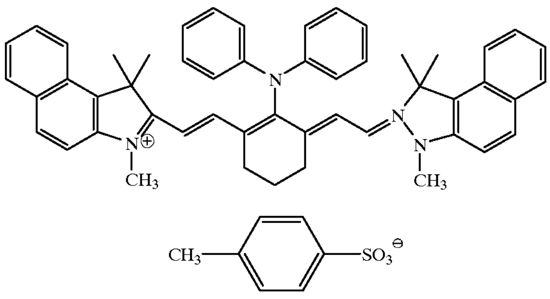

Q-4

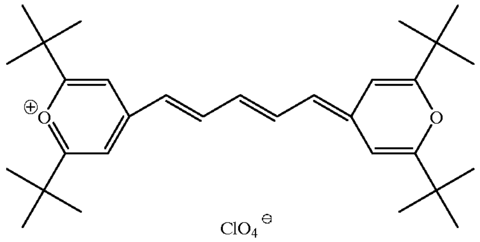

Evaluation of Sensitivity

The planographic printing plate was exposed to and scanned with a semiconductor laser emitting an infrared light with a wave length of about 830 to 850 nm. After exposure, the acid cross-linking sensitive material (i.e., the recording layers of the coating solutions 5 to 8) were heated with a panel heater at 120° C. for 30 seconds. The acid cross-linking sensitive material was then developed with a developing solution DP-4 (1:8 water dilution) made by Fuji Photo Film, Co. The amount of energy required for recording was calculated based on the line width of the image obtained, laser output loss in the optical system and scanning speed to serve as an index of sensitivity.

Evaluation of Tolerance to Repeated Printings and Printing Contaminination

Using as printing plates planographic printing plates on which 1% mesh dots (highlights) had formed by exposure and development processing, the plates were printed with a Hydel KOR-D machine. The number of plates on which the mesh dots had been printed was used as an index for comparing tolerance to repeated printings. An index of 100 or higher was evaluated to be good and preferable from the standpoint of manufacturing. Printing contamination of non-image portions of the 100,000th plate of the printed plates was also inspected.

Evaluation results are shown in Tables 14 and 15.

TABLE 14

| | Recording layer provided on the support (shown by the number of the coating solution) | Sensitivity (mJ/cm$^2$) | Tolerance to repeated printings (index) | Printing contamination |
|---|---|---|---|---|
| Example 1 | Coating solution 1 | 80 | 100 | None |
| Example 2 | 4 | 90 | 100 | None |
| Example 3 | 8 | 90 | 110 | None |
| Example 4 | 5 | 65 | 110 | None |
| Example 5 | 2 | 90 | 100 | None |
| Example 6 | 8 | 85 | 105 | None |
| Example 7 | 6 | 90 | 110 | None |
| Example 8 | 3 | 80 | 110 | None |
| Example 9 | 7 | 65 | 120 | None |
| Example 10 | 9 | 75 | 105 | None |
| Example 11 | 7 | 65 | 110 | None |
| Example 12 | 10 | 80 | 110 | None |
| Example 13 | 8 | 85 | 120 | None |
| Example 14 | 6 | 85 | 120 | None |

provided which is sensitive to an infrared laser, reduces loss of exposure energy, can form an image in which image on/off is expanded in portions irradiated with an infrared laser and in portions not irradiated with an infrared laser, has high sensitivity, tolerance to repeated printings and excellent storage stability.

What is claimed is:

1. An infrared-sensitive planographic printing plate comprising:

(1) a support;

(2) a first layer that is structured by a heat-insulating material having a low thermal conductivity, and that is made hydrophilic by being processed with one of an alkali and a silicate in an alkali developing solution after exposure; and (3) a second layer whose alkali developability is changed, without ablation, by being irradiated with an infrared ray;

being sequentially laminated.

2. A planographic printing plate according to claim 1, wherein a thermal conductivity of the heat-insulating material is 3.0 ($W \cdot m^{-1} \cdot K^{-1}$) or less.

3. A planographic printing plate according to claim 1, wherein a thermal conductivity of the heat-insulating material is 1.0 ($W \cdot m^{-1} \cdot K^{-1}$) or less.

TABLE 15

| | Recording layer provided on the support (shown by the number of the coating solution) | Sensitivity (mJ/cm$^2$) | Tolerance to repeated printings (index) | Printing contamination |
|---|---|---|---|---|
| Comparative example 1 | 1 | Effusion (poor adhesion) | | |
| Comparative example 2 | 4 | Effusion (poor adhesion) | | |
| Comparative example 3 | 8 | Effusion (poor adhesion) | | |
| Comparative example 4 | 5 | Effusion (poor adhesion) | | |
| Comparative example 5 | 2 | Effusion (poor adhesion) | | |
| Comparative example 6 | 8 | Effusion (poor adhesion) | | |
| Comparative example 7 | 6 | Effusion (poor adhesion) | | |
| Comparative example 8 | 3 | Effusion (poor adhesion) | | |
| Comparative example 9 | 7 | Effusion (poor adhesion) | | |
| Comparative example 10 | 9 | Effusion (poor adhesion) | | |
| Comparative example 11 | 7 | Effusion (poor adhesion) | | |
| Comparative example 12 | 10 | 130 | 100 | Contaminated |
| Comparative example 13 | 2 | 130 | 20 | None |
| Comparative example 14 | 7 | 120 | 60 | Contaminated |
| Comparative example 15 | 1 | 140 | 100 | Contaminated |
| Comparative example 16 | 4 | 130 | 100 | Contaminated |
| Comparative example 17 | 8 | 150 | 105 | Contaminated |
| Comparative example 18 | 2 | 135 | 60 | None |
| Comparative example 19 | 6 | 130 | 50 | None |
| Comparative example 20 | 9 | 75 | 30 | Contaminated |
| Comparative example 21 | 10 | 130 | 60 | Contaminated |
| Comparative example 22 | 2 | 130 | 50 | None |

As shown in Tables 14 and 15, the planographic printing plate according to the present invention, in which one of a heat-insulating intermediate layer and a heat-insulating support is used, had excellent adhesion, high sensitivity, a high tolerance to repeated printings, and no contamination at the time of printing, regardless of the type of recording layer or the method of image formation. By contrast, with the planographic printing plates of the Comparative Examples, in which conventional supports were used that do not have the property of becoming hydrophilic even when a heat-insulating support is used and that were not subjected to an adhesion treatment, plates of high hydrophilicity displayed insufficient adhesion with the recording layer and generated image flow, and plates of high hydrophobicity displayed contamination in non-image portions due to a deterioration in the hydrophobicity, though some had adequate levels of tolerance to repeated printings.

According to the present invention, a planographic printing plate, of the type developed in alkaline water, can be

4. A planographic printing plate according to claim 1, wherein the heat-insulating material is a crosslinked hydrophilic layer.

5. A planographic printing plate according to claim 4, wherein the heat-insulating material further comprises an adhesive.

6. A planographic printing plate according to claim 4, wherein the planographic printing plate comprises an adhesive layer between the first layer and the second layer.

7. A planographic printing plate according to claim 4, wherein an adhesiveness of the heat-insulating material is improved by regulating a balance between a hydrophobicity and a hydrophilicity of the heat-insulating material.

8. A planographic printing plate according to claim 1, wherein an average thickness of the heat-insulating material structuring the first layer is in a range of 0.2 to 5.0 $\mu$m.

9. A planographic printing plate according to claim 1, wherein the second layer is one of a negative radical polymerization recording layer or a negative acid catalyst crosslinking recording layer.

10. A planographic printing plate according to claim 9, wherein the radical polymerization recording layer comprises an infrared absorber.

11. A planographic printing plate according to claim 10, wherein the infrared absorber is one of an infrared absorber having an onium salt structure and an anionic infrared absorber.

12. A planographic printing plate according to claim 1, wherein the second layer is selected from a positive polar conversion material recording layer that is obtained by thermally decomposing a sulfonate, a positive-type acid catalyst crosslinking recording layer, and a positive-type interaction-releasable recording layer.

13. An infrared-sensitive planographic printing plate comprising:

(1) a support that is structured by a heat-insulating material whose thermal conductivity is low, and in which a surface thereof is made hydrophilic by being processed with one of an alkali and a silicate in an alkali developing solution after exposure; and (2) an infrared-sensitive layer whose alkali developability is changed by being irradiated with an infrared ray;

being sequentially laminated.

14. A planographic printing plate according to claim 13, wherein a thermal conductivity of said heat-insulating material 3.0 ($W \cdot m^{-1} \cdot K^{-1}$) or less.

15. A planographic printing plate according to claim 13, wherein a thermal conductivity of the heat-insulating material is 1.0 ($W \cdot m^{-1} \cdot K^{-1}$) or less.

16. A planographic printing plate according to claim 13, wherein an average thickness of the heat-insulating material structuring the support is in a range of 0.05 to 2.0 $\mu$m.

17. A planographic printing plate according to claim 13, wherein the second layer is one of a negative radical polymerization recording layer and a negative acid catalyst crosslinking recording layer.

18. A planographic printing plate according to claim 17, wherein the radical polymerization recording layer comprises an infrared absorber.

19. A planographic printing plate according to claim 18, wherein the infrared absorber is one of an infrared absorber having an onium salt structure and an anionic infrared absorber.

20. A planographic printing plate according to claim 13, wherein the second layer is selected from a positive polar conversion material recording layer that is obtained by thermally decomposing a sulfonate, a positive-type acid catalyst crosslinking recording layer, and a positive-type interaction-releasable recording layer.

* * * * *